US012796118B2

(12) United States Patent
Yang et al.

(10) Patent No.: US 12,796,118 B2
(45) Date of Patent: Nov. 10, 2026

(54) SYMMETRIC BOND SIGNAL INTEGRITY PRESERVATION STRUCTURE AND METHOD

(71) Applicant: Taiwan Semiconductor Manufacturing Company, Ltd., Hsinchu (TW)

(72) Inventors: Hao-Lin Yang, Kaohsiung City (TW); Kuan-Chieh Huang, Hsinchu City (TW); Wei-Cheng Hsu, Kaohsiung City (TW); Tzu-Jui Wang, Fengshan City (TW); Chen-Jong Wang, Hsin-Chu (TW); Dun-Nian Yaung, Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 621 days.

(21) Appl. No.: 18/301,450

(22) Filed: Apr. 17, 2023

(65) Prior Publication Data

US 2024/0347576 A1 Oct. 17, 2024

(51) Int. Cl.
*H10F 39/18* (2025.01)
*H10F 39/00* (2025.01)
(Continued)

(52) U.S. Cl.
CPC ........... *H10F 39/18* (2025.01); *H10F 39/026* (2025.01); *H10F 39/811* (2025.01);
(Continued)

(58) Field of Classification Search
CPC ...... H10F 39/18; H10F 39/026; H10F 39/811; H10F 39/018; H10F 39/807;
(Continued)

(56) References Cited

U.S. PATENT DOCUMENTS

2011/0241152 A1 10/2011 Hsiao et al.
2013/0327921 A1 12/2013 Chen et al.
(Continued)

FOREIGN PATENT DOCUMENTS

TW 201403833 A 1/2014

OTHER PUBLICATIONS

U.S. Appl. No. 18/302,900, filed Apr. 19, 2023.
Notice of Allowance dated Nov. 18, 2025 for U.S. Appl. No. 18/302,900.

*Primary Examiner* — Jonathan Han
(74) *Attorney, Agent, or Firm* — Eschweiler & Potashnik, LLC

(57) ABSTRACT

Various embodiments of the present disclosure relate to an interstitial stacked-integrated-circuit interface shielding structure. A first integrated circuit (IC) chip includes a first dielectric layer. A second IC chip is bonded to the first IC chip at a bond interface and includes a second dielectric layer directly contacting the first dielectric layer at the bond interface. A first pair of conductive pads are respectively in the first and second dielectric layers and directly contacting at the bond interface. A second pair of conductive pads are respectively in the first and second dielectric layers and directly contacting at the bond interface. A pair of shield structures are respectively in the first and second dielectric layers and directly contact at the bond interface. Further, the pair of shield structures separate the first pair of conductive pads from the second pair of conductive pads.

20 Claims, 45 Drawing Sheets

(51) Int. Cl.
*H10W 20/41* (2026.01)
*H10W 42/20* (2026.01)
*H10W 90/00* (2026.01)

(52) U.S. Cl.
CPC ......... *H10W 20/423* (2026.01); *H10W 42/20* (2026.01); *H10W 90/00* (2026.01)

(58) Field of Classification Search
CPC . H10F 39/809; H10F 39/813; H01L 23/5225; H01L 23/552; H01L 25/0652; H01L 24/05; H01L 23/481; H01L 24/06; H01L 24/08; H01L 25/0657; H01L 25/50; H01L 2224/02123; H01L 2224/06131; H01L 2224/08145; H01L 2224/80895; H01L 2224/80896; H01L 2924/00014; H10W 20/423; H10W 42/20; H10W 90/00; H10W 20/0234; H10W 20/0242; H10W 80/00; H10W 72/9445; H10W 72/981; H10W 80/327; H10W 90/792; H10W 20/20; H10W 72/90; H10W 80/312
See application file for complete search history.

(56) References Cited

U.S. PATENT DOCUMENTS

| | | | | |
|---|---|---|---|---|
| 2015/0061062 | A1 | 3/2015 | Lin et al. | |
| 2017/0236724 | A1 | 8/2017 | Chang et al. | |
| 2019/0006264 | A1 | 1/2019 | Vaidya et al. | |
| 2020/0135795 | A1* | 4/2020 | Madurawe ............ | H10F 39/806 |
| 2021/0288029 | A1 | 9/2021 | Huang et al. | |
| 2022/0077215 | A1* | 3/2022 | Horikoshi ............. | H10F 39/182 |
| 2022/0199670 | A1 | 6/2022 | Jang et al. | |
| 2022/0270973 | A1 | 8/2022 | Verma et al. | |
| 2023/0081238 | A1* | 3/2023 | Jang ...................... | H10F 39/809 257/213 |
| 2024/0006437 | A1* | 1/2024 | Nitta .................. | H10D 84/0126 |

* cited by examiner

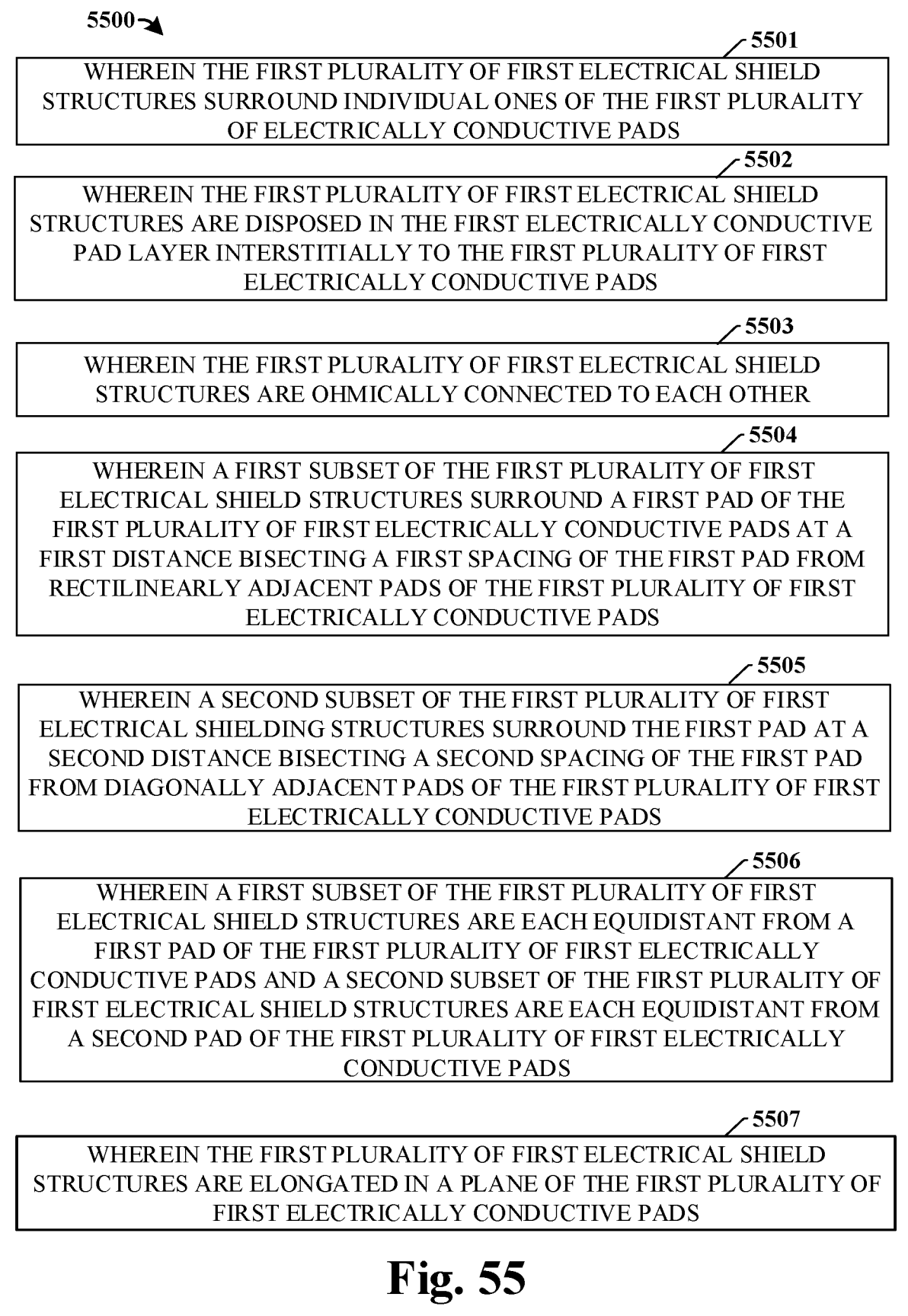

5500

5501

WHEREIN THE FIRST PLURALITY OF FIRST ELECTRICAL SHIELD STRUCTURES SURROUND INDIVIDUAL ONES OF THE FIRST PLURALITY OF ELECTRICALLY CONDUCTIVE PADS

5502

WHEREIN THE FIRST PLURALITY OF FIRST ELECTRICAL SHIELD STRUCTURES ARE DISPOSED IN THE FIRST ELECTRICALLY CONDUCTIVE PAD LAYER INTERSTITIALLY TO THE FIRST PLURALITY OF FIRST ELECTRICALLY CONDUCTIVE PADS

5503

WHEREIN THE FIRST PLURALITY OF FIRST ELECTRICAL SHIELD STRUCTURES ARE OHMICALLY CONNECTED TO EACH OTHER

5504

WHEREIN A FIRST SUBSET OF THE FIRST PLURALITY OF FIRST ELECTRICAL SHIELD STRUCTURES SURROUND A FIRST PAD OF THE FIRST PLURALITY OF FIRST ELECTRICALLY CONDUCTIVE PADS AT A FIRST DISTANCE BISECTING A FIRST SPACING OF THE FIRST PAD FROM RECTILINEARLY ADJACENT PADS OF THE FIRST PLURALITY OF FIRST ELECTRICALLY CONDUCTIVE PADS

5505

WHEREIN A SECOND SUBSET OF THE FIRST PLURALITY OF FIRST ELECTRICAL SHIELDING STRUCTURES SURROUND THE FIRST PAD AT A SECOND DISTANCE BISECTING A SECOND SPACING OF THE FIRST PAD FROM DIAGONALLY ADJACENT PADS OF THE FIRST PLURALITY OF FIRST ELECTRICALLY CONDUCTIVE PADS

5506

WHEREIN A FIRST SUBSET OF THE FIRST PLURALITY OF FIRST ELECTRICAL SHIELD STRUCTURES ARE EACH EQUIDISTANT FROM A FIRST PAD OF THE FIRST PLURALITY OF FIRST ELECTRICALLY CONDUCTIVE PADS AND A SECOND SUBSET OF THE FIRST PLURALITY OF FIRST ELECTRICAL SHIELD STRUCTURES ARE EACH EQUIDISTANT FROM A SECOND PAD OF THE FIRST PLURALITY OF FIRST ELECTRICALLY CONDUCTIVE PADS

5507

WHEREIN THE FIRST PLURALITY OF FIRST ELECTRICAL SHIELD STRUCTURES ARE ELONGATED IN A PLANE OF THE FIRST PLURALITY OF FIRST ELECTRICALLY CONDUCTIVE PADS

Fig. 55

SYMMETRIC BOND SIGNAL INTEGRITY PRESERVATION STRUCTURE AND METHOD

BACKGROUND

Many modern-day electronic devices contain integrated circuits. Some integrated circuits are constructed as stacked integrated circuit assemblies, which can be referred to as three-dimensional integrated circuits. Three-dimensional integrated circuits involve fabricating a plurality of integrated circuit portions on wafers and bonding the wafers, portions of the wafers (e.g., dies), or combinations thereof together, making electrical connections at one or more interfaces, to form integrated circuits comprising multiple pieces of mechanically and electrically joined semiconductor material. The stacking of multiple pieces of joined semiconductor material allows circuits of higher complexity to be fabricated and allows finer pitches (closer spacings between adjacent elements, such as pixel elements) which can, for example, in the context of an image sensor, increase image resolution.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 55 illustrates a flow diagram of some features of some embodiments of a method.

DETAILED DESCRIPTION

Figure 1:
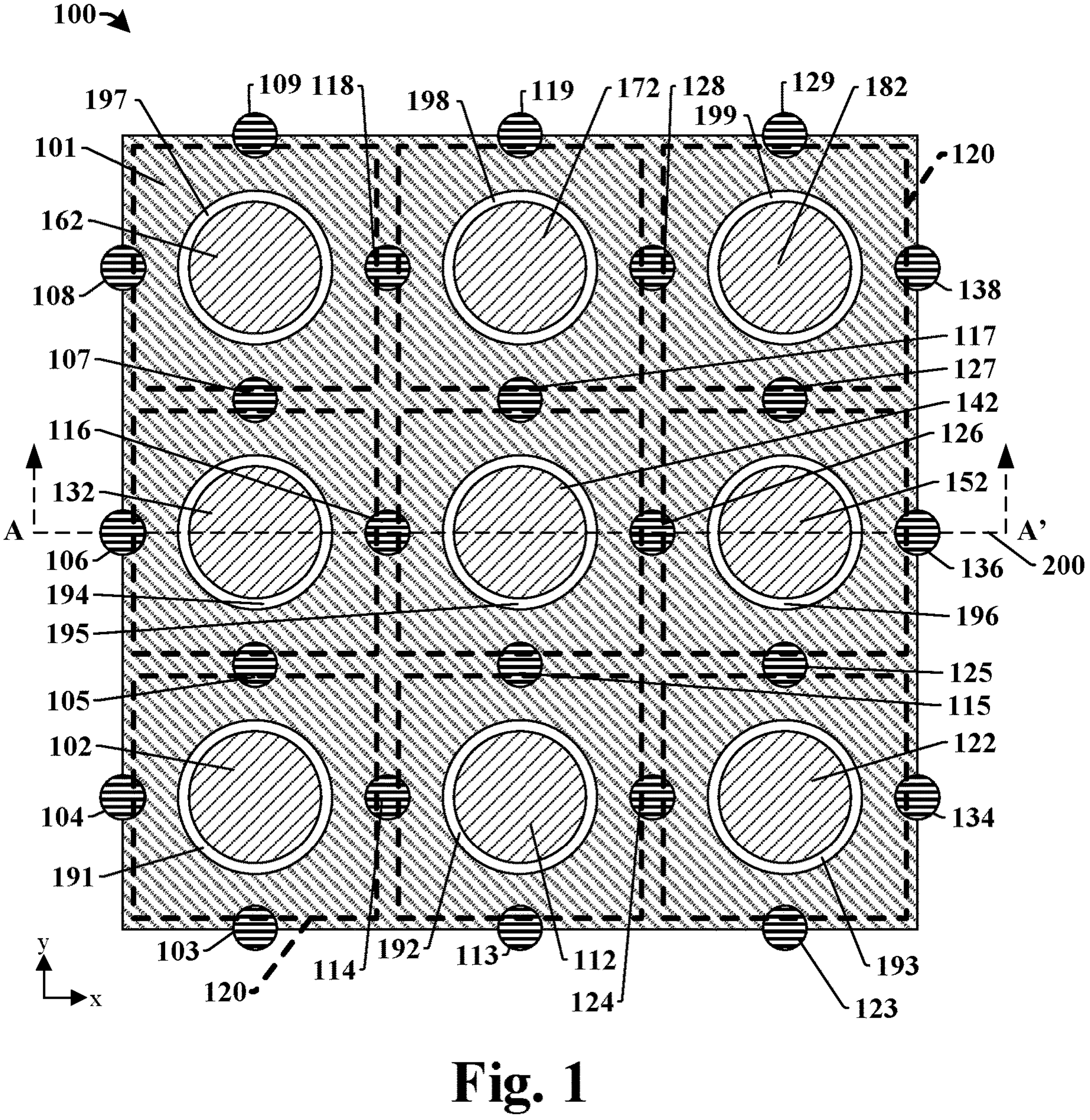
FIG. 1 illustrates a cross-sectional plan view of some embodiments of an interstitial stacked-integrated-circuit interface shielding structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A stacked integrated circuit structure with shield structures providing signal integrity preservation, such as shielding or parasitic capacitance reduction, around electrically conductive pads on both sides of mating die surfaces is described. Stacking of integrated circuit structures allows three-dimensional integration of circuitry. The ability to extend circuitry in a third dimension can reduce the amount of area occupied in the other two dimensions, which can increase density of arrays of circuit elements, such as circuit elements for pixels in an image sensor. However, interconnections in the third dimension between stacked integrated circuit structures can be susceptible to signal integrity degradation, for example, from interference, such as crosstalk, between adjacent interconnections or, for example, from a low-pass filtering effect of parasitic capacitance arising from dielectric material between interconnections. In accordance with at least one embodiment, shield structures are provided, which may, for example, be of electrically conductive material, either isolated by dielectric material or connected to a voltage source, to shield an interconnection comprising two mating electrically conductive pads or which may, for example, be of low-dielectric-constant (low-K) material to reduce parasitic capacitance.

FIG. 1 illustrates a cross-sectional plan view of some embodiments of an interstitial stacked-integrated-circuit interface shielding structure. The cross-sectional plan view of FIG. 1 is taken along bonding interface plane 210, as shown by a dashed line B-B' in FIG. 2. The features in FIG. 1 exist in the context of an example of an array of pixels 120 of an image sensor. In the example of FIG. 1, nine pixels are shown, as demarcated by thick dashed boxes. Each pixel 120 comprises at least one photodiode (not shown) and, in some embodiments, each pixel 120 comprises multiple photodiodes in a multi-dimensional (e.g., two-by-two) subarray. Hence, the thick dashed boxes labeled as the pixels 120 may also be regarded as photodiode blocks or the like.

A plurality of electrically conductive pads 102, 112, 122, 132, 142, 152, 162, 172, and 182 are disposed in common plane 100. In the example, each electrically conductive pad provides an electrical connection for one corresponding pixel 120. A plurality of shield structures 103, 113, 123, 104, 114, 124, 134, 105, 115, 125, 106, 116, 126, 136, 107, 117, 127, 108, 118, 128, 138, 109, 119, and 129 are disposed in common plane 100. The plurality of shield structures 103, 113, 123, 104, 114, 124, 134, 105, 115, 125, 106, 116, 126, 136, 107, 117, 127, 108, 118, 128, 138, 109, 119, and 129 are disposed in interstitial region 101. Interstitial region 101 is spaced by dielectric margins 191, 192, 193, 194, 195, 196, 197, 198, and 199, respectively, away from electrically conductive pads 102, 112, 122, 132, 142, 152, 162, 172, and 182. In some embodiments, interstitial region 101 is itself dielectric.

In some embodiments, the plurality of shield structures 103, 113, 123, 104, 114, 124, 134, 105, 115, 125, 106, 116, 126, 136, 107, 117, 127, 108, 118, 128, 138, 109, 119, and 129 have individual top geometries with smaller areas than individual top geometries of the plurality of electrically conductive pads 102, 112, 122, 132, 142, 152, 162, 172, and 182. In some embodiments, each of the plurality of electrically conductive pads 102, 112, 122, 132, 142, 152, 162, 172, and 182 is surrounded by a plurality of the shield structures (e.g., 103, 113, etc.), which are evenly spaced in a closed path individual to and surrounding that conductive pad.

The plurality of shield structures 103, 113, 123, 104, 114, 124, 134, 105, 115, 125, 106, 116, 126, 136, 107, 117, 127, 108, 118, 128, 138, 109, 119, and 129 block electrical crosstalk between the plurality of electrically conductive pads 102, 112, 122, 132, 142, 152, 162, 172, and 182 and/or reduce capacitive coupling between the plurality of electrically conductive pads 102, 112, 122, 132, 142, 152, 162, 172, and 182. Hence, the plurality of shield structures 103, 113, 123, 104, 114, 124, 134, 105, 115, 125, 106, 116, 126, 136, 107, 117, 127, 108, 118, 128, 138, 109, 119, and 129 shield the plurality of electrically conductive pads 102, 112, 122, 132, 142, 152, 162, 172, and 182 from each other. Further, the plurality of shield structures 103, 113, 123, 104, 114, 124, 134, 105, 115, 125, 106, 116, 126, 136, 107, 117, 127, 108, 118, 128, 138, 109, 119, and 129 may be regarded as signal integrity preservation structures, signal integrity protection features, or the like.

By shielding the plurality of electrically conductive pads 102, 112, 122, 132, 142, 152, 162, 172, and 182, performance of a three-dimensional (e.g., stacked) integrated circuit accommodating the plurality of shield structures 103, 113, 123, 104, 114, 124, 134, 105, 115, 125, 106, 116, 126, 136, 107, 117, 127, 108, 118, 128, 138, 109, 119, and 129 and the plurality of electrically conductive pads 102, 112, 122, 132, 142, 152, 162, 172, and 182 is enhanced. In the case of an image sensor where neighboring conductive pads are simultaneously carrying signals during image readout, crosstalk and/or capacitive coupling may negatively impact image quality of the image sensor. Hence, the plurality of shield structures 103, 113, 123, 104, 114, 124, 134, 105, 115, 125, 106, 116, 126, 136, 107, 117, 127, 108, 118, 128, 138, 109, 119, and 129 may enhance image quality.

Further, crosstalk and/or capacitive coupling increase as the three-dimensional integrated circuit is scaled down and the plurality of electrically conductive pads 102, 112, 122, 132, 142, 152, 162, 172, and 182 get closer and closer together. Because of the shielding by the plurality of shield structures 103, 113, 123, 104, 114, 124, 134, 105, 115, 125, 106, 116, 126, 136, 107, 117, 127, 108, 118, 128, 138, 109, 119, and 129, the three-dimensional integrated circuit may reach smaller sizes without compromising performance.

For each of the plurality of electrically conductive pads 102, 112, 122, 132, 142, 152, 162, 172, and 182, several of the plurality of shield structures 103, 113, 123, 104, 114, 124, 134, 105, 115, 125, 106, 116, 126, 136, 107, 117, 127, 108, 118, 128, 138, 109, 119, and 129 are located peripherally to the electrically conductive pad of the electrically conductive pads. For example, for electrically conductive pad 102, shield structures 103, 104, 105, and 114 are peripheral to electrically conductive pad 102. Shield structures 103, 104, 105, and 114 surround electrically conductive pad 102. Shield structures 103, 104, 105, and 114 are disposed within interstitial region 101, which is spaced a dielectric margin 191 away from electrically conductive pad 102. As another example, for electrically conductive pad 112, shield structures 113, 114, 115, and 124 are peripheral to electrically conductive pad 112. Shield structures 113, 114, 115, and 124 surround electrically conductive pad 112. Shield structures 113, 114, 115, and 124 are disposed within interstitial region 101, which is spaced a dielectric margin 192 away from electrically conductive pad 112.

The shield structures peripheral to one electrically conductive pad need not be exclusively peripheral to that single electrically conductive pad but can be peripheral to a different electrically conductive pad as well. For example, shield structure 114 is peripheral to both electrically conductive pad 102 and electrically conductive pad 112. The shield structures that participate in surrounding one electrically conductive pad need not be exclusive in participating to surrounding that single electrically conductive pad but can also participate in surrounding a different electrically conductive pad. For example, shield structure 114 participates, along with shield structures 103, 104, and 105, in surrounding electrically conductive pad 102 but also participates, along with shield structures 113, 115, and 124, in surrounding electrically conductive pad 112.

While shield structure 114 is shown as bisecting a distance between electrically conductive pad 102 and electrically conductive pad 112 in line with the closest proximity of electrically conductive pad 102 to electrically conductive pad 112, a shield structure need not be equidistant from two electrically conductive pads and need not be situated along a line between the points of two electrically conductive pads at which the two electrically conductive pads are closest to one another. Rather, shield structures may be disposed anywhere within an interstitial region 101 separated by dielectric margins, such as dielectric margins 191, 192, 193, 194, 195, 196, 197, 198, and 199, from electrically conductive pads, such as electrically conductive pads 102, 112, 122, 132, 142, 152, 162, 172, and 182. Examples of various placements of shield structures relative to electrically conductive pads will be described further below.

In some embodiments, at least some of the first floating electrical shielding structures surround an electrically conductive pad at a first distance that bisects a first spacing of the electrically conductive pad from rectilinearly adjacent electrically conductive pads.

In some embodiments, the plurality of electrically conductive pads 102, 112, 122, 132, 142, 152, 162, 172, and 182 are or comprise aluminum, copper, aluminum copper, some other suitable metals, or any combination of the foregoing. In some embodiments, the plurality of electrically conductive pads 102, 112, 122, 132, 142, 152, 162, 172, and 182 have larger areas than the plurality of shield structures 103, 113, 123, 104, 114, 124, 134, 105, 115, 125, 106, 116, 126, 136, 107, 117, 127, 108, 118, 128, 138, 109, 119, and 129. In some embodiments, the plurality of electrically conductive pads 102, 112, 122, 132, 142, 152, 162, 172, and 182 are representative (e.g., in terms of material, size, shape, etc.) of the additional electrically conductive pads hereafter introduced and described.

In some embodiments, the plurality of shield structures 103, 113, 123, 104, 114, 124, 134, 105, 115, 125, 106, 116, 126, 136, 107, 117, 127, 108, 118, 128, 138, 109, 119, and 129 are conductive. For example, the plurality of shield structures 103, 113, 123, 104, 114, 124, 134, 105, 115, 125, 106, 116, 126, 136, 107, 117, 127, 108, 118, 128, 138, 109, 119, and 129 may be or comprise aluminum, copper, aluminum copper, some other suitable metals, or any combination of the foregoing. In some of such embodiments, the plurality of shield structures 103, 113, 123, 104, 114, 124, 134, 105, 115, 125, 106, 116, 126, 136, 107, 117, 127, 108, 118, 128, 138, 109, 119, and 129 are electrically floating. In other embodiments, the plurality of shield structures 103, 113, 123, 104, 114, 124, 134, 105, 115, 125, 106, 116, 126, 136, 107, 117, 127, 108, 118, 128, 138, 109, 119, and 129 are biased to ground or some other suitable potential.

In other embodiments, the plurality of shield structures 103, 113, 123, 104, 114, 124, 134, 105, 115, 125, 106, 116, 126, 136, 107, 117, 127, 108, 118, 128, 138, 109, 119, and 129 are dielectric. For example, the plurality of shield structures 103, 113, 123, 104, 114, 124, 134, 105, 115, 125, 106, 116, 126, 136, 107, 117, 127, 108, 118, 128, 138, 109, 119, and 129 may be or comprise a low k dielectric and/or the like. A low k dielectric may, for example, be or comprise a dielectric having a dielectric constant less than about 3.9, 2.0, or some other suitable value, and/or may, for example, be or comprise a dielectric having a dielectric constant less than dielectric margins 191, 192, 193, 194, 195, 196, 197, 198, and 199.

To the extent that the plurality of shield structures 103, 113, 123, 104, 114, 124, 134, 105, 115, 125, 106, 116, 126, 136, 107, 117, 127, 108, 118, 128, 138, 109, 119, and 129 are conductive, the plurality of shield structures 103, 113, 123, 104, 114, 124, 134, 105, 115, 125, 106, 116, 126, 136, 107, 117, 127, 108, 118, 128, 138, 109, 119, and 129 may reduce crosstalk between the plurality of electrically conductive pads 102, 112, 122, 132, 142, 152, 162, 172, and 182. To the extent that the plurality of shield structures 103, 113, 123, 104, 114, 124, 134, 105, 115, 125, 106, 116, 126, 136, 107, 117, 127, 108, 118, 128, 138, 109, 119, and 129 are or comprise a low k dielectric, the plurality of shield structures 103, 113, 123, 104, 114, 124, 134, 105, 115, 125, 106, 116, 126, 136, 107, 117, 127, 108, 118, 128, 138, 109, 119, and 129 may reduce capacitive coupling between the plurality of electrically conductive pads 102, 112, 122, 132, 142, 152, 162, 172, and 182.

In some embodiments, the plurality of shield structures 103, 113, 123, 104, 114, 124, 134, 105, 115, 125, 106, 116, 126, 136, 107, 117, 127, 108, 118, 128, 138, 109, 119, and 129 are representative (e.g., in terms of material, size, shape, etc.) of the additional shield structures hereafter introduced and described.

Figure 2:
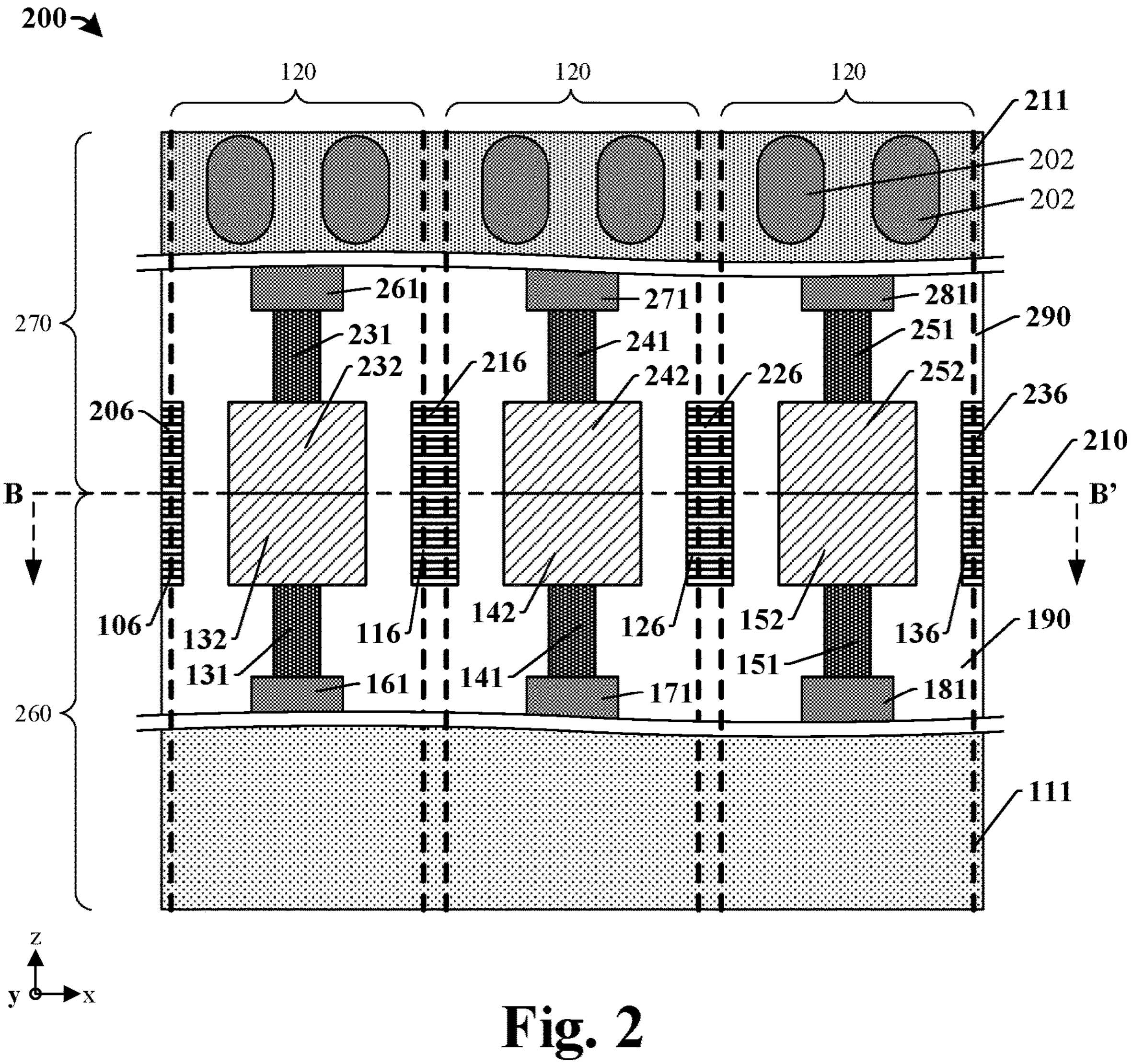
FIG. 2 illustrates a cross-sectional elevation view of some embodiments of an interstitial stacked integrated-circuit interface shielding structure.

FIG. 2 illustrates a cross-sectional elevation view of some embodiments of an interstitial stacked integrated-circuit interface shielding structure. The cross-sectional elevation view of FIG. 2 is taken along a plane 200 shown by a dashed line A-A' in FIG. 1. The features in FIG. 2 exist in the context of an example of an array of pixels 120 of an image sensor. In the example of FIG. 2, three pixels are shown, as demarcated by vertical dashed lines. Each pixel 120 comprises at least one photodiode 202 and, in some embodiments, each pixel 120 comprises multiple photodiodes in a multi-dimensional (e.g., two-by-two) subarray. Such multi-dimensional subarrays may be regarded as photodiode blocks or the like.

An integrated circuit chip 260 lies below bonding interface plane 210, and an integrated circuit chip 270 lies above bonding interface plane 210. An interface circuit chip may, for example, additionally or alternatively be regarded as an integrated circuit die, a wafer portion, or the like. The integrated circuit chip 260 comprises a substrate 111 covered by a dielectric layer 190, and the integrated circuit chip 270 comprises a substrate 211 and a dielectric layer 290 underlying substrate 211. The substrate 211 accommodates the photodiodes 202, and the dielectric layer 190 and the dielectric layer 290 directly contact at bonding interface plane 210.

Electrically conductive pad 132 of integrated circuit chip 260 is ohmically connected to electrically conductive pad 232 of integrated circuit chip 270 at bonding interface plane 210. Electrically conductive pad 142 of integrated circuit chip 260 is ohmically connected to electrically conductive pad 242 of integrated circuit chip 270 at bonding interface plane 210. Electrically conductive pad 152 of integrated circuit chip 260 is ohmically connected to electrically conductive pad 252 of integrated circuit chip 270 at bonding interface plane 210. Electrically conductive pads 132, 142, 152 are in dielectric layer 190, whereas electrically conductive pads 232, 242, 252 are in dielectric layer 290.

Because dielectric layer 190 and dielectric layer 290 directly contact at bonding interface plane 210, bonding interface plane 210 has a dielectric-to-dielectric bond. Further, because electrically conductive pads 132, 142, 152 electrically couple respectively with electrically conductive pads 232, 242, 252 at bonding interface plane 210, bonding interface plane 210 has a conductor-to-conductor bond. Hence, bonding interface plane 210 may be regarded as a metal-to-metal (M-M) and dielectric-to-dielectric (D-D) bonding plane, and integrated circuit chip 260 and integrated circuit chip 270 may be regarded as being M-M and D-D bonded together.

In some aspects, electrically conductive pads 132, 142, 152 can be disposed in dielectric layer 190, and electrically conductive pads 232, 242, and 252 can be disposed in dielectric layer 290. In some aspects, a liner may be provided between electrically conductive pads 132, 142, 152 and dielectric layer 190 or between electrically conductive pads 232, 242, 252 and dielectric layer 290. A liner layer between electrically conductive pads 132, 142, 152 and dielectric layer 190 may, for example, cover bottom surfaces and sidewalls of electrically conductive pads 132, 142, 152. In some embodiments, the liner layer may have a U-shaped shaped profile or some other suitable profile wrapping around a bottom of each electrically conductive pad 132, 142, 152. Similarly, a liner layer between electrically conductive pads 232, 242, and 252 and dielectric layer 290 may, for example, cover top surfaces and sidewalls of electrically conductive pads 232, 242, and 252. In some embodiments, the liner layer may have an inverted U-shaped shaped profile or some other suitable profile wrapping around a top of each electrically conductive pad 232, 242, and 252. In some embodiments, the liner layer of electrically conductive pads 132, 142, 152 and/or the liner layer of electrically conductive pads 232, 242, and 252 may, for example, be conductive and/or configured as a diffusion barrier for material of the conductive paths.

A surface of electrically conductive pad 132 opposite the surface connected to electrically conductive pad 232 is ohmically connected to an electrically conductive contact 131. A surface of electrically conductive pad 142 opposite the surface connected to electrically conductive pad 242 is ohmically connected to an electrically conductive contact 141. A surface of electrically conductive pad 152 opposite the surface connected to electrically conductive pad 252 is ohmically connected to an electrically conductive contact 151. A surface of electrically conductive pad 232 opposite the surface connected to electrically conductive pad 132 is ohmically connected to an electrically conductive contact 231. A surface of electrically conductive pad 242 opposite the surface connected to electrically conductive pad 142 is ohmically connected to an electrically conductive contact 241. A surface of electrically conductive pad 252 opposite the surface connected to electrically conductive pad 152 is ohmically connected to an electrically conductive contact 251.

An end of electrically conductive contact 131 opposite the end connected to electrically conductive pad 132 is ohmically connected to an electrically conductive feature 161. An end of electrically conductive contact 141 opposite the end connected to electrically conductive pad 142 is ohmically connected to an electrically conductive feature 171. An end of electrically conductive contact 151 opposite the end connected to electrically conductive pad 152 is ohmically connected to an electrically conductive feature 181. An end of electrically conductive contact 231 opposite the end connected to electrically conductive pad 232 is ohmically connected to an electrically conductive feature 261. An end of electrically conductive contact 241 opposite the end connected to electrically conductive pad 242 is ohmically connected to an electrically conductive layer feature 271. An end of electrically conductive contact 251 opposite the end connected to electrically conductive pad 252 is ohmically connected to an electrically conductive layer feature 281. Electrically conductive layer pads, such as electrically conductive features 161, 171, and 181, may be formed in an electrically conductive layer, such as a metal layer, for example, a top metal layer. In some aspects, a barrier layer may be provided, for example, between electrically conductive features 161, 171, or 181 and substrate 111 or between electrically conductive features 261, 271, or 281 and substrate 211.

Shield structures 106, 116, 126, and 136 are disposed peripherally with respect to electrically conductive pads 132, 142, and 152. As examples, shield structures 106 and 116 are disposed peripherally with respect to electrically conductive pad 132, shield structures 116 and 126 are disposed peripherally with respect to electrically conductive pad 142, and shield structures 126 and 136 are disposed peripherally with respect to electrically conductive pad 152. As examples, shield structure 116 is peripheral to both electrically conductive pad 132 and electrically conductive pad 142, and shield structure 126 is peripheral to both electrically conductive pad 142 and electrically conductive pad 152.

Shield structures 206, 216, 226, and 236 are disposed peripherally with respect to electrically conductive pads 232, 242, and 252. As examples, shield structures 206 and 216 are disposed peripherally with respect to electrically conductive pad 232, shield structures 216 and 226 are disposed peripherally with respect to electrically conductive pad 242, and shield structures 226 and 236 are disposed peripherally with respect to electrically conductive pad 252. As examples, shield structure 216 is peripheral to both electrically conductive pad 232 and electrically conductive pad 242, and shield structure 226 is peripheral to both electrically conductive pad 242 and electrically conductive pad 252.

A surface of shield structure 106 in or near bonding interface plane 210 faces a surface of shield structure 206 in or near bonding interface plane 210. A surface of shield structure 116 in or near bonding interface plane 210 faces a surface of shield structure 216 in or near bonding interface plane 210. A surface of shield structure 126 in or near bonding interface plane 210 faces a surface of shield structure 226 in or near bonding interface plane 210. A surface of shield structure 136 in or near bonding interface plane 210 faces a surface of shield structure 236 in or near bonding interface plane 210. The opposing surfaces of shield structures may be in contact with one another or in close proximity. For example, the proximity may be close enough such that the capacitive coupling of one shield structure, such as shield structure 106, to its opposing shield structure, such as shield structure 206, is of low capacitive reactance at frequencies of signals for which shielding is provided, such as a signal being communicated between electrically conductive pad 132 and electrically conductive pad 232, so as to provide effective shielding.

Because shield structures 106, 116, 126, 136 in integrated circuit chip 260 are paired respectively with shield structures 206, 216, 226, 236 in integrated circuit chip 270, shielding is symmetrical about bonding interface plane 210. In some embodiments, shield structures 106, 116, 126, 136 have individual top geometries that are respectively the same as individual top geometries of shield structures 206, 216, 226, 236. In some embodiments, shield structures 106, 116, 126, 136 have individual top geometries that are circular, square, or the like.

In some embodiments, the plurality of electrically conductive pads 132, 142, 152, 232, 242, 252 are or comprise aluminum, copper, aluminum copper, some other suitable metals, or any combination of the foregoing. Other electrically conductive pads hereafter introduced and described are conductive and may, for example, be or comprise a same material as the plurality of electrically conductive pads 132, 142, 152, 232, 242, 252.

In some embodiments, the plurality of shield structures 106, 116, 126, 136, 206, 216, 226, 236 are conductive. For example, the plurality of shield structures 106, 116, 126, 136, 206, 216, 226, 236 may be or comprise aluminum, copper, aluminum copper, some other suitable metals, or any combination of the foregoing. In some of such embodiments, the plurality of shield structures 106, 116, 126, 136, 206, 216, 226, 236 are electrically floating. In other embodiments, the plurality of shield structures 106, 116, 126, 136, 206, 216, 226, 236 are biased to ground or some other suitable potential.

In other embodiments, the plurality of shield structures 106, 116, 126, 136, 206, 216, 226, 236 are dielectric. For example, the plurality of shield structures 106, 116, 126, 136, 206, 216, 226, 236 may be or comprise a low k dielectric and/or the like. A low k dielectric may, for example, be or comprise a dielectric having a dielectric constant less than about 3.9, 2.0, or some other suitable value, and/or may, for example, be or comprise a dielectric having a dielectric constant less than dielectric material immediately surrounding the plurality of shield structures 106, 116, 126, 136, 206, 216, 226, 236 (e.g., dielectric layers 190, 290).

Other shield structures hereafter introduced and described may, for example, be or comprise a same material as the plurality of shield structures 106, 116, 126, 136, 206, 216, 226, 236. For example, such other shield structures may be conductive or dielectric, floating or biased, and so on.

Figure 3:
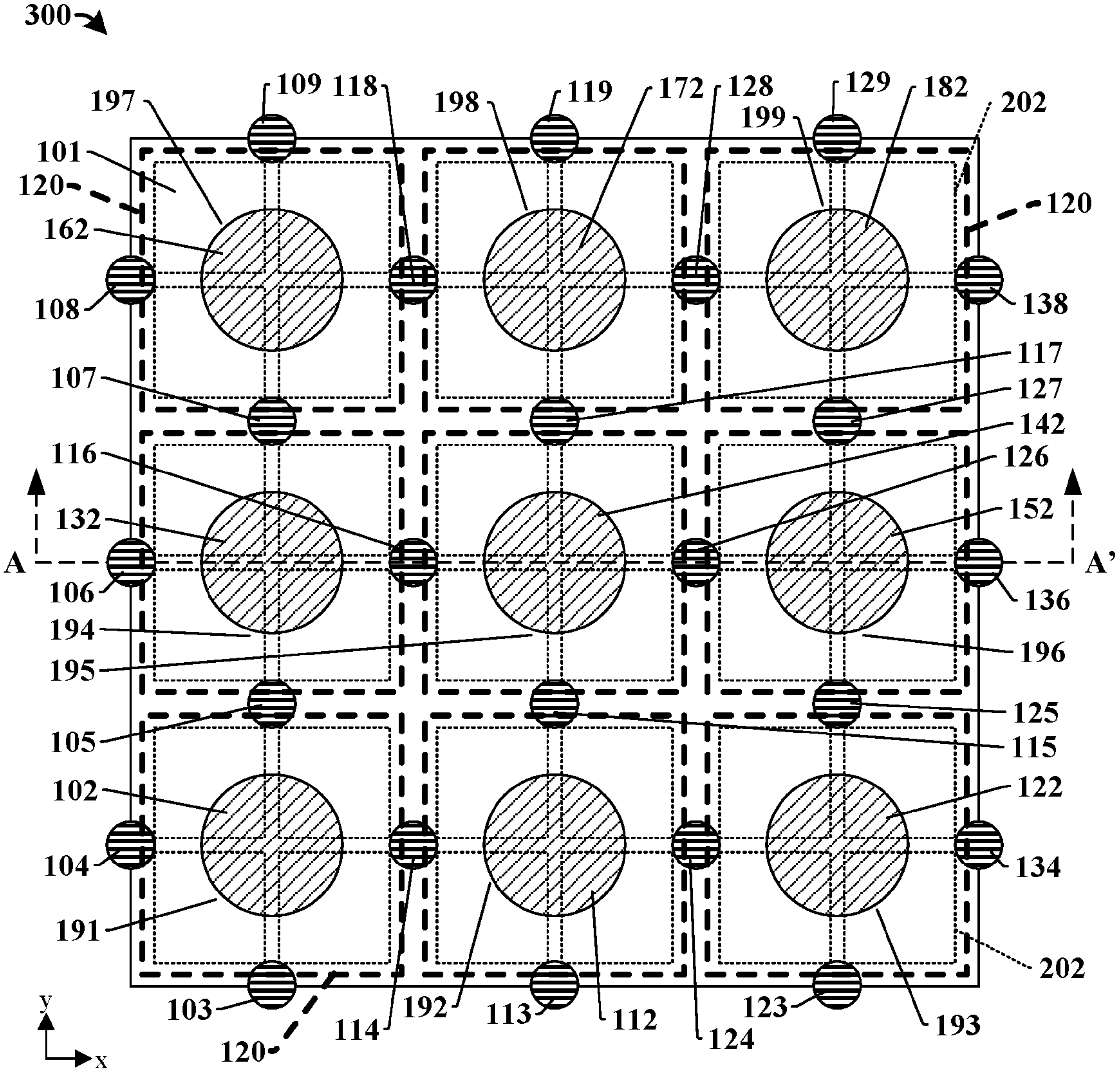
FIG. 3 illustrates a cross-sectional plan view of an interstitial stacked integrated-circuit interface shielding structure.

FIG. 3 illustrates a cross-sectional plan view of an interstitial stacked integrated-circuit interface shielding structure. The cross-sectional plan view of FIG. 3 is taken along bonding interface plane 210, as shown by a dashed line B-B' in FIG. 2. The features in FIG. 3 exist in the context of an example of an array of pixels 120 of an image sensor. In the example of FIG. 3. nine pixels are shown, as demarcated by thick dashed boxes. In such example, each pixel 120 comprises multiple photodiodes in a multi-dimensional (e.g., two-by-two) subarray. Hence, the thick dashed boxes labeled as the pixels 120 may also be regarded as photodiode blocks or the like.

A plurality of electrically conductive pads 102, 112, 122, 132, 142, 152, 162, 172, and 182 are disposed in common plane 300. In the example, each electrically conductive pad provides an electrical connection for one corresponding pixel. Shield structures 103, 113, 123, 104, 114, 124, 134, 105, 115, 125, 106, 116, 126, 136, 107, 117, 127, 108, 118, 128, 138, 109, 119, and 129 are disposed in plane 300 and centered between centers of adjacent electrically conductive pads, such as between two adjacent electrically conductive pads among electrically conductive pads 102, 112, 122, 132, 142, 152, 162, 172, and 182, which are also disposed in plane 300. For example, shield structure 114 is centered between centers of electrically conductive pads 102 and 112, bisecting a line between closest points of electrically conductive pad 102 to electrically conductive pad 112. As another example, shield structure 124 is centered between centers of electrically conductive pads 112 and 122, bisecting a line between closest points of electrically conductive pad 112 to electrically conductive pad 122. Likewise, along an orthogonal axis, shield structure 105 is centered between centers of electrically conductive pads 102 and 132, bisecting a line between closest points of electrically conductive pad 102 to electrically conductive pad 132. As another example, shield structure 115 is centered between centers of electrically conductive pads 112 and 142, bisecting a line between closest points of electrically conductive pad 112 to electrically conductive pad 142. The axes along which the shield structures are located relative to the electrically conductive pads for which they provide shielding are aligned with the axes of the pixel array for which the electrically conductive pads provide signal communication.

As an example, shield structures can be thought of as being in front of, in back of, to the left of, and to the right of an electrically conductive pad. For example, electrically conductive pad 142 has shield structure 115 in front of it, shield structure 117 in back of it, shield structure 116 to the left of it, and shield structure 126 to the right of it. Thus, four shield structures are peripheral to electrically conductive pad 142.

In some embodiments, the plurality of electrically conductive pads 102, 112, 122, 132, 142, 152, 162, 172, and 182 are in a plurality of rows (e.g., x dimension) and a plurality of columns (e.g., y dimension). Further, the shield structures 103, 113, 123, 104, 114, 124, 134, 105, 115, 125, 106, 116, 126, 136, 107, 117, 127, 108, 118, 128, 138, 109, 119, and 129 alternate one to one with the plurality of electrically conductive pads 102, 112, 122, 132, 142, 152, 162, 172, and 182 along the rows and the columns.

Figure 4:
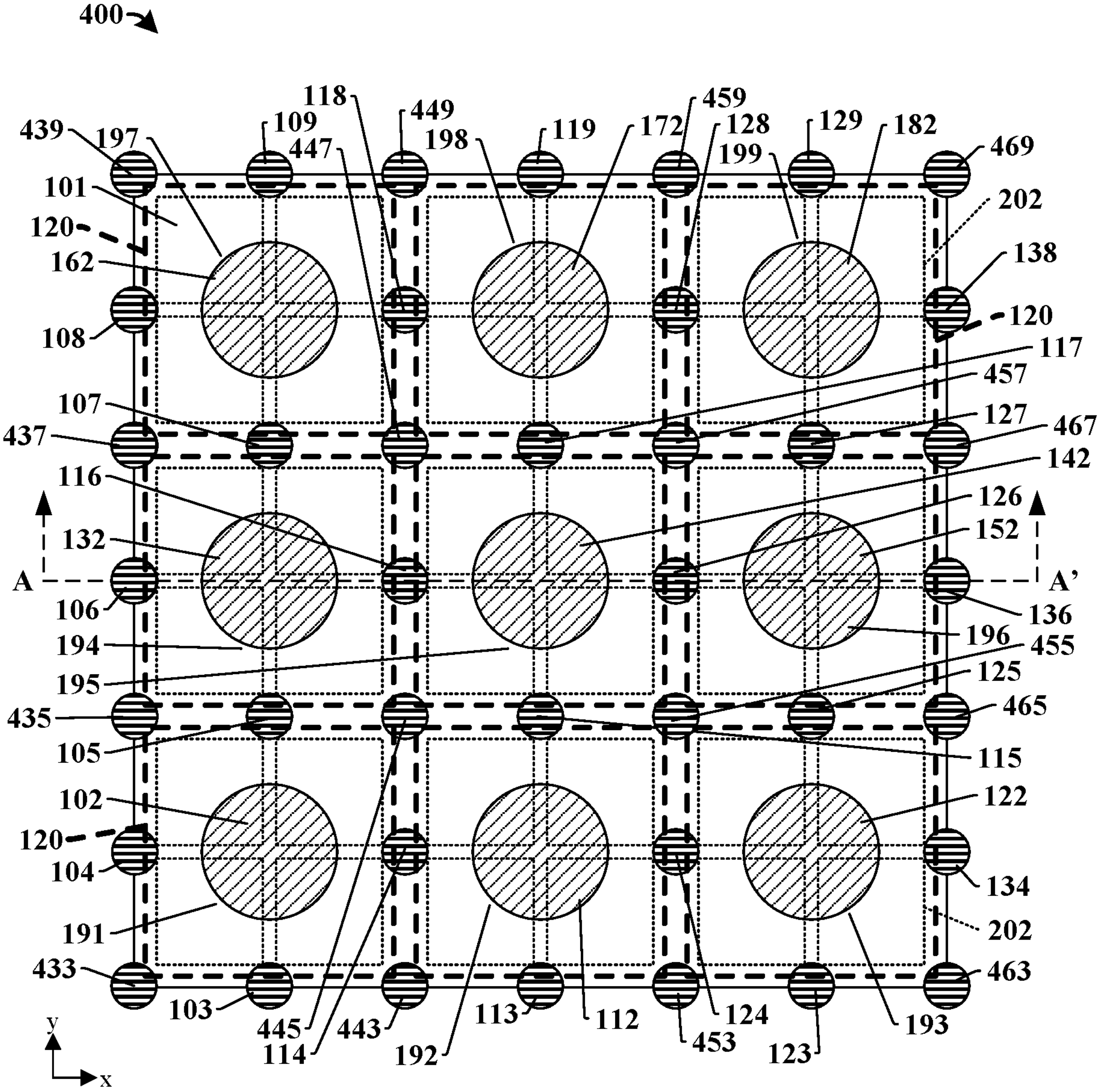
FIG. 4 illustrates a cross-sectional plan view of an interstitial stacked integrated-circuit interface shielding structure.

FIG. 4 illustrates an enlarged cross-sectional view of an interstitial stacked integrated-circuit interface shielding structure. The cross-sectional plan view of FIG. 4 is taken along bonding interface plane 210, as shown by a dashed line B-B' in FIG. 2. The features in FIG. 4 exist in the context of an example of an array of pixels 120 of an image sensor. In the example of FIG. 4, nine pixels are shown, as demarcated by thick dashed boxes. In such example, each pixel 120 comprises multiple photodiodes in a multi-dimensional (e.g., two-by-two) subarray. Hence, the thick dashed boxes labeled as the pixels 120 may also be regarded as photodiode blocks or the like.

A plurality of electrically conductive pads 102, 112, 122, 132, 142, 152, 162, 172, and 182 are disposed in common plane 400. In the example, each electrically conductive pad provides an electrical connection for one corresponding pixel. The example shown in FIG. 4 provides eight shield structures disposed in plane 400 and peripheral to an electrically conductive pad, which is also disposed in plane 400. The shield structures can be thought of being in front of, in back of, to the left of, to the right of, to the front left of, to the front right of, to the rear left of, and to the rear right of an electrically conductive pad. As an example, electrically conductive pad 142 has shield structure 115 in front of it, shield structure 117 in back of it, shield structure 116 to the left of it, shield structure 126 to the right of it, shield structure 445 to the front left of it, shield structure 455 to the front right of it, shield structure 447 to the rear left of it, and shield structure 457 to the right rear of it.

The shield structures in the front left, front right, rear left, and rear right locations relative to an electrically conductive pad are centered between the centers of four electrically conductive pads in a square or rectangular relationship. For example, shield structure 457 is centered between the centers of electrically conductive pads 142, 152, 172, and 182. FIG. 4 shows shield structures 433, 443, 453, 463, 435, 445, 455, 465, 437, 447, 457, 467, 439, 449, 459, and 469 so situated, in addition to shield structures 103, 113, 123, 104, 114, 124, 134, 105, 115, 125, 106, 116, 126, 136, 107, 117, 127, 108, 118, 128, 138, 109, 119, and 129, as shown in FIG. 3.

In some embodiments, the plurality of electrically conductive pads 102, 112, 122, 132, 142, 152, 162, 172, and 182 are in a plurality of rows (e.g., x dimension) and a plurality of columns (e.g., y dimension). The shield structures 103, 113, 123, 104, 114, 124, 134, 105, 115, 125, 106, 116, 126, 136, 107, 117, 127, 108, 118, 128, 138, 109, 119, 129, 433, 443, 453, 463, 435, 445, 455, 465, 437, 447, 457, 467, 439, 449, 459, and 469 (the shield structures) alternate one to one with the plurality of electrically conductive pads 102, 112, 122, 132, 142, 152, 162, 172, and 182 along the rows and the columns. Further, the shield structures alternate one to one with the plurality of electrically conductive pads 102, 112, 122, 132, 142, 152, 162, 172, and 182 diagonally (e.g., transverse to the rows and the columns).

Figure 5:
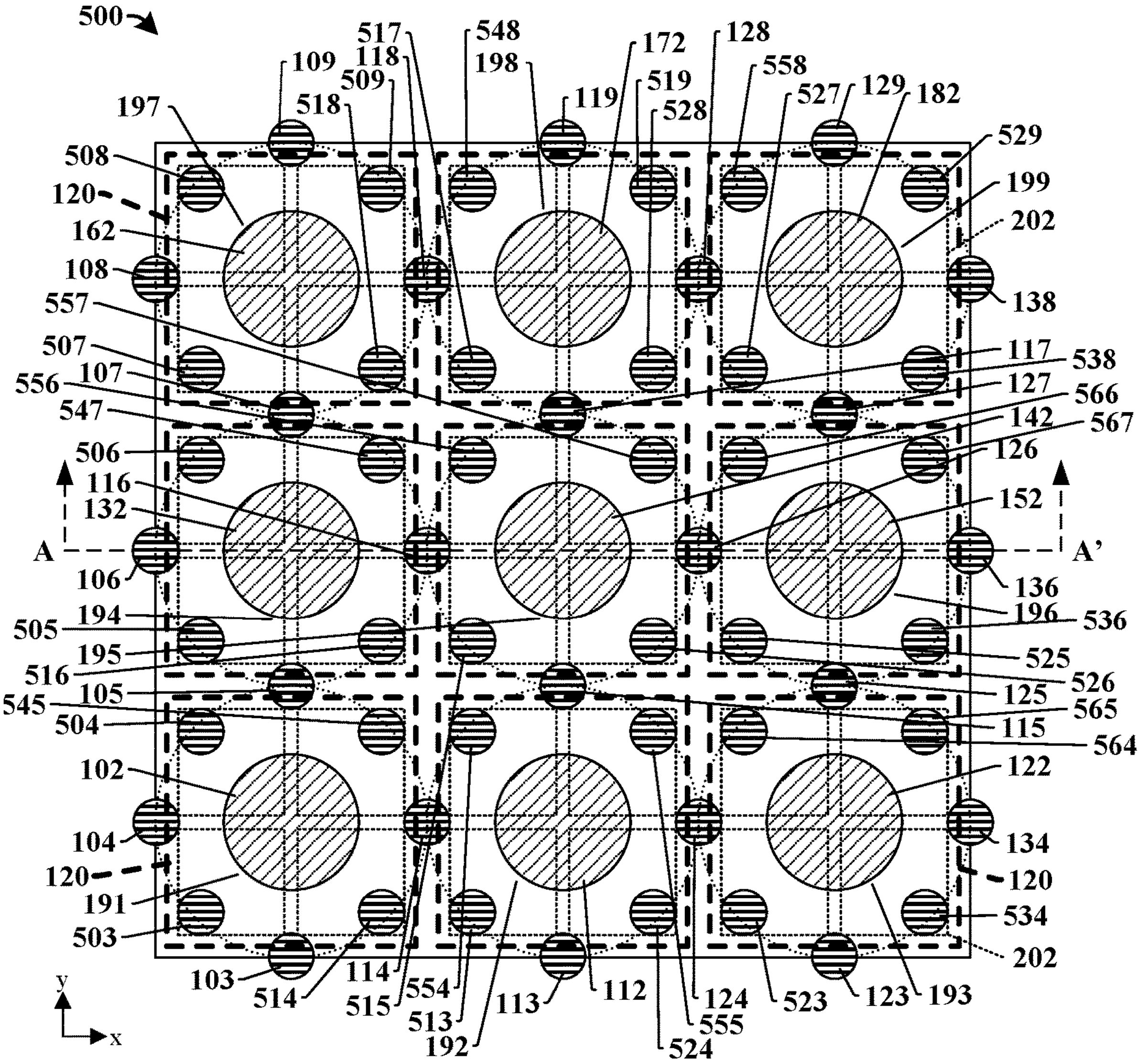
FIG. 5 illustrates a cross-sectional plan view of an interstitial stacked-integrated-circuit interface shielding structure.

FIG. 5 illustrates a cross-sectional plan view of an interstitial stacked-integrated-circuit interface shielding structure. The cross-sectional plan view of FIG. 5 is taken along bonding interface plane 210, as shown by a dashed line B-B' in FIG. 2. The features in FIG. 5 exist in the context of an example of an array of pixels 120 of an image sensor. In the example of FIG. 5, nine pixels are shown, as demarcated by thick dashed boxes. In such example, each pixel 120 comprises multiple photodiodes in a multi-dimensional (e.g., two-by-two) subarray. Hence, the thick dashed boxes labeled as the pixels 120 may also be regarded as photodiode blocks or the like.

A plurality of electrically conductive pads 102, 112, 122, 132, 142, 152, 162, 172, and 182 are disposed in common plane 500. In the example, each electrically conductive pad provides an electrical connection for one corresponding pixel. As shown in FIG. 5, shield structures, disposed in common plane 500, can surround an electrically conductive pad at a constant radius from the electrically conductive pad to improve communication performance for communication of a signal via the electrically conductive pad, also disposed in common plane 500. In other words, shield structures can circumferentially and individually surround the plurality of electrically conductive pads 102, 112, 122, 132, 142, 152, 162, 172, and 182.

For example, electrically conductive pad 142 is surrounded by eight shield structures 115, 515, 116, 556, 117, 557, 126, and 526 at 45-degree increments around electrically conductive pad 142. Shield structure 115 is located in front of electrically conductive pad 142. Shield structure 515 is located at the front left of electrically conductive pad 142, 45 degrees clockwise from shield structure 115, as viewed from above. Shield structure 116 is located at the front left of electrically conductive pad 142, 45 degrees clockwise from shield structure 515, as viewed from above. Shield structure 556 is located at the front left of electrically conductive pad 142, 45 degrees clockwise from shield structure 116, as viewed from above. Shield structure 117 is located at the front left of electrically conductive pad 142, 45 degrees clockwise from shield structure 556, as viewed from above. Shield structure 557 is located at the front left of electrically conductive pad 142, 45 degrees clockwise from shield structure 117, as viewed from above. Shield structure 126 is located at the front left of electrically conductive pad 142, 45 degrees clockwise from shield structure 557, as viewed from above. Shield structure 526 is located at the front left of electrically conductive pad 142, 45 degrees clockwise from shield structure 126, as viewed from above.

As another example, electrically conductive pad 102 is surrounded by eight shield structures 103, 503, 104, 504, 105, 545, 114, and 514 at 45-degree increments around electrically conductive pad 102. As another example, electrically conductive pad 112 is surrounded by eight shield structures 113, 513, 114, 554, 115, 555, 124, and 524 at 45-degree increments around electrically conductive pad 112. For example, electrically conductive pad 122 is surrounded by eight shield structures 123, 523, 124, 564, 125, 565, 134, and 534 at 45-degree increments around electrically conductive pad 122. For example, electrically conductive pad 132 is surrounded by eight shield structures 105, 505, 106, 506, 107, 547, 116, and 516 at 45-degree increments around electrically conductive pad 132. For example, electrically conductive pad 152 is surrounded by eight shield structures 125, 525, 126, 566, 127, 567, 136, and 536 at 45-degree increments around electrically conductive pad 152. For example, electrically conductive pad 162 is surrounded by eight shield structures 107, 507, 108, 508, 109, 509, 118, and 518 at 45-degree increments around electrically conductive pad 162. For example, electrically conductive pad 172 is surrounded by eight shield structures 117, 517, 118, 548, 119, 519, 128, and 528 at 45-degree increments around electrically conductive pad 172. For example, electrically conductive pad 182 is surrounded by eight shield structures 127, 527, 128, 558, 129, 529, 138, and 538 at 45-degree increments around electrically conductive pad 182.

Different numbers of shield structures can surround an electrically conductive pad at increments of different numbers of degrees. The increments may be, or need not be, equal in angular spacing. A shield structure may serve to surround more than one electrically conductive pad. For example, shield structure 116 surrounds electrically conductive pad 142 on its left side and surrounds electrically conductive pad 132 on its right side. As another example, shield structure 126 surrounds electrically conductive pad 142 on its right side and surrounds electrically conductive pad 152 on its left side. As yet another example, shield structure 115 surrounds electrically conductive pad 142 on its front side and surrounds electrically conductive pad 112 on its back side. While some shield structures, such as shield structures 116, 126, and 115, discussed above, may be located at a constant radius from each of two different electrically conductive pads, and the respective constant radii of the two different electrically conductive pads may be the same or different, other shield structures may be located at a constant radius from a particular single electrically conductive pad to which they are proximate, such as shield structures 515, 556, 557, and 526, proximate to electrically conductive pad 142. A shield structure may be located at unequal distances from two electrically conductive pads between which it lies. For example, shield structure 557 may be located closer to electrically conductive pad 142 and farther from electrically conductive pad 182 along a line between the centers of electrically conductive pad 142 and electrically conductive pad 182. Along that same line, shield structure 527 is located closer to electrically conductive pad 182 and farther from electrically conductive pad 142. As both shield structure 557 and shield structure 527 lie between electrically conductive pad 142 and electrically conductive pad 182, both shield structure 557 and shield structure 527 can contribute to improving signal communication performance for both electrically conductive pad 142 and electrically conductive pad 182. Thus, a single shield structure can contribute to improving signal communication performance for a plurality of electrically conductive pads. As one example, a shield structure can be electrically conductive and can provide a shielding function to electrically shield a signal being communicated via one electrically conductive pad from interference, such as crosstalk, from a different signal being communicated via a different electrically conductive pad. As a further example, an electrically conductive shield structure may be made of a magnetic material to provide magnetic and electrical shielding. As another example, a shield structure may be made of a low-dielectric-constant (low-K) material to reduce the parasitic capacitance between two electrically conductive pads according to $C=K\varepsilon_0 A/d$, where K is the dielectric constant, $\varepsilon_0$ is the permittivity of space, A is the area of the capacitor plates, and d is the distance between the capacitor plates (where the A/d terms are simplified in relation to "plates" as compared with the three-dimensional features of the electrically conductive pads). The reduction of parasitic capacitance between electrically conductive pads reduces coupling (e.g., crosstalk) of signals between the electrically conductive pads.

In some embodiments, the plurality of electrically conductive pads 102, 112, 122, 132, 142, 152, 162, 172, and 182 are in a plurality of rows (e.g., x dimension) and a plurality of columns (e.g., y dimension). The shield structures 103, 113, 123, et al. (the shield structures) alternate one to one with the plurality of electrically conductive pads 102, 112, 122, 132, 142, 152, 162, 172, and 182 along the rows and the columns. Further, the shield structures alternate many to one with the plurality of electrically conductive pads 102, 112, 122, 132, 142, 152, 162, 172, and 182 diagonally (e.g., transverse to the rows and the columns).

Figure 6:
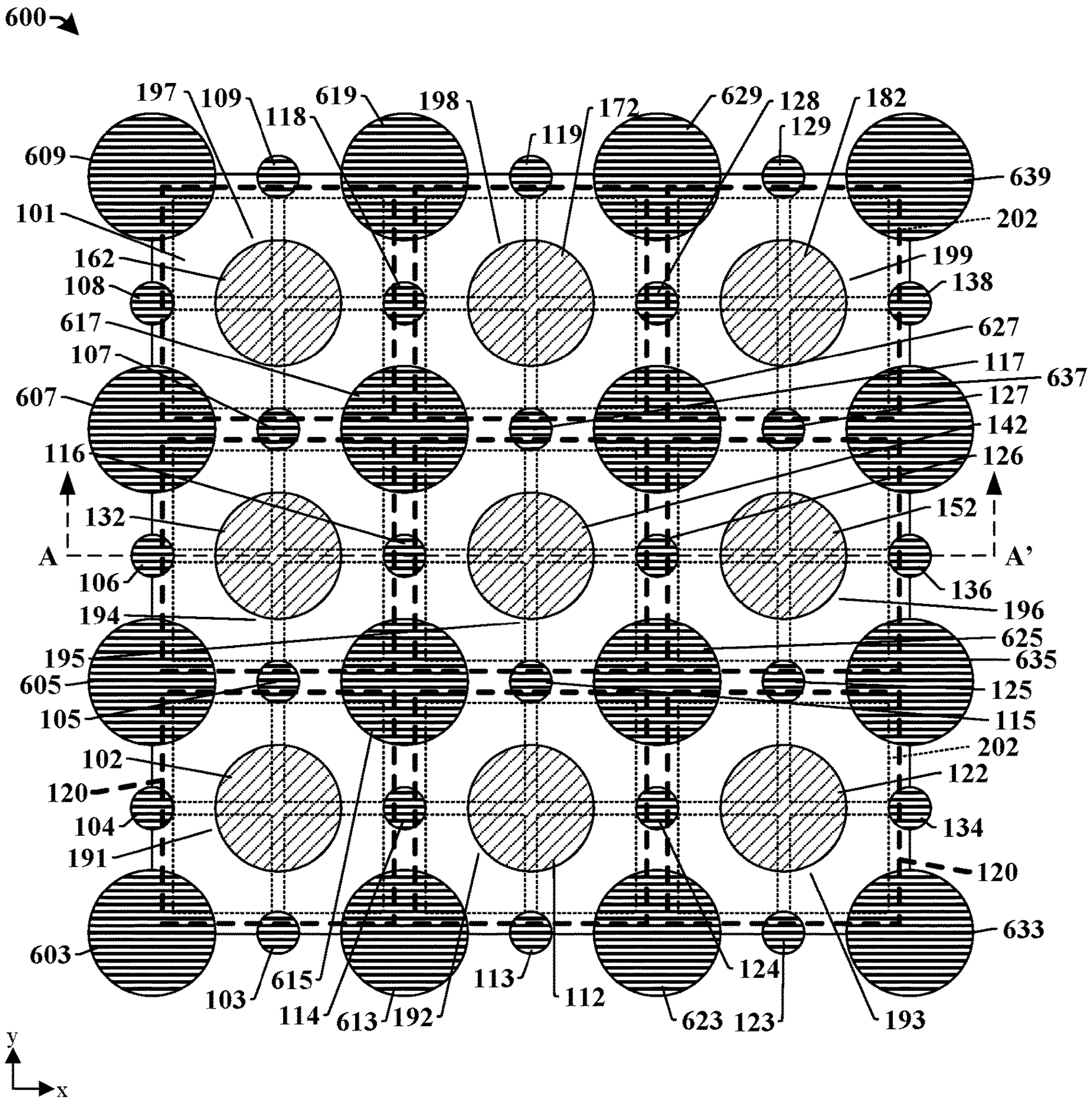
FIG. 6 illustrates a cross-sectional plan view of an interstitial stacked-integrated-circuit interface shielding structure.

FIG. 6 illustrates a cross-sectional plan view of an interstitial stacked-integrated-circuit interface shielding structure. The cross-sectional plan view of FIG. 6 is taken along bonding interface plane 210, as shown by a dashed line B-B' in FIG. 2. The features in FIG. 6 exist in the context of an example of an array of pixels 120 of an image sensor. In the example of FIG. 6, nine pixels are shown, as demarcated by thick dashed boxes. In such example, each pixel 120 comprises multiple photodiodes in a multi-dimensional (e.g., two-by-two) subarray. Hence, the thick dashed boxes labeled as the pixels 120 may also be regarded as photodiode blocks or the like.

The example of FIG. 6 includes the plurality of electrically conductive pads 102, 112, 122, 132, 142, 152, 162, 172, and 182 is disposed in common plane 600. In the example, each electrically conductive pad provides an electrical connection for one corresponding pixel. The plurality of shield structures 103, 113, 123, 104, 114, 124, 134, 105, 115, 125, 106, 116, 126, 136, 107, 117, 127, 108, 113, 128, 138, 109, 119, and 129 of FIG. 3 are also disposed in common plane 600. However, while FIG. 4 shows shield structures 433, 443, 453, 463, 435, 445, 455, 465, 437, 447, 457, 467, 439, 449, 459, and 469 in addition to the shield structures of FIG. 3, with the shield structures being of substantially identical size, FIG. 6 instead shows shield structures 603, 613, 623, 633, 605, 615, 625, 635, 607, 617, 627, 637, 609, 619, 629, and 639 at locations similar to the locations of shield structures 433, 443, 453, 463, 435, 445, 455, 465, 437, 447, 457, 467, 439, 449, 459, and 469 of FIG. 4 but with shield structures 603, 613, 623, 633, 605, 615, 625, 635, 607, 617, 627, 637, 609, 619, 629, and 639 being of larger size than shield structures 103, 113, 123, 104, 114, 124, 134, 105, 115, 125, 106, 116, 126, 136, 107, 117, 127, 108, 113, 128, 138, 109, 119, and 129. As an example, one or more of shield structures 603, 613, 623, 633, 605, 615, 625, 635, 607, 617, 627, 637, 609, 619, 629, and 639 can be of a size substantially identical to the size of one or more of electrically conductive pads 102, 112, 122, 132, 142, 152, 162, 172, and 182.

In some embodiments, the plurality of electrically conductive pads 102, 112, 122, 132, 142, 152, 162, 172, and 182 are in a plurality of rows (e.g., x dimension) and a plurality of columns (e.g., y dimension). The shield structures 103, 113, 123, et al. (the shield structures) alternate one to one with the plurality of electrically conductive pads 102, 112, 122, 132, 142, 152, 162, 172, and 182 along the rows and the columns. Further, the shield structures alternate one to one with the plurality of electrically conductive pads 102, 112, 122, 132, 142, 152, 162, 172, and 182 diagonally (e.g., transverse to the rows and the columns). The shield structures alternating diagonally with the plurality of electrically conductive pads 102, 112, 122, 132, 142, 152, 162, 172, and 182 have individual top geometries that are larger (e.g., span a larger area) than the shield structures alternating with the plurality of electrically conductive pads 102, 112, 122, 132, 142, 152, 162, 172, and 182 along the rows and the columns. In some embodiments, the shield structures alternating diagonally with the plurality of electrically conductive pads 102, 112, 122, 132, 142, 152, 162, 172, and 182 have individual top geometries that are the same as individual top geometries of the plurality of electrically conductive pads 102, 112, 122, 132, 142, 152, 162, 172, and 182.

Figure 7:
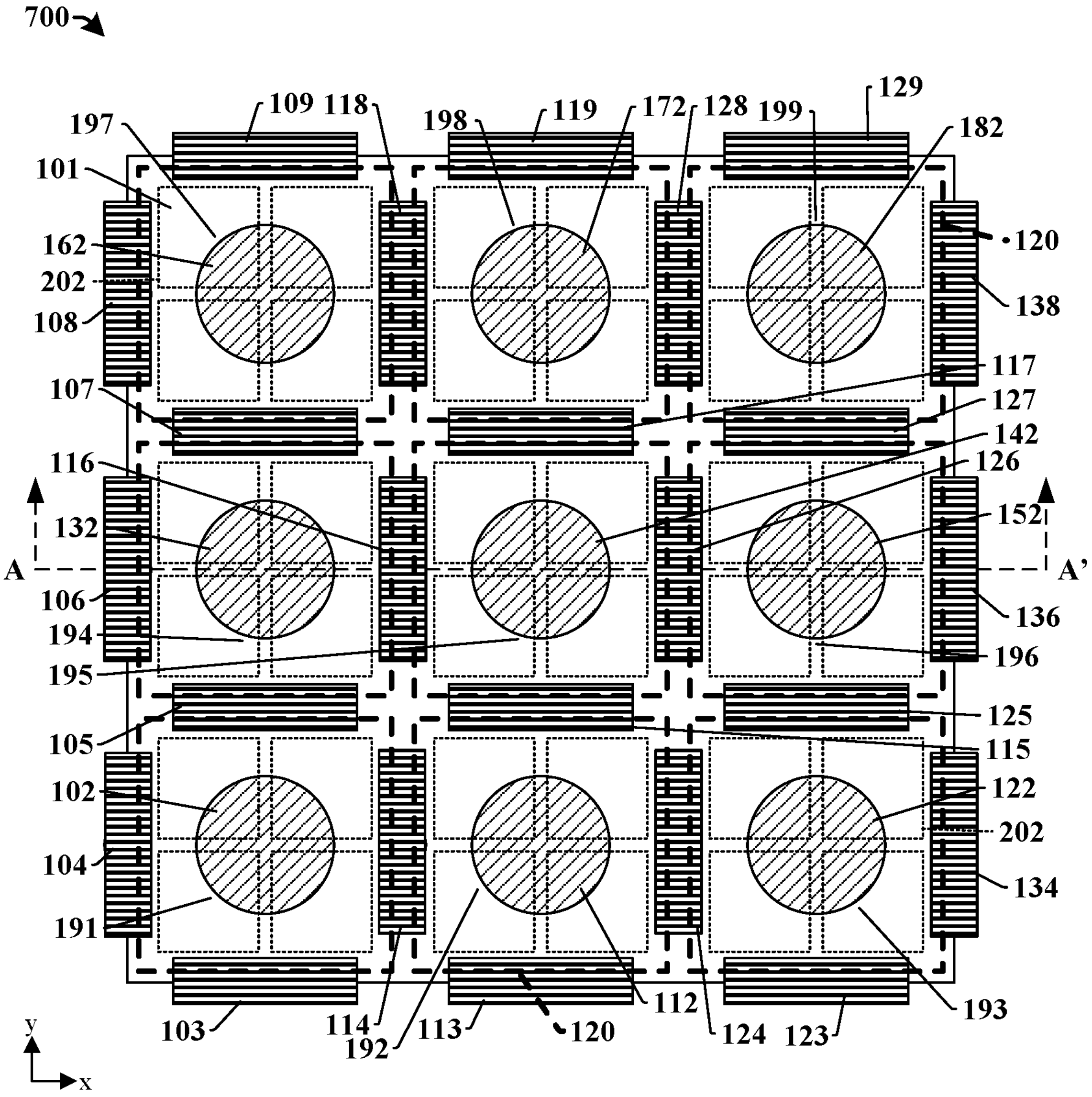
FIG. 7 illustrates a cross-sectional plan view of an interstitial stacked-integrated-circuit interface shielding structure.

FIG. 7 illustrates a cross-sectional plan view of an interstitial stacked-integrated-circuit interface shielding structure. The cross-sectional plan view of FIG. 7 is taken along bonding interface plane 210, as shown by a dashed line B-B' in FIG. 2. The features in FIG. 7 exist in the context of an example of an array of pixels 120 of an image sensor. In the example of FIG. 7, nine pixels are shown, as demarcated by thick dashed boxes. In such example, each pixel 120 comprises multiple photodiodes in a multi-dimensional (e.g., two-by-two) subarray. Hence, the thick dashed boxes labeled as the pixels 120 may also be regarded as photodiode blocks or the like.

A plurality of electrically conductive pads 102, 112, 122, 132, 142, 152, 162, 172, and 182 are disposed in common plane 700. In the example, each electrically conductive pad provides an electrical connection for one corresponding pixel. The example of FIG. 7 comprises shield structures 103, 113, 123, 105, 115, 125, 107, 117, 127, 109, 119, and 129 in elongated form (e.g., as elongated rectangles) aligned with a first axis of a pixel array and shield structures 104, 114, 124, 134, 106, 116, 126, 136, 108, 118, 128, and 138 in elongated form (e.g., as elongated rectangles) aligned with a second axis of the pixel array, the second axis orthogonal to the first axis, the shield structures disposed in plane 700. The shield structures surround electrically conductive pads 102, 112, 122, 132, 142, 152, 162, 172, and 182. As an example, shield structure 103 is located in front of electrically conductive pad 102, shield structure 104 is located to the left of electrically conductive pad 102, shield structure 105 is located in back of electrically conductive pad 102, and shield structure 114 is located to the right of electrically conductive pad 102. The orthogonal elongated shield structures form a grid providing substantial shielding of electrically conductive pads from one another.

In some embodiments, the plurality of electrically conductive pads 102, 112, 122, 132, 142, 152, 162, 172, and 182 are in a plurality of rows (e.g., x dimension) and a plurality of columns (e.g., y dimension). The shield structures 103, 113, 123, et al. (the shield structures) alternate one to one with the plurality of electrically conductive pads 102, 112, 122, 132, 142, 152, 162, 172, and 182 along the rows and the columns. The shield structures alternating with the plurality of electrically conductive pads 102, 112, 122, 132, 142, 152, 162, 172, and 182 along the rows have individual top geometries that are rectangular and elongated (e.g., have greatest dimensions) orthogonal to the rows. The shield structures alternating with the plurality of electrically conductive pads 102, 112, 122, 132, 142, 152, 162, 172, and 182 along the columns have individual top geometries that are rectangular and elongated (e.g., have greatest dimensions) orthogonal to the columns.

Figure 8A:
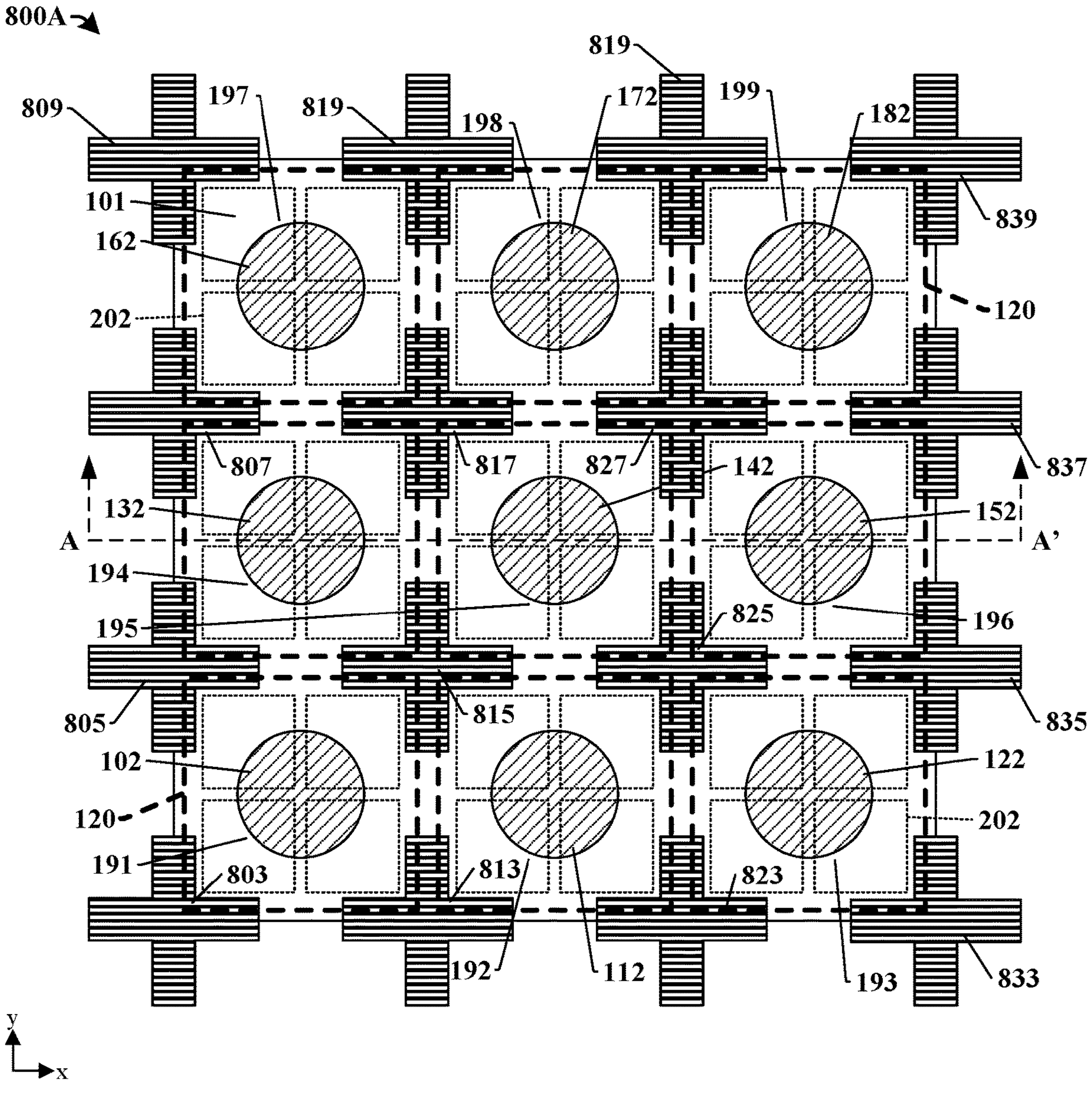
FIG. 8A illustrates a cross-sectional plan view of an interstitial stacked-integrated-circuit interface shielding structure.

FIG. 8A illustrates a cross-sectional plan view of an interstitial stacked-integrated-circuit interface shielding structure. The cross-sectional plan view of FIG. 8A is taken along bonding interface plane 210, as shown by a dashed line B-B' in FIG. 2. The features in FIG. 8A exist in the context of an example of an array of pixels 120 of an image sensor. In the example of FIG. 8A, nine pixels are shown, as demarcated by thick dashed boxes. In such example, each pixel 120 comprises multiple photodiodes in a multi-dimensional (e.g., two-by-two) subarray. Hence, the thick dashed boxes labeled as the pixels 120 may also be regarded as photodiode blocks or the like.

The example of FIG. 8A includes the plurality of electrically conductive pads 102, 112, 122, 132, 142, 152, 162, 172, and 182 disposed in common plane 800A. In the example, each electrically conductive pad provides an electrical connection for one corresponding pixel. FIG. 8A includes shield structures 803, 813, 823, 833, 805, 815, 825, 835, 807, 817, 827, 837, 809, 819, 829, and 839 in the shape of a cross or plus (+) sign, disposed in plane 800A and centered on the corners of pixels (e.g., 2×2 pixels), with each pixel served by a common electrically conductive pad. As an example, cross-shaped (e.g., plus-shaped) shield structure 815 is located to the front left of electrically conductive pad 142, cross-shaped shield structure 817 is located to the rear left of electrically conductive pad 142, cross-shaped shield structure 827 is located to the rear right of electrically conductive pad 142, cross-shaped shield structure 825 is located to the front right of electrically conductive pad 142, shield structure 115 is located in front of electrically conductive pad 142, shield structure 116 is located to the left of electrically conductive pad 142, shield structure 117 is located in back of electrically conductive pad 142, and shield structure 126 is located to the right of electrically conductive pad 142. The orientations of the cross-shaped shield structures are aligned with the rectilinear pixel array.

In some embodiments, the plurality of electrically conductive pads 102, 112, 122, 132, 142, 152, 162, 172, and 182 are in a plurality of rows (e.g., x dimension) and a plurality of columns (e.g., y dimension). The shield structures 803, 813, 823, 833, et al. (the shield structures) alternate one to one with the plurality of electrically conductive pads 102, 112, 122, 132, 142, 152, 162, 172, and 182 diagonally (e.g., transverse to the rows and the columns).

Figure 8B:
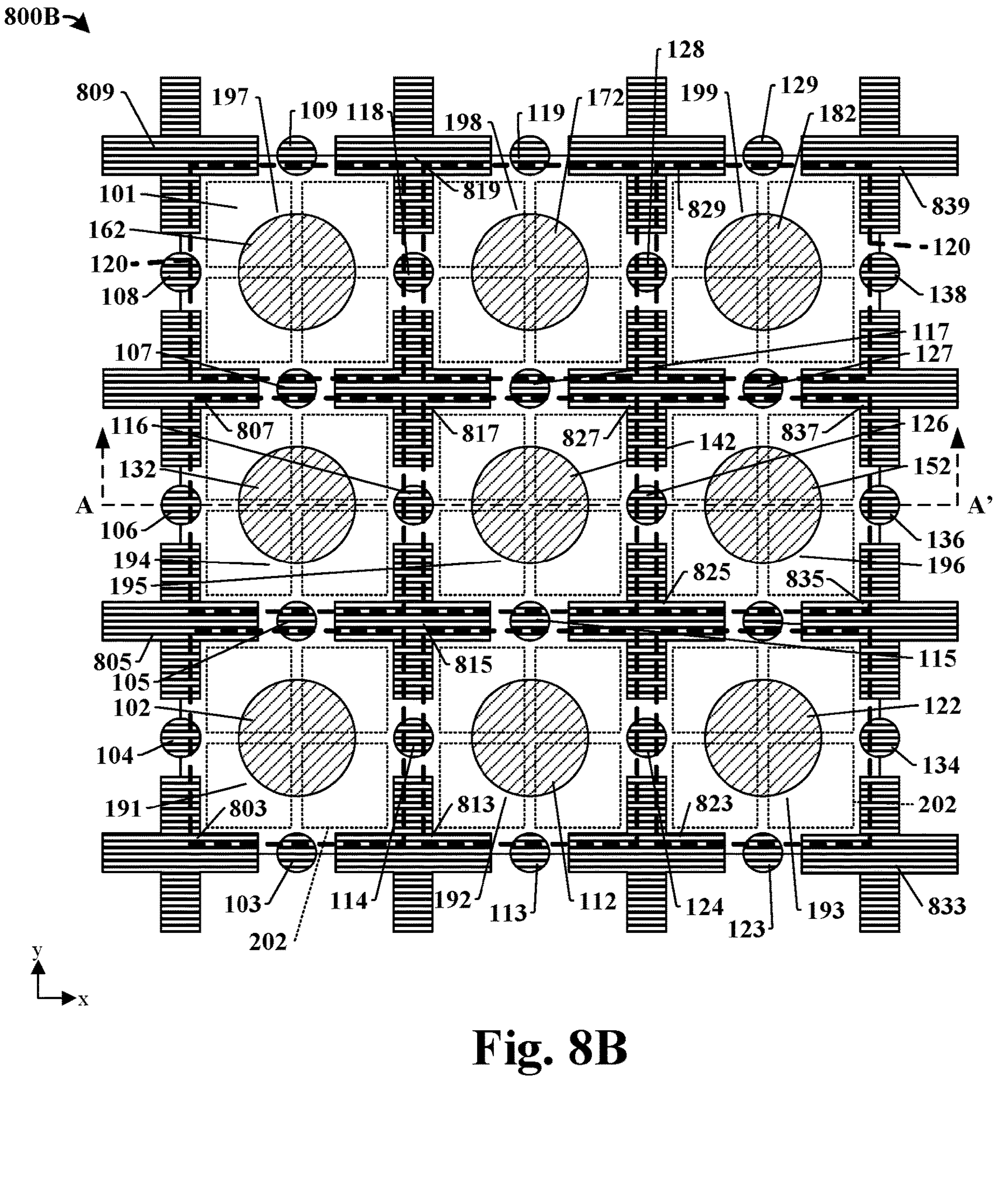
FIG. 8B illustrates a cross-sectional plan view of an interstitial stacked-integrated-circuit interface shielding structure.

FIG. 8B illustrates a cross-sectional plan view of an interstitial stacked-integrated-circuit interface shielding structure. The cross-sectional plan view of FIG. 8B is taken along bonding interface plane 210, as shown by a dashed line B-B' in FIG. 2. The features in FIG. 8B exist in the context of an example of an array of pixels 120 of an image sensor. In the example of FIG. 8B, nine pixels are shown, as demarcated by thick dashed boxes. In such example, each pixel 120 comprises multiple photodiodes in a multi-dimensional (e.g., two-by-two) subarray. Hence, the thick dashed boxes labeled as the pixels 120 may also be regarded as photodiode blocks or the like.

The example of FIG. 8B includes the plurality of electrically conductive pads 102, 112, 122, 132, 142, 152, 162, 172, and 182 disposed in common plane 800B. In the example, each electrically conductive pad provides an electrical connection for one corresponding pixel. The plurality of shield structures 103, 113, 123, 104, 114, 124, 134, 105, 115, 125, 106, 116, 126, 136, 107, 117, 127, 108, 113, 128, 138, 109, 119, and 129 of FIG. 3 are also disposed in common plane 800B. However, while FIG. 4 shows shield structures 433, 443, 453, 463, 435, 445, 455, 465, 437, 447, 457, 467, 439, 449, 459, and 469 in addition to the shield structures of FIG. 3, FIG. 8B instead shows shield structures 803, 813, 823, 833, 805, 815, 825, 835, 807, 817, 827, 837, 809, 819, 829, and 839 at locations similar to the locations of shield structures 433, 443, 453, 463, 435, 445, 455, 465, 437, 447, 457, 467, 439, 449, 459, and 469 of FIG. 4 but with shield structures 803, 813, 823, 833, 805, 815, 825, 835, 807, 817, 827, 837, 809, 819, 829, and 839 being in the shape of a cross or plus (+) sign. As an example, cross-shaped (e.g., plus-shaped) shield structure 815 is located to the front left of electrically conductive pad 142, cross-shaped shield structure 817 is located to the rear left of electrically conductive pad 142, cross-shaped shield structure 827 is located to the rear right of electrically conductive pad 142, cross-shaped shield structure 825 is located to the front right of electrically conductive pad 142, shield structure 115 is located in front of electrically conductive pad 142, shield structure 116 is located to the left of electrically conductive pad 142, shield structure 117 is located in back of electrically conductive pad 142, and shield structure 126 is located to the right of electrically conductive pad 142. The orientations of the cross-shaped shield structures are aligned with the rectilinear pixel array.

In some embodiments, the plurality of electrically conductive pads 102, 112, 122, 132, 142, 152, 162, 172, and 182 are in a plurality of rows (e.g., x dimension) and a plurality of columns (e.g., y dimension). The shield structures 103, 113, 123, 104, 114, 124, 134, 105, 115, 125, 106, 116, 126, 136, 107, 117, 127, 108, 113, 128, 138, 109, 119, and 129 alternate one to one with the plurality of electrically conductive pads 102, 112, 122, 132, 142, 152, 162, 172, and 182 along the rows and the columns. Further, the shield structures 803, 813, 823, 833, 805, 815, 825, 835, 807, 817, 827, 837, 809, 819, 829, and 839 alternate one to one with the plurality of electrically conductive pads 102, 112, 122, 132, 142, 152, 162, 172, and 182 diagonally.

Figure 9:
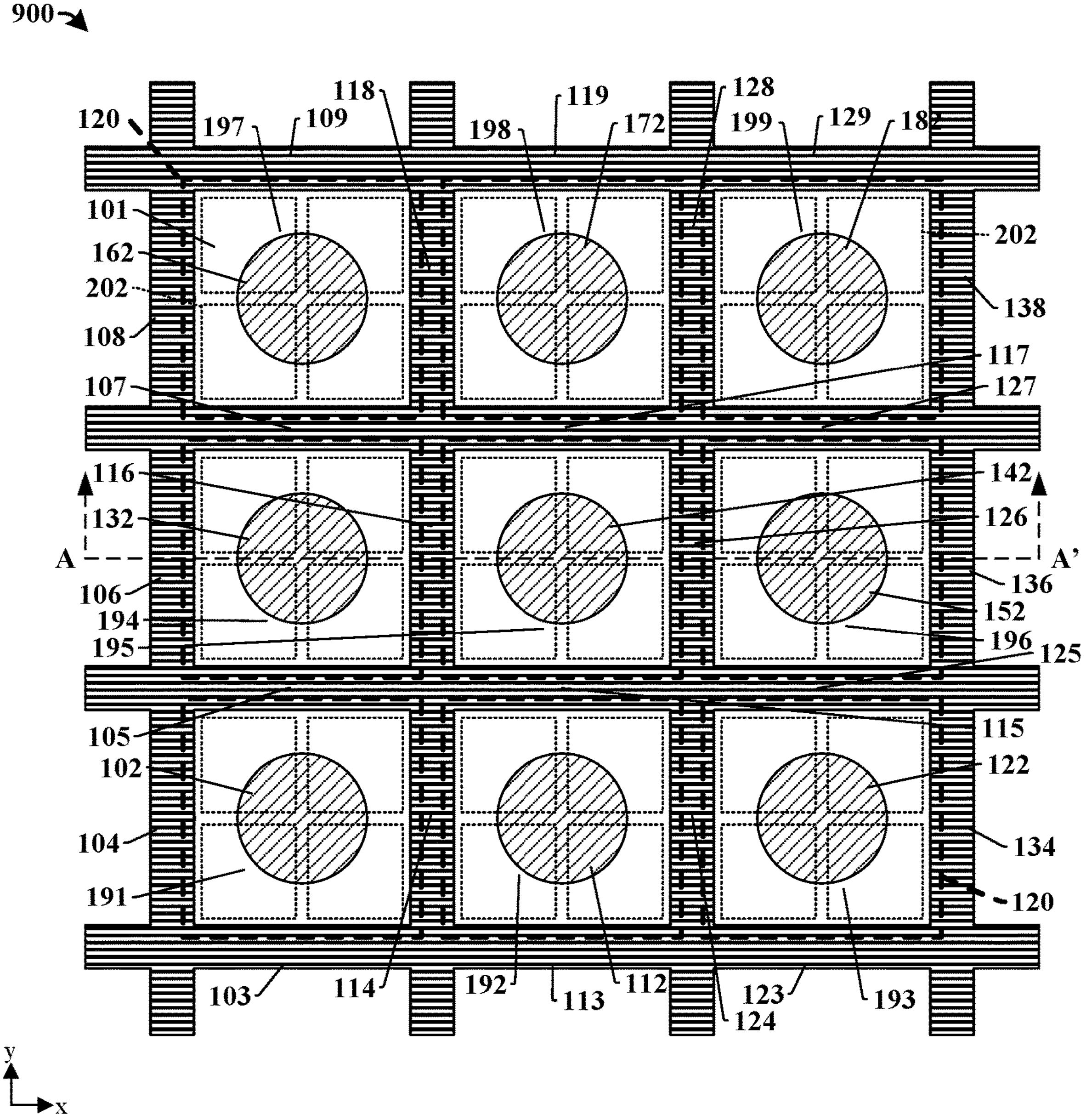
FIG. 9 illustrates a cross-sectional plan view of an interstitial stacked-integrated-circuit interface shielding structure.

FIG. 9 illustrates a cross-sectional plan view of an interstitial stacked-integrated-circuit interface shielding structure. The cross-sectional plan view of FIG. 9 is taken along bonding interface plane 210, as shown by a dashed line B-B' in FIG. 2. The features in FIG. 9 exist in the context of an example of an array of pixels 120 of an image sensor. In the example of FIG. 9, nine pixels are shown, as demarcated by thick dashed boxes. In such example, each pixel 120 comprises multiple photodiodes in a multi-dimensional (e.g., two-by-two) subarray. Hence, the thick dashed boxes labeled as the pixels 120 may also be regarded as photodiode blocks or the like.

The example of FIG. 9 includes the plurality of electrically conductive pads 102, 112, 122, 132, 142, 152, 162, 172, and 182 in common plane 900. In the example, each electrically conductive pad provides an electrical connection for one corresponding pixel. A plurality of shield structures connected together to form a continuous rectilinear grid are also disposed in common plane 900, with each electrically conductive pad surrounded by a different cell of the grid. Hence, a composite shield structure has a grid-shaped top geometry.

Shield structures in the form of parallel strips aligned with a first axis of a rectilinear pixel array include shield structures 103, 113, and 123 forming a first strip aligned with the first axis, shield structures 105, 115, and 125 forming a second strip aligned with the first axis, shield structures 107, 117, and 127 forming a third strip aligned with the first axis, shield structures 109, 119, and 129 forming a fourth strip aligned with the first axis, shield structures 104, 106, and 108 forming a first strip aligned with a second axis of the rectilinear pixel array, the second axis orthogonal to the first axis, shield structures 114, 116, and 118 forming a second strip aligned with the second axis, shield structures 124, 126, and 128 forming a third strip aligned with the second axis, and shield structures 134, 136, and 138 forming a fourth strip aligned with the second axis.

The continuous rectilinear grid can be left floating or can be connected to a voltage source. As one example, the voltage source may be ground. As one example, a continuous rectilinear grid made of low-K material may be left floating.

Figure 10:
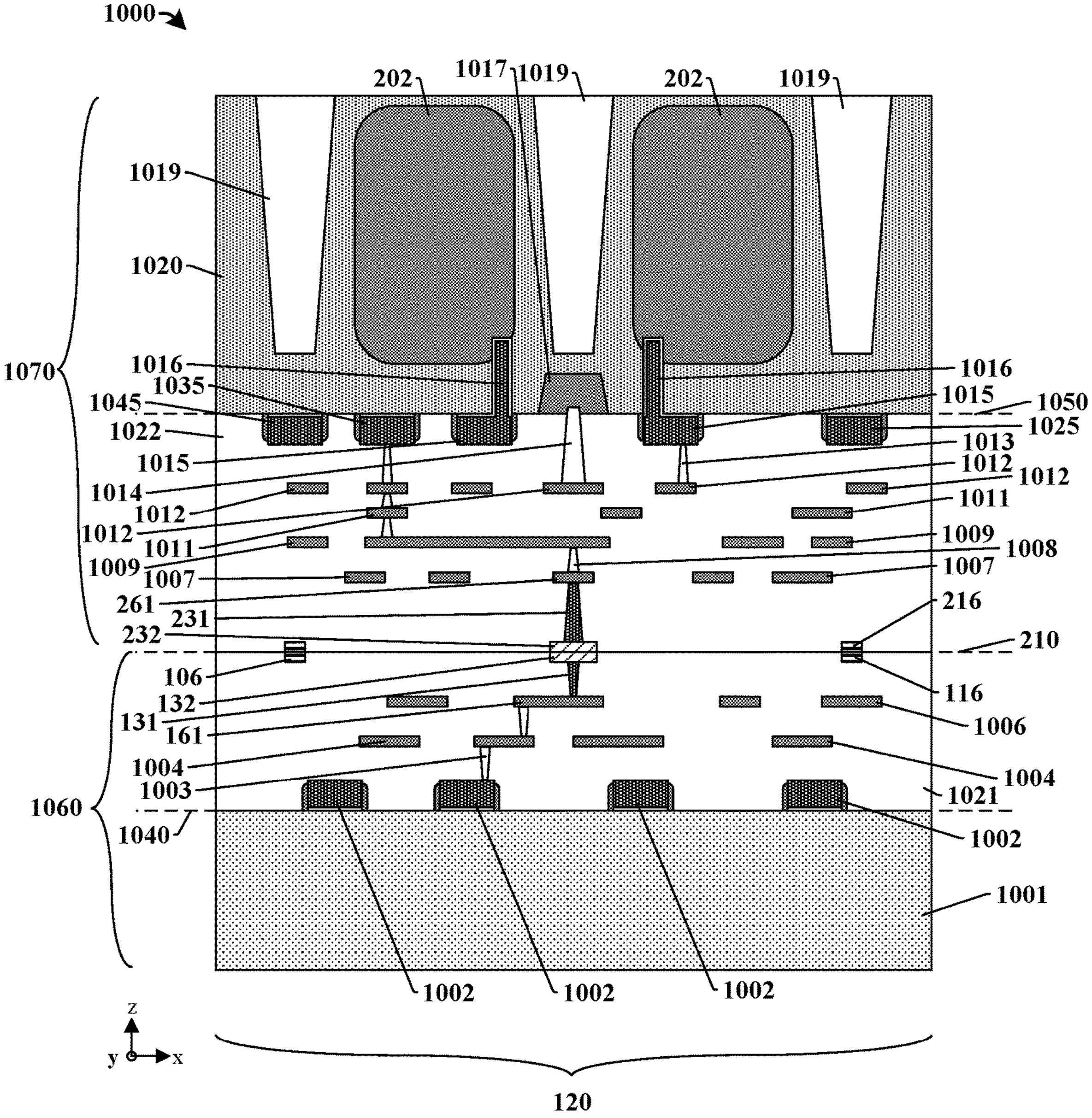
FIG. 10 illustrates a cross-sectional elevation view of a two-chip three-dimensional integrated circuit with an interstitial stacked-integrated-circuit interface shielding structure.

FIG. 10 illustrates a cross-sectional elevation view of a two-chip three-dimensional integrated circuit with an interstitial stacked-integrated-circuit interface shielding structure. Two-chip three-dimensional integrated circuit 1000 comprises integrated circuit chip 1060 and integrated circuit chip 1070 joined along bonding interface plane 210. Integrated circuit chip 1060 may, for example, be an application-specific integrated circuit (ASIC) or the like and/or correspond to integrated circuit chip 260 in earlier figures. Integrated circuit chip 1070 may, for example, be a system-on-chip (SoC) integrated circuit (IC) or the like and/or correspond to integrated circuit chip 270 in earlier figures.

After fabrication of integrated circuit chip 1060 and integrated circuit chip 1070, a bond surface, such as a M-M and D-D bond surface of a bond layer, such as a M-M and D-D bond layer, in which electrically conductive pads, such as electrically conductive pad 132, and shield structures, such as shield structures 106, 116, are disposed in integrated circuit chip 1060 is mated to a bond surface, such as a M-M and D-D bond surface, of a bond layer, such as a M-M and D-D bond layer in which electrically conductive pads, such as electrically conductive pad 232, and shield structures, such as shield structure 216 are disposed in integrated circuit chip 1070. For example, such mating aligns electrically conductive pad 132 with electrically conductive pad 232 and establishes contact between them to provide an ohmic connection. As yet another example, such mating aligns shield structure 216 with shield structure 116. The mating can provide contact between shield structure 216 and shield structure 116 to provide an ohmic connection. Alternatively, an ohmic connection need not be established. In the case of a low-k dielectric material, a gap between shield structure 216 and shield structure 116 would not be inconsistent with providing low-k material within the regions of shield structure 216, shield structure 116, and any gap therebetween. In the case of an electrically conductive material, a gap between shield structure 216 and shield structure 116 would allow capacitive coupling of the shield structures, and the resulting capacitive connection could have a low enough capacitive reactance to provide similarly effective shielding as compared to an ohmic connection.

As FIG. 10 shows, electrically conductive elements can provide an electrical connection spanning the chips of a stacked integrated circuit structure. Such electrically conductive elements include electrically conductive contact 231, electrically conductive pad 232, electrically conductive pad 132, and electrically conductive contact 131. As an example, select transistor 1035 is connected to an electrically conductive contact, which is connected to one of electrically conductive features 1012, which is connected to an electrically conductive contact, which is connected to one of electrically conductive features 1011, which is connected to an electrically conductive contact, which is connected to one of electrically conductive features 1009, which is connected to electrically conductive contact 1008, which is connected to electrically conductive feature 261. Electrically conductive feature 261 is formed from an electrically conductive layer from which other electrically conductive features 1007 are also formed. Electrically conductive feature 261 is connected to electrically conductive contact 231, which is connected to electrically conductive pad 232. Electrically conductive pad 232 mates with electrically conductive pad 132, which is connected to electrically conductive contact 131, which is connected to electrically conductive feature 161, which is connected to an electrically conductive contact, which is connected to one of electrically conductive features 1004, which is connected to electrically conductive contact 1003, which is connected to one of transistors 1002. Other elements shown in FIG. 10 but not described above will be described below with respect to integrated circuit chips mated to form the three-dimensional integrated circuit of FIG. 10.

Figure 11:
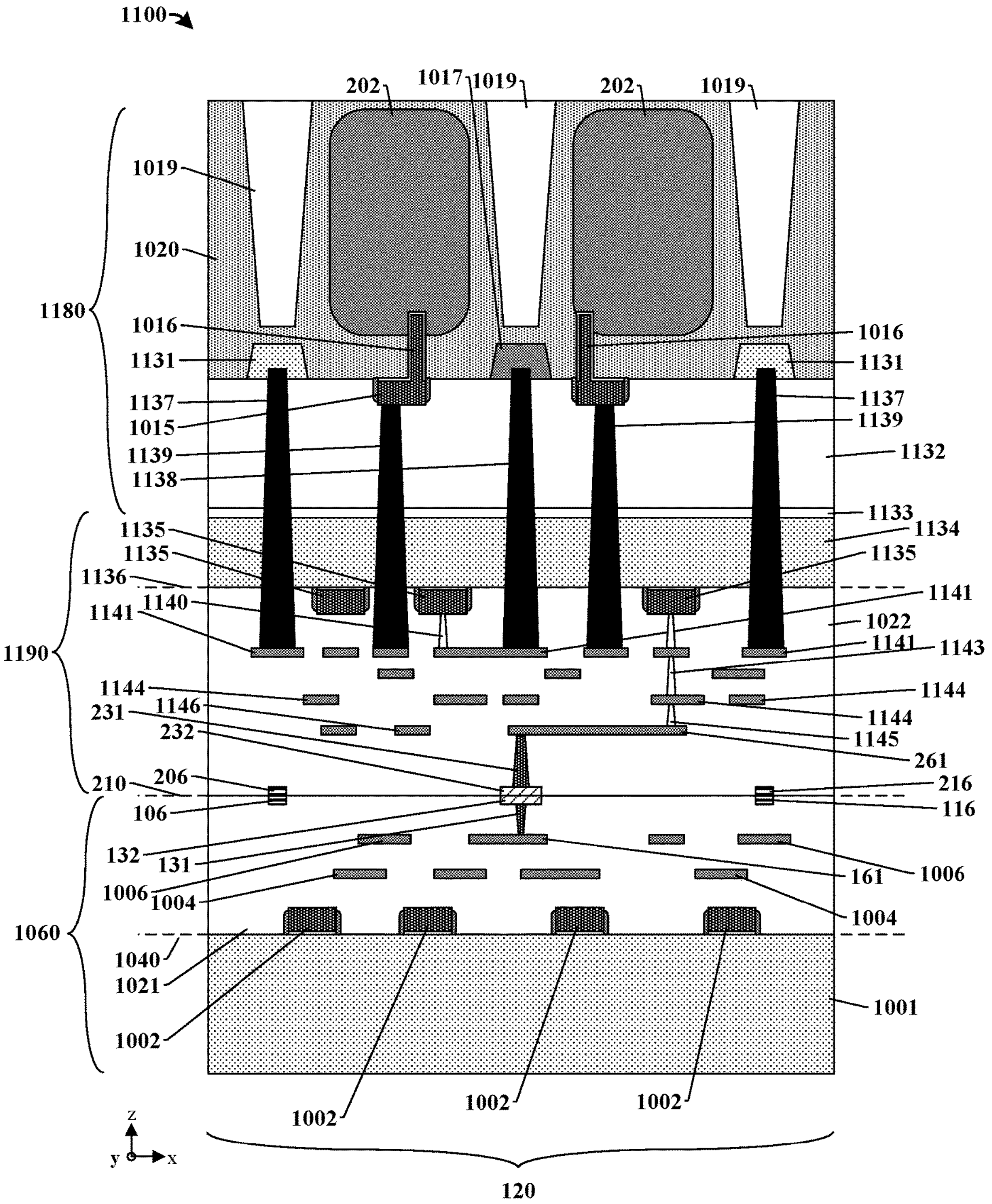
FIG. 11 illustrates a cross-sectional elevation view of a three-chip three-dimensional integrated circuit with an interstitial stacked-integrated-circuit interface shielding structure.

FIG. 11 illustrates a cross-sectional elevation view of a three-chip three-dimensional integrated circuit with an interstitial stacked-integrated-circuit interface shielding structure. Two-chip three-dimensional integrated circuit 1100 comprises integrated circuit chip 1060, integrated circuit chip 1180, and integrated circuit chip 1190. Integrated circuit chip 1060 may, for example, be an ASIC or the like and/or correspond to integrated circuit chip 260 in earlier figures. Integrated circuit chip 1180 may, for example, be a SoC IC or the like and/or integrated circuit chip 1190 may, for example, be a SoC IC or the like. The combination of integrated circuit chip 1180 and integrated circuit chip 1190 may, for example, correspond to integrated circuit chip 270 in earlier figures.

A dielectric region 1132, which, for example, may be an insulator layer (e.g., an oxide layer), of integrated circuit chip 1180 is joined to a dielectric layer 1133, which, for example, may be an insulator layer (e.g., an oxide layer), of integrated circuit chip 1190. Further, integrated circuit chip 1190 is joined to integrated circuit chip 1060 along bonding interface plane 210. After fabrication of at least a portion of integrated circuit chip 1180 and integrated circuit chip 1190, a dielectric-to-dielectric (e.g., oxide-to-oxide) bond is made between dielectric region 1132 and dielectric layer 1133. Through-oxide vias (TOVs) are formed, and other features are formed, as will be discussed below with reference to FIGS. 40-51.

After fabrication of integrated circuit chip 1060 and integrated circuit chip 1190, a bond surface, such as a M-M and D-D bond surface, of a bond layer, such as a M-M and D-D bond layer, in which electrically conductive pads, such as electrically conductive pad 132, and shield structures, such as shield structures 106, 116, are disposed in integrated circuit chip 1060 is mated to a bond surface, such as a M-M and D-D bond surface, of a bond layer, such as a M-M and D-D bond layer, in which electrically conductive pads, such as electrically conductive pad 232, and shield structures, such as shield structures 206, 216 are disposed in integrated circuit chip 1190. For example, such mating aligns electrically conductive pad 132 with electrically conductive pad 232 and establishes contact between them to provide an ohmic connection. As yet another example, such mating aligns shield structure 106 with shield structure 206. The mating can provide contact between shield structure 106 and shield structure 206 to provide an ohmic connection. Alternatively, an ohmic connection need not be established. In the case of a low-k dielectric material, a gap between shield structure 106 and shield structure 206 would not be inconsistent with providing low-k dielectric material within the regions of shield structure 106, shield structure 206, and any gap therebetween. In the case of an electrically conductive material, a gap between shield structure 106 and shield structure 206 would allow capacitive coupling of the shield structures, and the resulting capacitive connection could have a low enough capacitive reactance to provide similarly effective shielding as compared to an ohmic connection.

As FIG. 11 shows, electrically conductive elements can provide an electrical connection spanning the chips of a stacked integrated circuit structure. Such electrically conductive elements include electrically conductive contact 231, electrically conductive pad 232, electrically conductive pad 132, and electrically conductive contact 131. As an example, one of transistors 1135 is connected to an electrically conductive contact, which is connected to one of electrically conductive features 1141, which is connected to electrically conductive contact 1143, which is connected to one of electrically conductive features 1144, which is connected to electrically conductive contact 1145, which is connected to electrically conductive feature 261. Electrically conductive feature 261 is formed from an electrically conductive layer from which other electrically conductive features 1146 are also formed. Electrically conductive feature 261 is connected to electrically conductive contact 231, which is connected to electrically conductive pad 232. Electrically conductive pad 232 mates with electrically conductive pad 132, which is connected to electrically conductive contact 131, which is connected to electrically conductive feature 161. Electrically conductive features can extend beyond the plane of the cross-section to be connected to other elements, such as an electrically conductive contact, which may, for example, be connected to one of electrically conductive features 1004, which may, for example, be connected to an electrically conductive contact, which may, for example, be connected to one of transistors 1002.

The TOVs of FIG. 11 can provide interconnection between different layers of the integrated circuit structure. As an example, TOV 1138 provides electrical interconnection of floating diffusion region 1017 to electrically conductive feature 1141, which is connected to electrically conductive contact 1140, which is connected to one of transistors 1135. Transistors 1135 are fabricated on a surface of semiconductor-on-insulator (SoI) layer 1134 (e.g., silicon-on-insulator) at plane 1136. Other elements shown in FIG. 11 but not described above will be described below with respect to integrated circuit chips mated to form the three-dimensional integrated circuit of FIG. 11.

Figure 12:
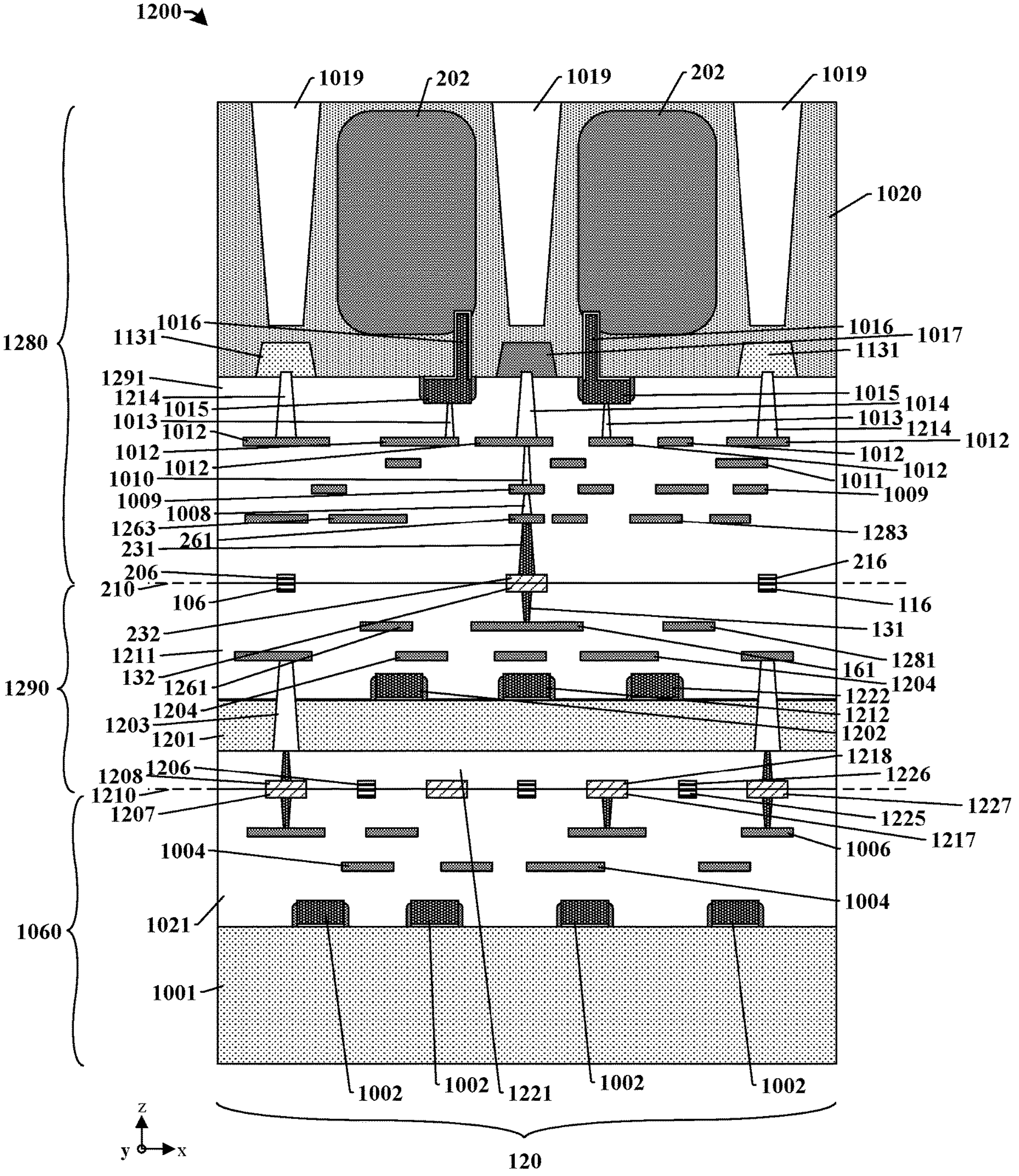
FIG. 12 illustrates a cross-sectional elevation view of a three-chip three-dimensional integrated circuit with an interstitial stacked-integrated-circuit interface shielding structure.

FIG. 12 illustrates a cross-sectional elevation view of a three-chip three-dimensional integrated circuit with an interstitial stacked-integrated-circuit interface shielding structure. Three-chip three-dimensional integrated circuit 1200 comprises integrated circuit chip 1060, integrated circuit chip 1280, and integrated circuit chip 1290. Note that integrated circuit chip 1060 has a different layout of conductive features than the embodiments in FIGS. 10 and 11. Integrated circuit chip 1060 may, for example, be an ASIC or the like. Integrated circuit chip 1280 may, for example, be a SoC IC or the like and/or correspond to integrated circuit chip 260 in earlier figures. Integrated circuit chip 1290 may, for example, be a SoC IC or the like and/or correspond to integrated circuit chip 270 in earlier figures.

Integrated circuit chip 1280 is mated to integrated circuit chip 1290 along bonding interface plane 210. After fabrication of integrated circuit chip 1280 and integrated circuit chip 1290, a bond surface, such as a M-M and D-D bond surface, of a bond layer, such as a M-M and D-D bond layer, in which electrically conductive pads, such as electrically conductive pad 132, and shield structures, such as shield structures 106, 116, are disposed in integrated circuit chip 1290 is mated to a bond surface, such as a M-M and D-D bond surface, of a bond layer, such as a M-M and D-D bond layer, in which electrically conductive pads, such as electrically conductive pad 232, and shield structures, such as shield structures 206, 216, are disposed in integrated circuit chip 1280.

For example, such mating aligns electrically conductive pad 132 with electrically conductive pad 232 and establishes contact between them to provide an ohmic connection. As another example, such mating aligns shield structure 106 with shield structure 206. The mating can provide contact between shield structure 106 and shield structure 206 to provide an ohmic connection. Alternatively, an ohmic connection need not be established. In the case of a low-k dielectric material, a gap between shield structure 106 and shield structure 206 would not be inconsistent with providing low-k dielectric material within the regions of shield structure 106, shield structure 206, and any gap therebetween. In the case of an electrically conductive material, a gap between shield structure 106 and shield structure 206 would allow capacitive coupling of the shield structures, and the resulting capacitive connection could have a low enough capacitive reactance to provide similarly effective shielding as compared to an ohmic connection.

Integrated circuit chip 1060 is mated to integrated circuit chip 1290 along bonding interface plane 1210. After fabrication of integrated circuit chip 1060 and integrated circuit chip 1290, a bond surface, such as a M-M and D-D bond surface, of a bond layer, such as a M-M and D-D bond layer, in which electrically conductive pads, such as electrically conductive pads 1207, 1217, 1227, and shield structures, such as shield structure 1225, are disposed in integrated circuit chip 1060 is mated to a bond surface, such as a M-M and D-D bond surface, of a bond layer, such as a M-M and D-D bond layer, in which electrically conductive pads, such as electrically conductive pads 1207, 1217, and shield structures, such as shield structures 1206, 1226, are disposed in integrated circuit chip 1290.

For example, such mating aligns shield structure 1225 with shield structure 1226. The mating can provide contact between shield structure 1225 and shield structure 1226 to provide an ohmic connection. Alternatively, an ohmic connection need not be established. Other elements shown in FIG. 12 but not described above will be described below with respect to integrated circuit chips mated to form the three-dimensional integrated circuit of FIG. 12.

Figure 13:
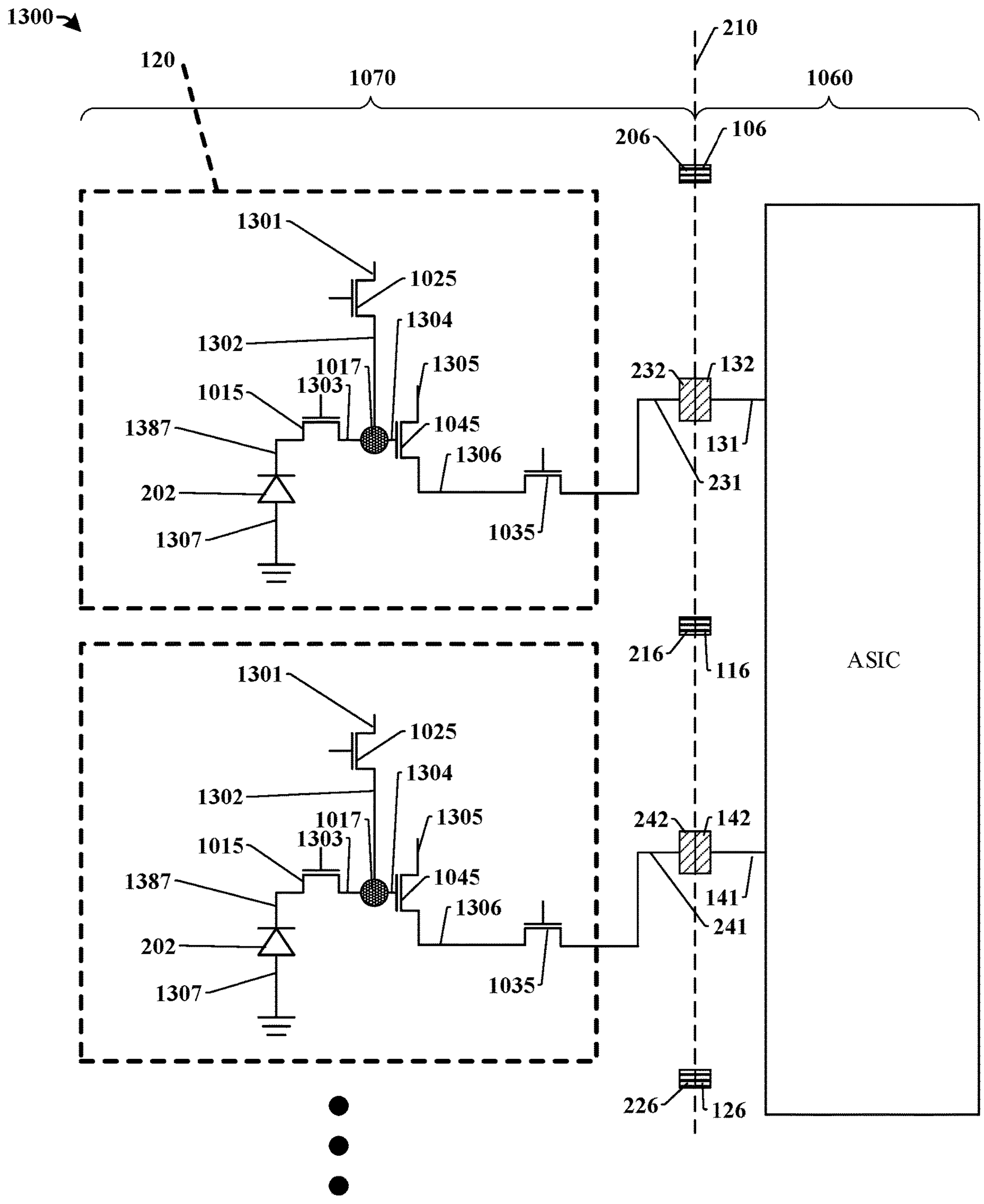
FIG. 13 illustrates a schematic diagram of a two-chip three-dimensional integrated circuit with an interstitial stacked-integrated-circuit interface shielding structure.

FIG. 13 illustrates a schematic diagram of a two-chip three-dimensional integrated circuit 1300 with an interstitial stacked-integrated-circuit interface shielding structure. Circuit portions of integrated circuit chip 1060 are connected to circuitry of integrated circuit chip 1070 via a bond layer interface, such as a M-M and D-D bond layer interface, mating electrically conductive pads, such electrically conductive pads 132, 142, of integrated circuit chip 1060 with electrically conductive pads, such as electrically conductive pads 232, 242, of integrated circuit chip 1070. Shield structures 106, 116, 126 are disposed proximate to and peripheral to electrically conductive pads 132, 142. Shield structures 206, 216, 226 are disposed proximate to and peripheral to electrically conductive pads 232, 242.

A circuit portion of integrated circuit chip 1060 is connected to electrically conductive contact 131, which is connected to electrically conductive pad 132, which mates to electrically conductive pad 232 of integrated circuit chip 1070 at bonding interface plane 210. Electrically conductive pad 232 is connected to electrically conductive contact 231. Shield structures 106 and 116 are disposed proximate to and peripheral to electrically conductive pad 132. Shield structures 206 and 216 are disposed proximate to and peripheral to electrically conductive pad 232.

Photonic signals corresponding to illumination of pixel 120 are received correspondingly at photodiodes 202. Anodes of photodiodes 202 are connected to ground 1307. Cathode of photodiodes 202 are connected correspondingly to terminals of transfer gate transistors 1015 via contacts 1387. Terminals of transfer gate transistor 1015 are connected correspondingly to floating diffusion regions 1017 via conductors 1303. Terminals of reset transistors 1025 are connected correspondingly to floating diffusion regions 1017 via conductors 1302. Reset voltages at nodes 1301 are connected correspondingly to terminals of reset transistors 1025. Floating diffusion regions 1017 are referenced to ground 1307. Floating diffusion regions 1017 are connected correspondingly to gate terminals of source follower transistors 1045 via conductors 1304. Voltages at nodes 1305 are connected correspondingly to terminals of source follower transistors 1045. Terminals of source follower transistors 1045 are connected correspondingly to conductors 1306, which are connected correspondingly to terminals of select transistors 1035. Terminals of select transistors 1035 are connected correspondingly to electrically conductive contacts 231, 241. Electrically conductive contacts 231, 241 are connected correspondingly to electrically conductive pad 232, 242.

Figure 14:
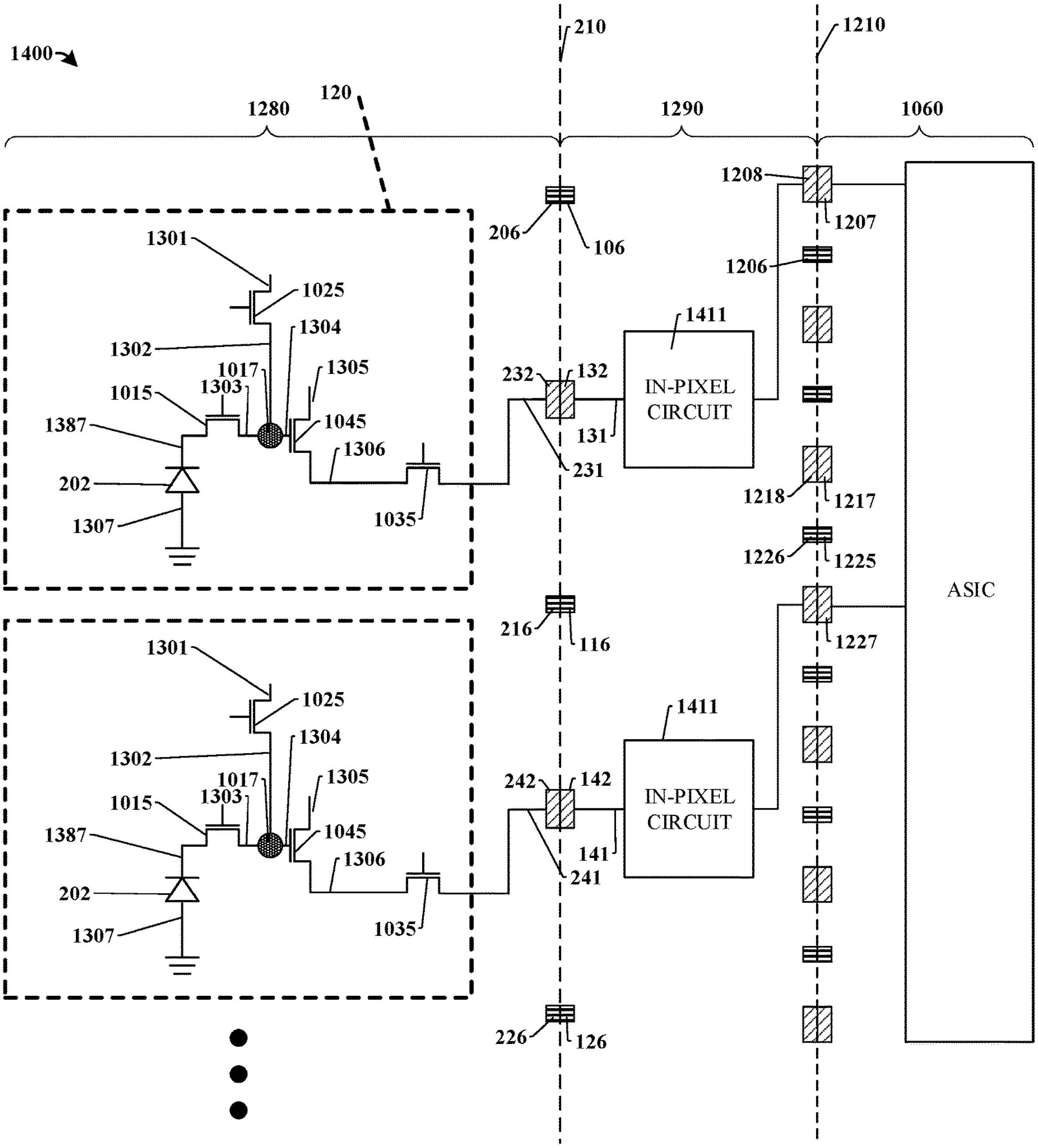
FIG. 14 illustrates a schematic diagram of a three-chip three-dimensional integrated circuit with an interstitial stacked-integrated-circuit interface shielding structure.

FIG. 14 illustrates a schematic diagram of a three-chip three-dimensional integrated circuit 1400 with an interstitial stacked-integrated-circuit interface shielding structure. Circuit portions of integrated circuit chip 1060 are connected to circuitry of integrated circuit chip 1290 via a bond layer interface, such as a M-M and D-D bond layer interface, mating electrically conductive pads, such as electrically conductive pads 1207, 1217, 1227, of integrated circuit chip 1060 with electrically conductive pads, such as electrically conductive pads 1208, 1218, of integrated circuit chip 1290. Shield structures 1225 are disposed proximate to and peripheral to electrically conductive pads 1207, 1217, 1227. Shield structures 1206, 1226 are disposed proximate to and peripheral to electrically conductive pad 1208, 1218.

Photonic signals corresponding to illumination of pixel 120 are received correspondingly at photodiodes 202. Anodes of photodiodes 202 are connected to ground 1307. Cathode of photodiodes 202 are connected correspondingly to terminals of transfer gate transistors 1015 via contacts 1387. Terminals of transfer gate transistor 1015 are connected correspondingly to floating diffusion regions 1017 via conductors 1303. Terminals of reset transistors 1025 are connected correspondingly to floating diffusion regions 1017 via conductors 1302. Reset voltages at nodes 1301 are connected correspondingly to terminals of reset transistors 1025. Floating diffusion regions 1017 are referenced to ground 1307. Floating diffusion regions 1017 are connected correspondingly to gate terminals of source follower transistors 1045 via conductors 1304. Voltages at nodes 1305 are connected correspondingly to terminals of source follower transistors 1045. Terminals of source follower transistors 1045 are connected correspondingly to conductors 1306, which are connected correspondingly to terminals of select transistors 1035. Terminals of select transistors 1035 are connected correspondingly to electrically conductive contacts 231, 241. Electrically conductive contacts 231, 241 are connected correspondingly to electrically conductive pad 232, 242.

Electrically conductive pads 232, 242 of integrated circuit chip 1280 mate respectively to electrically conductive pads 132, 142 of integrated circuit chip 1290 at bonding interface plane 210. Electrically conductive pad 132 is connected to electrically conductive contact 131. Electrically conductive contact 131 is connected to in-pixel circuit 1411 of integrated circuit chip 1290. In-pixel circuit 1411 is connected to integrated circuit chip 1060. Shield structures 106, 116 are disposed proximate to and peripheral to electrically conductive pad 132. Shield structures 206, 216 are disposed proximate to and peripheral to electrically conductive pad 232. Shield structure 206 mates with shield structure 106. Shield structure 216 mates with shield structure 116.

Figure 15:
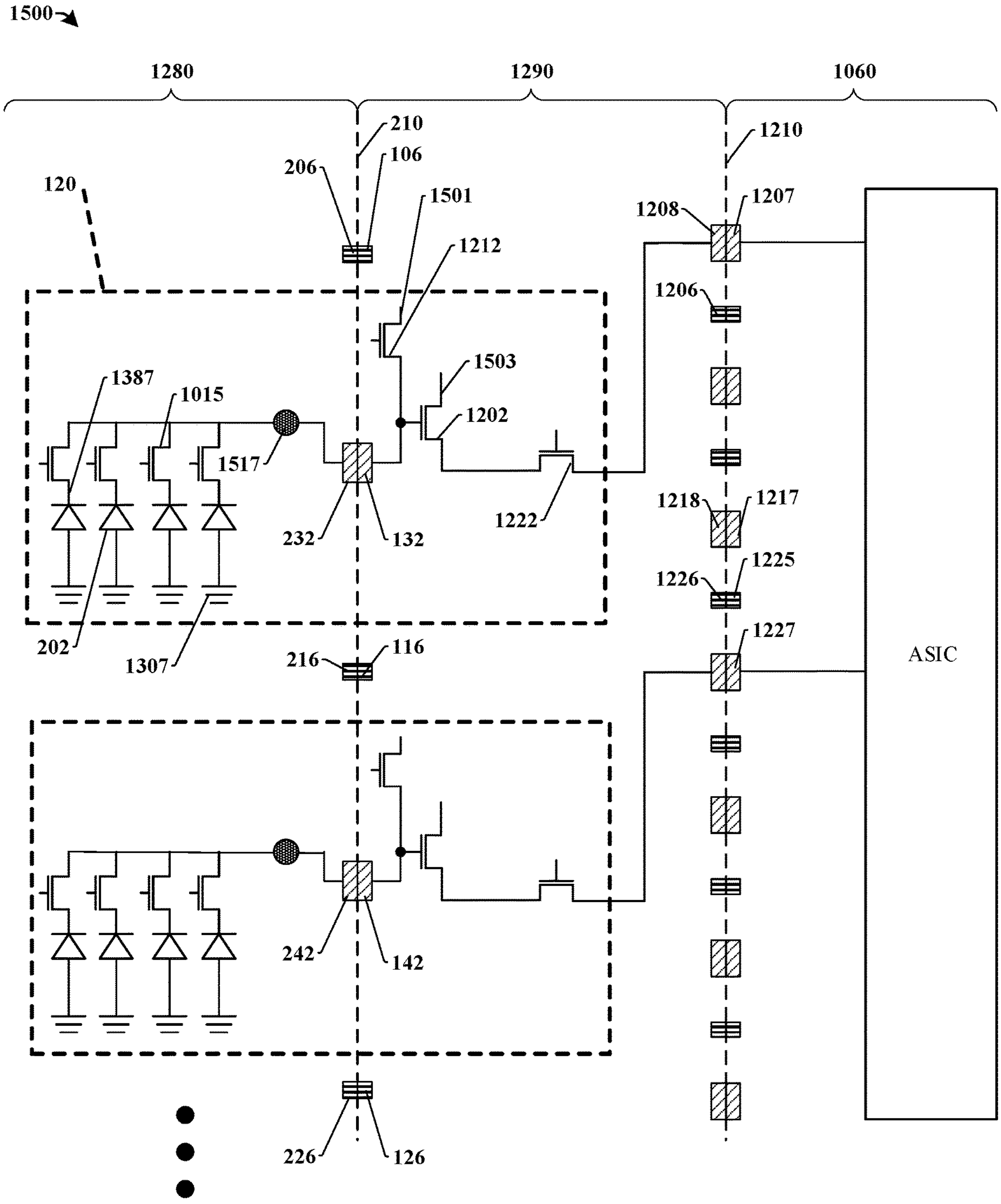
FIG. 15 illustrates a schematic diagram of a three-chip three-dimensional integrated circuit with an interstitial stacked-integrated-circuit interface shielding structure.

FIG. 15 illustrates a schematic diagram of a three-chip three-dimensional integrated circuit 1500 with an interstitial stacked-integrated-circuit interface shielding structure. Circuit portions of integrated circuit chip 1060 are connected to circuitry of integrated circuit chip 1290 via a bond layer interface, such as a M-M and D-D bond layer interface, mating electrically conductive pads, such as electrically conductive pads 1207, 1217, 1227, of integrated circuit chip 1060 with electrically conductive pads, such as electrically conductive pads 1208, 1218, of integrated circuit chip 1290. Shield structures, such as shield structure 1225, are disposed proximate to and peripheral to electrically conductive pad 1217. Shield structures, such as shield structure 1226, are disposed proximate to and peripheral to electrically conductive pad 1218.

Photonic signals corresponding to illumination of pixel 120 are received correspondingly at photodiodes 202. Anodes of photodiodes 202 are connected to ground 1307. Cathode of photodiodes 202 are connected correspondingly to terminals of transfer gate transistors 1015 via contacts 1387. Terminals of transfer gate transistor 1015 are connected correspondingly to electrically conductive pads 132, 142. Electrically conductive pads 232, 242 of integrated circuit chip 1280 mate with electrically conductive pad 132, 142 of integrated circuit chip 1290. Electrically conductive pads 232, 242 are correspondingly coupled to floating diffusion regions 1517. Floating diffusion region 1517 are correspondingly connected to terminals of reset transistor 1212. Terminals of reset transistors 1212 are correspondingly connected to reset voltage correspondingly 1501. Floating diffusion regions 1517 are correspondingly connected to gate terminals of source follower transistor correspondingly 1202. Floating diffusion regions 1517 are referenced to ground 1307. Voltages at nodes 1503 are correspondingly connected to terminals of source follower transistors 1202. Terminals of source follower transistors 1202 are correspondingly connected to terminals of select transistors 1222. Terminals of select transistors 1222 are correspondingly connected to electrically conductive pads, such as electrically conductive pad 1208.

Shield structures 206, 216, 226 are disposed proximate to and peripheral to electrically conductive pads 232, 242. Shield structures 106, 116, 126 are disposed proximate to and peripheral to electrically conductive pad 132, 142. Shield structures 206, 216, 226 mate respectively with shield structures 106, 116, 126.

Figure 16:
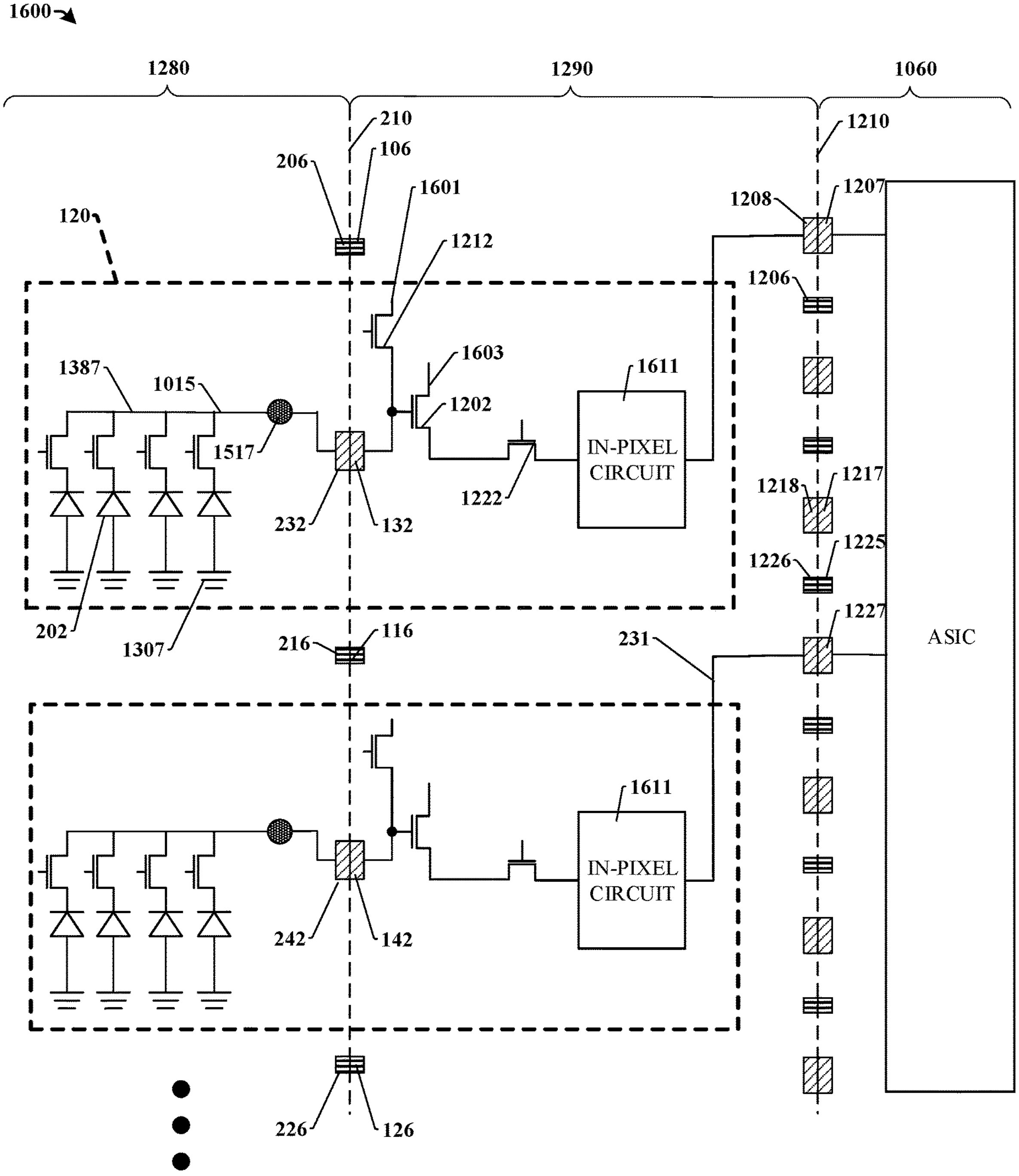
FIG. 16 illustrates a schematic diagram of a three-chip three-dimensional integrated circuit with an interstitial stacked-integrated-circuit interface shielding structure.

FIG. 16 illustrates a schematic diagram of a three-chip three-dimensional integrated circuit 1600 with an interstitial stacked-integrated-circuit interface shielding structure. Circuit portions of integrated circuit chip 1060 are connected to circuitry of integrated circuit chip 1290 via a bond layer interface, such as a M-M and D-D bond layer interface, mating electrically conductive pads, such as electrically conductive pads 1207, 1217, 1227, of integrated circuit chip 1060 with electrically conductive pads, such as electrically conductive pads 1208, 1218, of integrated circuit chip 1290. Shield structures, such as shield structure 1225, are disposed proximate to and peripheral to electrically conductive pad 1217. Shield structures, such as shield structure 1226, are disposed proximate to and peripheral to electrically conductive pad 1218.

Photonic signals corresponding to illumination of pixel 120 are received correspondingly at photodiodes 202. Anodes of photodiodes 202 are connected to ground 1307. Cathode of photodiodes 202 are connected correspondingly to terminals of transfer gate transistors 1015 via contacts 1387. Terminals of transfer gate transistor 1015 are connected correspondingly to electrically conductive pads 132, 142. Electrically conductive pads 232, 242 of integrated circuit chip 1280 mate with electrically conductive pad 132, 142 of integrated circuit chip 1290. Electrically conductive pads 232, 242 are correspondingly coupled to floating diffusion regions 1517. Floating diffusion region 1517 are correspondingly connected to terminals of reset transistor 1212. Terminals of reset transistors 1212 are correspondingly connected to reset voltage correspondingly 1601. Floating diffusion regions 1517 are correspondingly connected to gate terminals of source follower transistor correspondingly 1202. Floating diffusion regions 1517 are referenced to ground 1307. Voltages at nodes 1603 are correspondingly connected to terminals of source follower transistors 1202. Terminals of source follower transistors 1202 are correspondingly connected to terminals of select transistors 1222. Terminals of select transistors 1222 are correspondingly connected to in-pixel circuits 1611. In-pixel circuits 1611 are correspondingly connected to electrically conductive pads, such as electrically conductive pad 1218.

Figure 17:
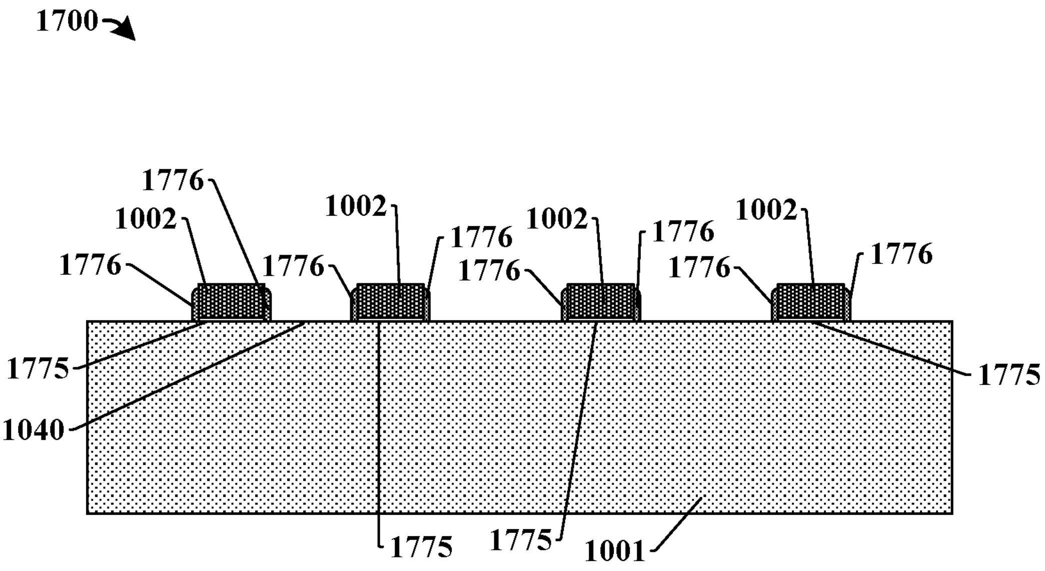
FIGS. 17 through 20 illustrate a series of incremental manufacturing steps as a series of cross-sectional views for a first wafer.
Figure 18:
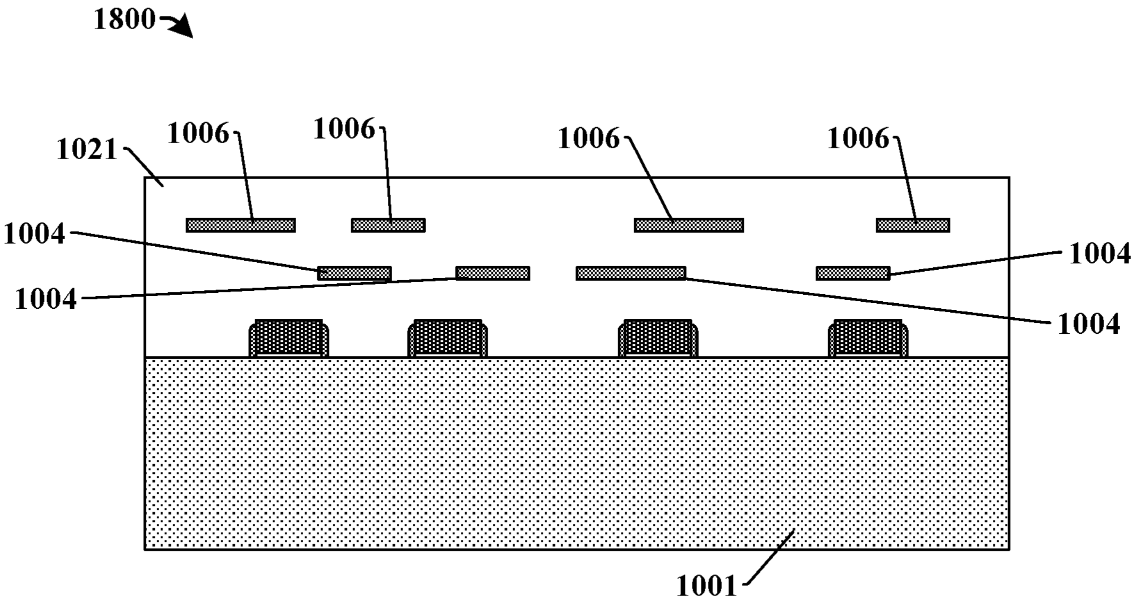
Figure 19:
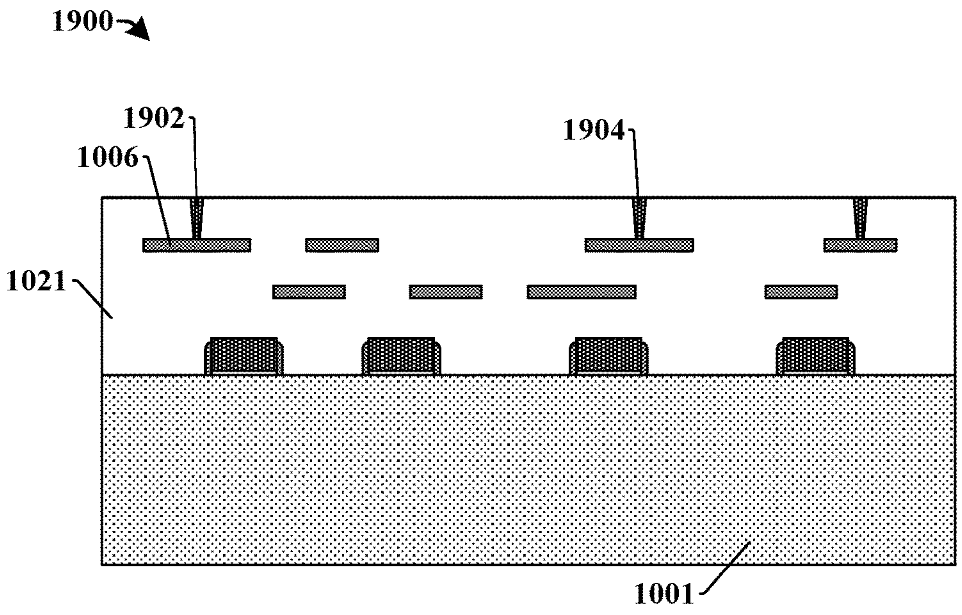
Figure 20:
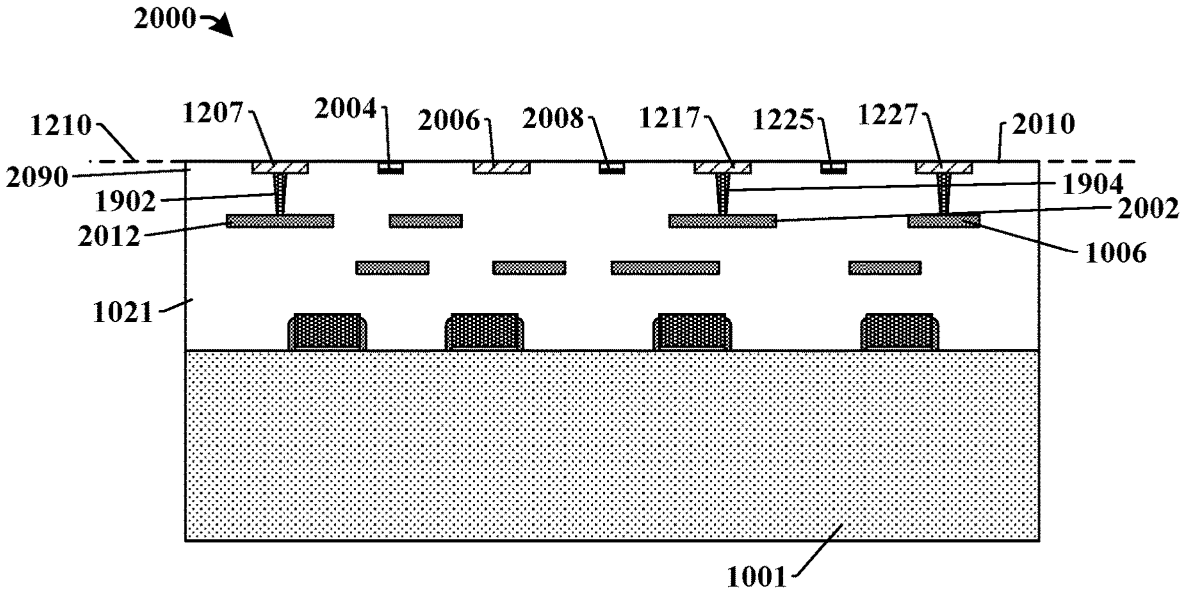

FIGS. 17 through 20 illustrate a series of incremental manufacturing steps as a series of cross-sectional views for a first wafer. In FIG. 17, which shows partially fabricated integrated circuit 1700, transistors 1002 comprising gate oxide 1775 and sidewall spacers 1776 are formed on a surface 1040 of substrate 1001. In FIG. 18, which shows partially fabricated integrated circuit 1800, electrically conductive features 1004 are formed in a first electrically conductive layer, electrically conductive features 1006 are formed in a second electrically conductive layer. Electrically conductive features 1004 and 1006 are within dielectric region 1021. In FIG. 19, which shows partially fabricated integrated circuit 1900, electrically conductive contacts, such as electrically conductive contacts 1902 and 1904, are formed from a surface of dielectric region 1021 to respective electrically conductive features of electrically conductive features 1006. In FIG. 20, electrically conductive pads 1207, 2006, 1217, 1227 are formed in layer 2090, such as a M-M and D-D bond layer, at a surface, such as plane 2010, of integrated circuit 2000.

Electrically conductive pad 1207 is ohmically connected to electrically conductive contact 1902. Electrically conductive contact 1902 is ohmically connected to electrically conductive feature 2012 of electrically conductive features 1006. Electrically conductive pad 1217 is ohmically connected to electrically conductive contact 1904. Electrically conductive contact 1904 is ohmically connected to electrically conductive feature 2002 of electrically conductive features 1006. Shield structures 2004, 2008, 1225 are formed in layer 2090. Planarization can be performed to bring the surfaces of electrically conductive pads 1207, 2006, 1217, 1227 and shield structures 2004, 2008, 1225, along with the surface of dielectric region 1021, to a planar surface, along bonding interface plane 2010. Such a planar surface is ready to be mated to another planar surface with corresponding electrically conductive pads and shield structures.

In some embodiments, a process for forming electrically conductive pads 1207, 2006, 1217, 1227 and shield structures 2004, 2008, 1225 comprises: 1) patterning dielectric region 1021 to concurrently form openings corresponding to electrically conductive pads 1207, 2006, 1217, 1227 and shield structures 2004, 2008, 1225; 2) depositing a conductive layer to fill the openings; and 3) performing a planarization into the conductive layer. In other embodiments, the process comprises: 1) patterning dielectric region 1021 to form first openings corresponding to electrically conductive pads 1207, 2006, 1217, 1227; 2) depositing a first conductive layer to fill the first openings; 3) performing a first planarization into the first conductive layer; 4) after the first planarization, patterning dielectric region 1021 to form second openings corresponding to shield structures 2004, 2008, 1225; 5) depositing a second conductive layer or a low-k dielectric layer to fill the second openings; and 6) performing a second planarization into the second conductive layer or a low-k dielectric layer.

Figure 21:
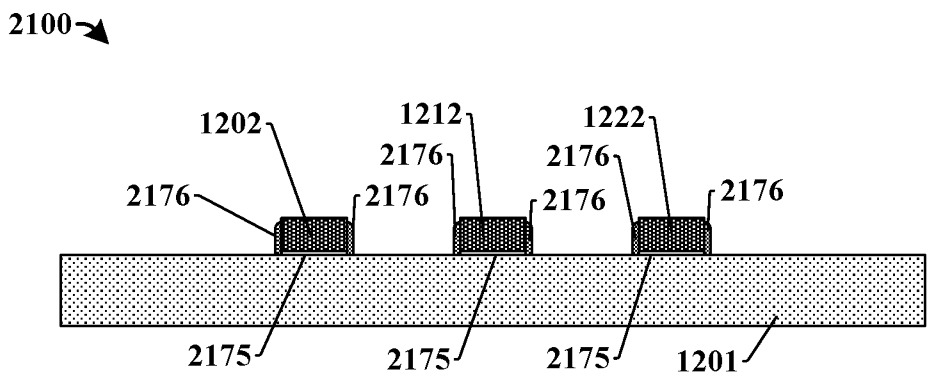
FIGS. 21 through 29 illustrate a series of incremental manufacturing steps as a series of cross-sectional views for an intermediate wafer with a through-substrate via (TSV).
Figure 22:
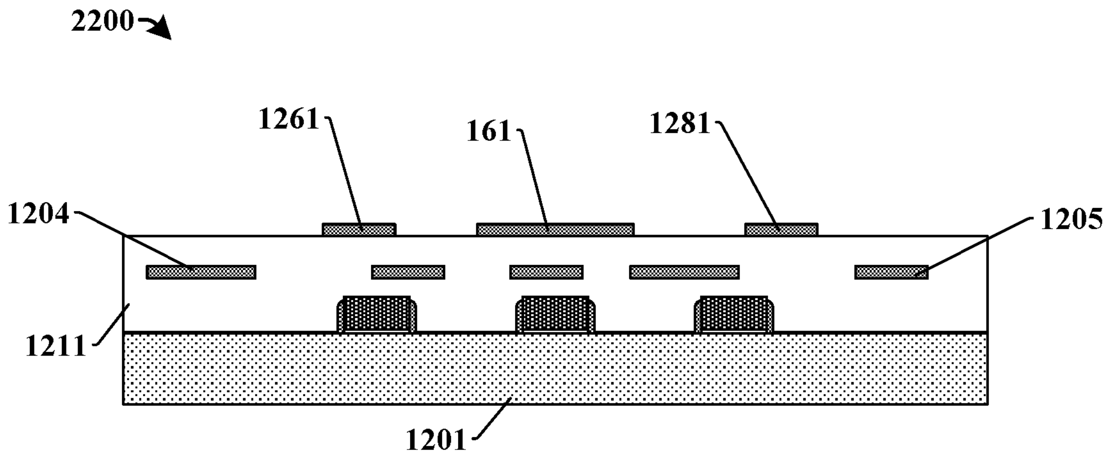
Figure 23:
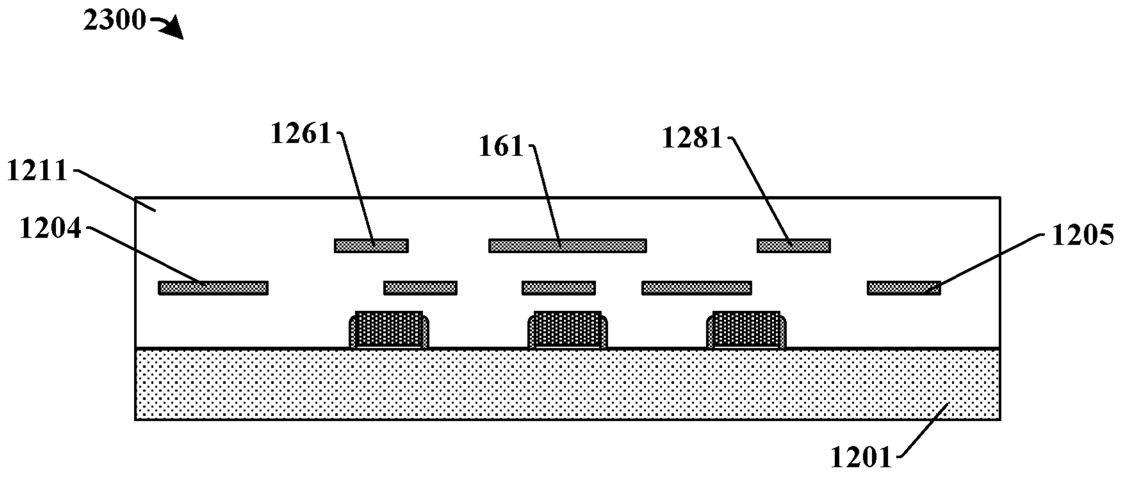
Figure 24:
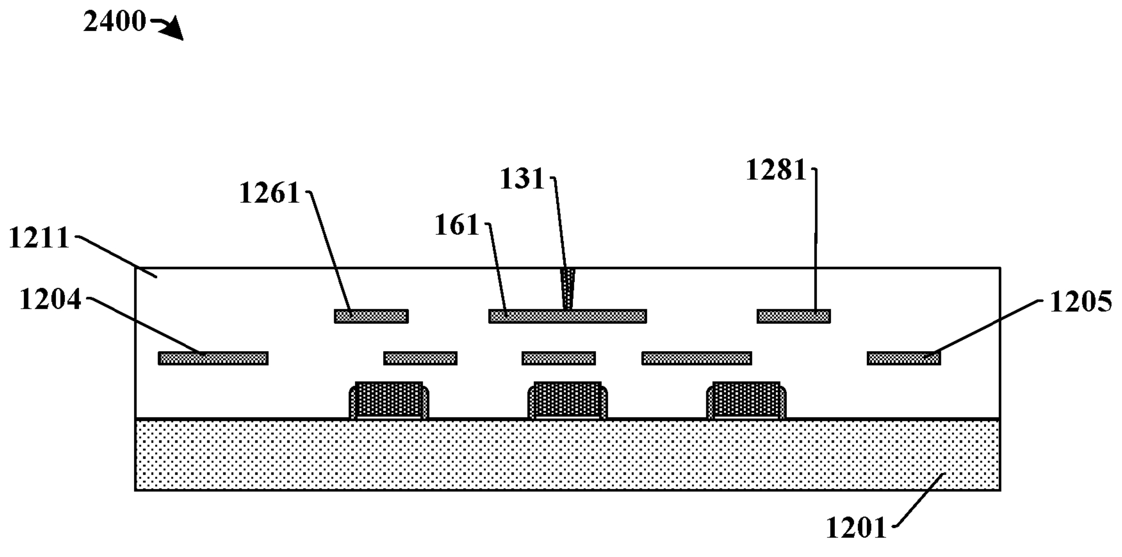

FIGS. 21 through 29 illustrate a series of incremental manufacturing steps as a series of cross-sectional views for an intermediate wafer with a through-substrate via (TSV). In FIG. 21, which shows partially fabricated integrated circuit 2100, source follower transistor 1202, reset transistor 1212, and select transistor 1222 are formed on substrate 1201. Source follower transistor 1202, reset transistor 1212, and select transistor 1222 comprise gate oxide 2175 and sidewall spacer spacers 2176. In FIG. 22, which shows partially fabricated integrated circuit 2200, electrically conductive features 1204, 1205 (e.g., metallic features or the like) in an electrically conductive layer (e.g., a metal layer or the like) are formed on a portion of dielectric region 1211, with a portion of dielectric region 1211 formed over electrically conductive features 1204, 1205. Electrically conductive features 1261, 161, and 1281 are formed over dielectric region 1211. In FIG. 23, which shows partially fabricated integrated circuit 2300, an additional portion of dielectric region 1211 is formed over electrically conductive features 1261, 161, and 1281. In FIG. 24, which shows partially fabricated integrated circuit 2400, electrically conductive contacts are formed from a surface of dielectric region 1211 to electrically conductive features 1261, 161, and 1281. For example, electrically conductive contact 131 is formed on electrically conductive feature 161.

Figure 25:
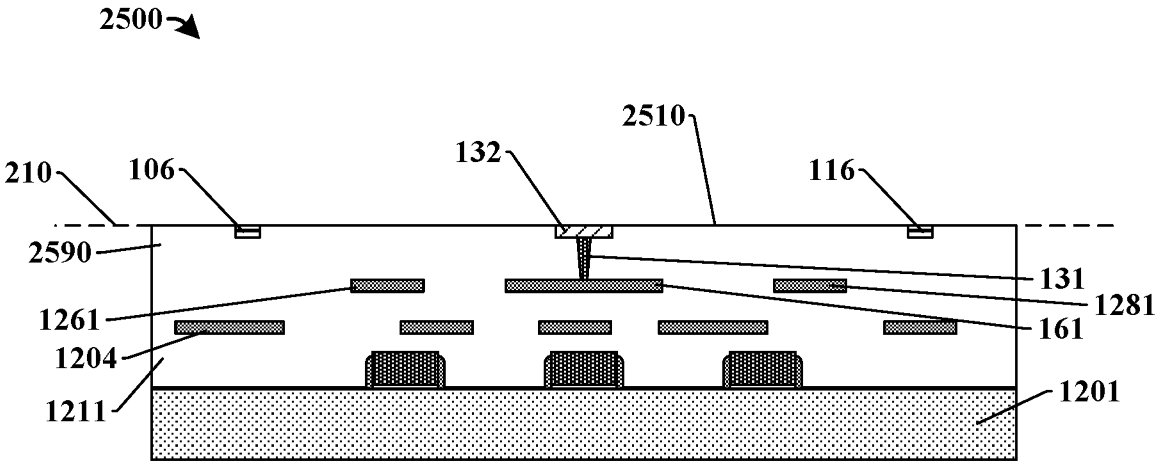

In FIG. 25, electrically conductive pads, such as an electrically conductive pad 132, are formed in layer 2590, such as a M-M and D-D bond layer, at a surface, such as bonding interface plane 210, of integrated circuit 2500. In some embodiments, integrated circuit 2500 has a top layout as illustrated in any one or combination of FIGS. 1 and 3-9. Electrically conductive pad 132 is ohmically connected to electrically conductive contact 131. Electrically conductive contact 131 is ohmically connected to electrically conductive feature 161. Shield structures 106, 116 are formed in layer 2590. Planarization can be performed to bring the surfaces of electrically conductive pads, such as electrically conductive pad 132, and shield structures 106, 116, along with the surface of dielectric region 1211, to a planar surface 2510, along bonding interface plane 210. Such a planar surface 2510 is ready to be mated to another planar surface with corresponding electrically conductive pads and shield structures.

In some embodiments, a process for forming electrically conductive pad 132 and shield structures 106, 116 comprises: 1) patterning dielectric region 1211 to concurrently form openings corresponding to electrically conductive pad 132 and shield structures 106, 116; 2) depositing a conductive layer to fill the openings; and 3) performing a planarization into the conductive layer. In other embodiments, the process comprises: 1) patterning dielectric region 1211 to form first openings corresponding to electrically conductive pad 132; 2) depositing a first conductive layer to fill the first openings; 3) performing a first planarization into the first conductive layer; 4) after the first planarization, patterning dielectric region 1211 to form second openings corresponding to shield structures 106, 116; 5) depositing a second conductive layer or a low-k dielectric layer to fill the second openings; and 6) performing a second planarization into the second conductive layer or a low-k dielectric layer.

Figure 26:
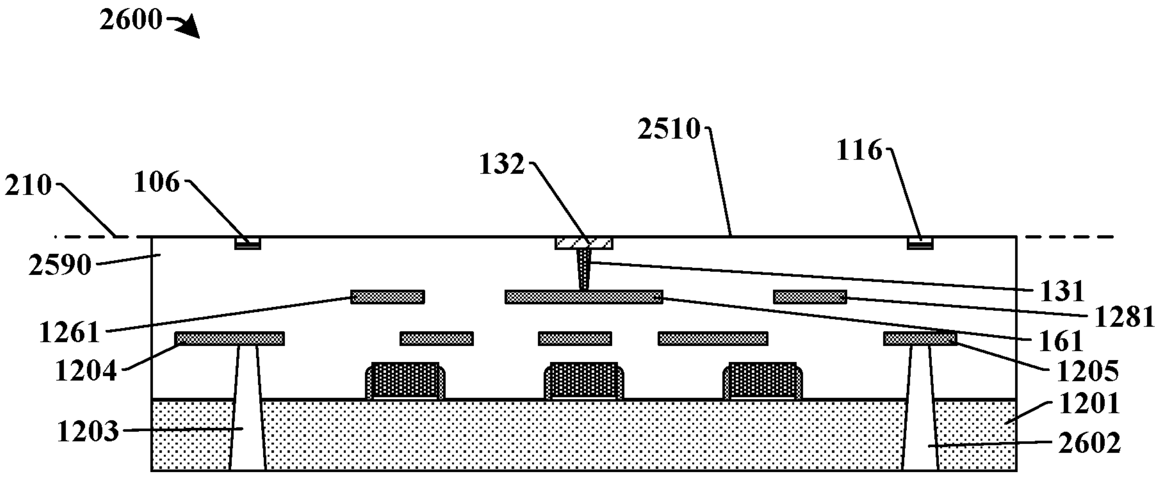
Figure 27:
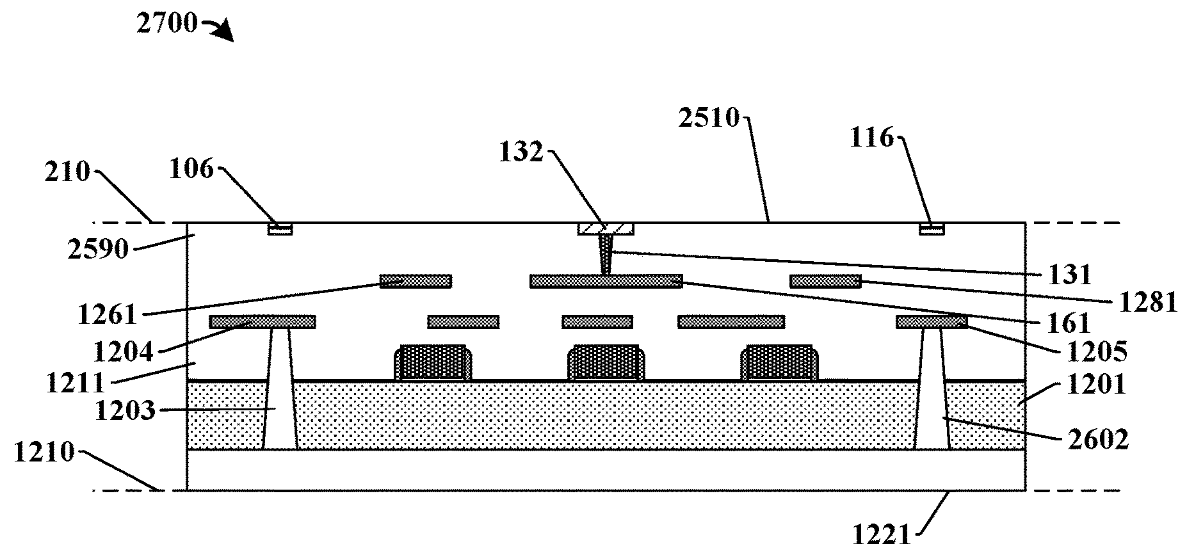
Figure 28:
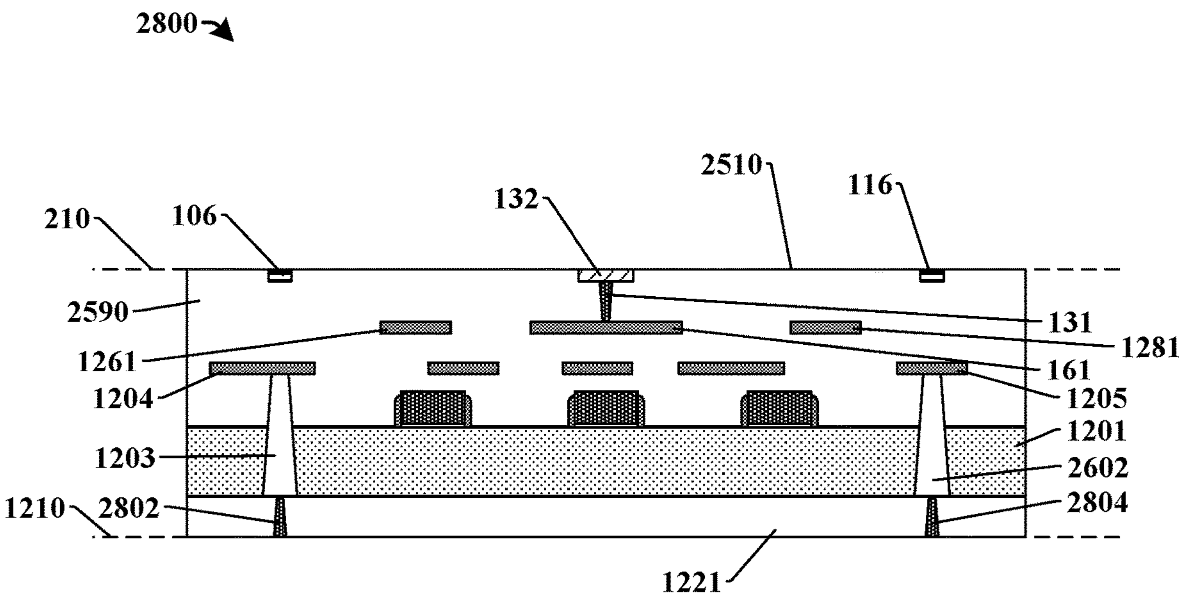
Figure 29:
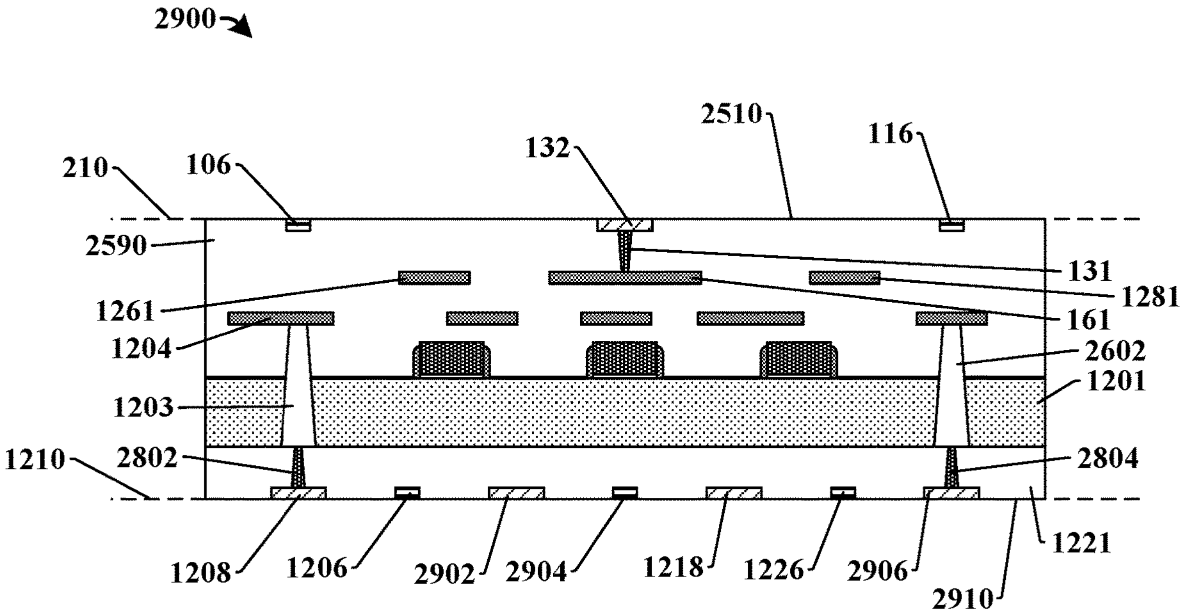

In FIG. 26, which shows partially fabricated integrated circuit 2600, through-substrate vias (TSV) 1203, 2602 are formed through substrate 1201 and a portion of dielectric region 1211 to provide ohmic contact with electrically conductive features 1204, 1205. In FIG. 27, which shows partially fabricated integrated circuit 2700, a dielectric region 1221 is formed on the backside of substrate 1201. In FIG. 28, which shows partially fabricated integrated circuit 2800, electrically conductive contact 2802, 2804 are formed through dielectric region 1221 to provide ohmic contact with TSVs 1203, 2602. In FIG. 29, which shows middle integrated circuit structure 2900, electrically conductive pads 1208, 2902, 1218, 2906 and shield structures 1206, 2904, 1226 are formed in a layer (e.g., a M-M and D-D bond layer) at the surface of dielectric region 1221. Planarization can be performed to bring the surfaces of electrically conductive pads 1208, 2902, 1218, 2906 and shield structures 1206, 2904, 1226, along with the surface of dielectric region 1221, to a planar surface 2910, along bonding interface plane 210. Such a planar surface 2910 is ready to be mated to another planar surface with corresponding electrically conductive pads and shield structures.

In some embodiments, a process for forming electrically conductive pads 1208, 2902, 1218, 2906 and shield structures 1206, 2904, 1226 comprises: 1) patterning dielectric region 1221 to concurrently form openings corresponding to electrically conductive pads 1208, 2902, 1218, 2906 and shield structures 1206, 2904, 1226; 2) depositing a conductive layer to fill the openings; and 3) performing a planarization into the conductive layer. In other embodiments, the process comprises: 1) patterning dielectric region 1221 to form first openings corresponding to electrically conductive pads 1208, 2902, 1218, 2906; 2) depositing a first conductive layer to fill the first openings; 3) performing a first planarization into the first conductive layer; 4) after the first planarization, patterning dielectric region 1221 to form second openings corresponding to shield structures 1206, 2904, 1226; 5) depositing a second conductive layer or a low-k dielectric layer to fill the second openings; and 6) performing a second planarization into the second conductive layer or a low-k dielectric layer.

Figure 30:
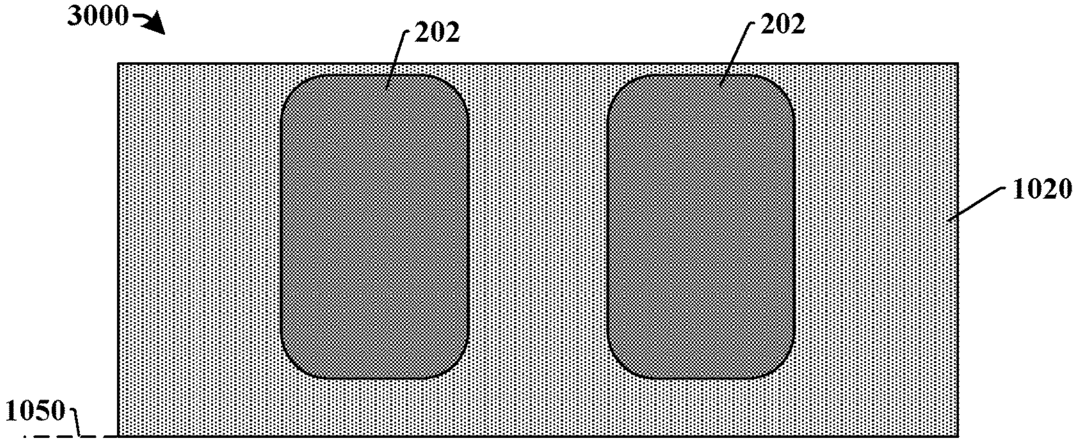
FIGS. 30 through 36 illustrate a series of incremental manufacturing steps as a series of cross-sectional views for a second wafer.
Figure 31:
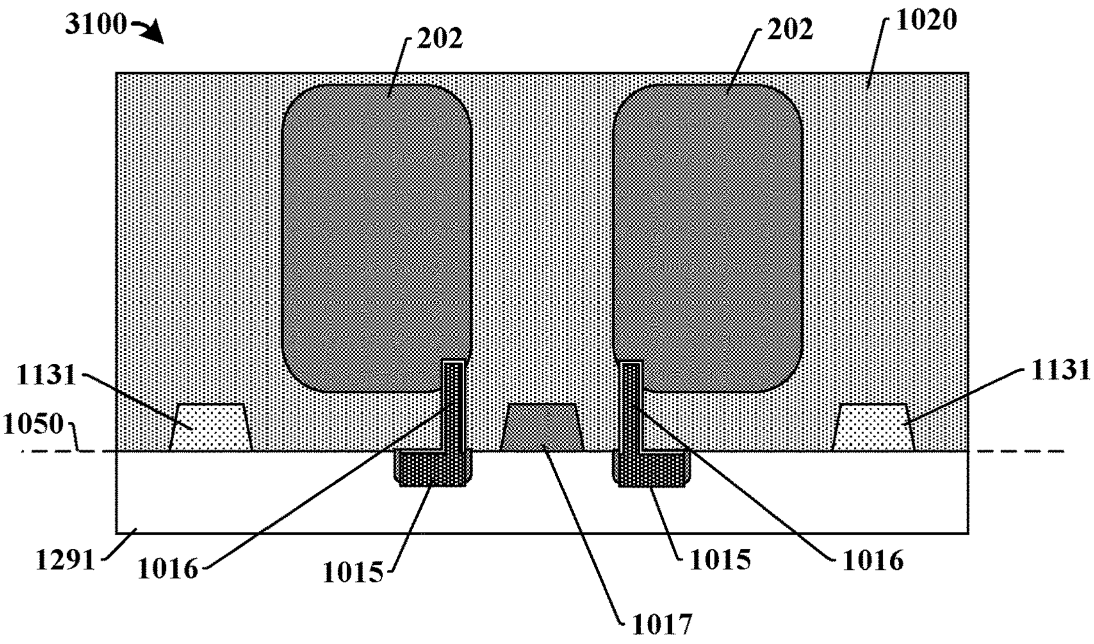
Figure 32:
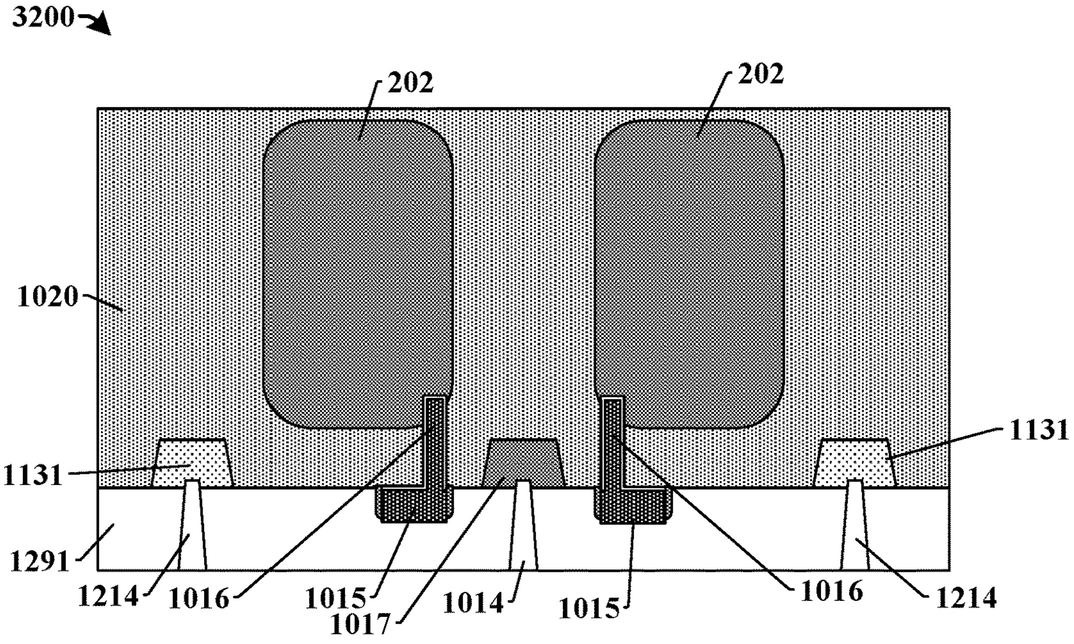
Figure 33:
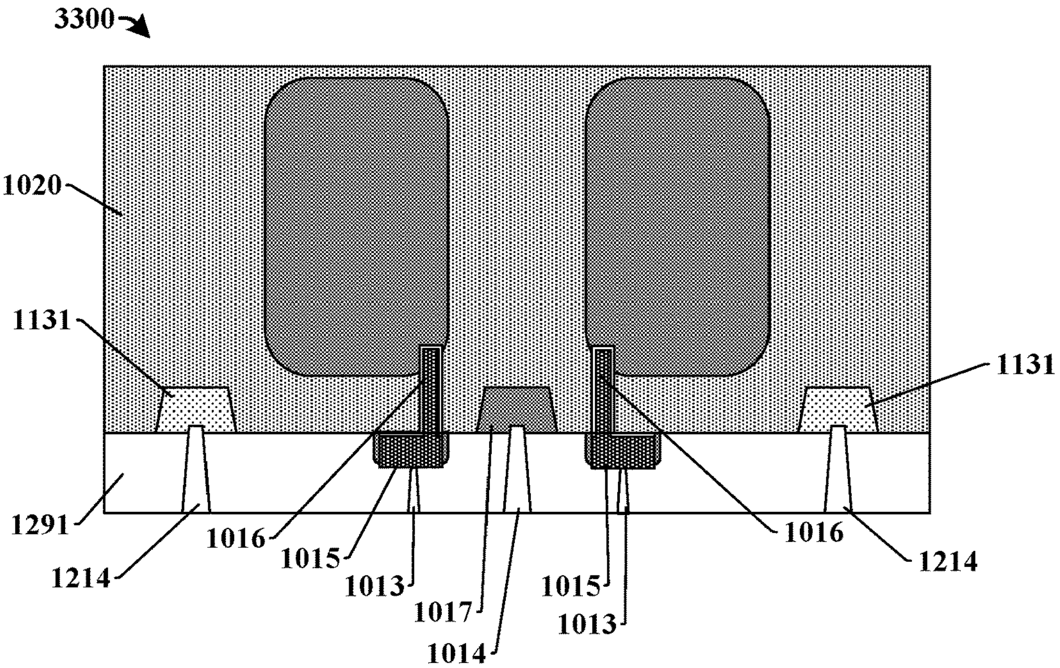

FIGS. 30 through 36 illustrate a series of incremental manufacturing steps as a series of cross-sectional views for a second wafer. In FIG. 30, which shows partially fabricated integrated circuit 3000, photodiodes 202 are formed in substrate 1020. In FIG. 31, which shows partially fabricated integrated circuit 3100, p-well regions 1131, and floating diffusion region 1017 are formed in substrate 1020. Further, transfer gate transistors 1015 are formed on a surface of substrate 1020 at plane 1050 over photodiodes 202. Transfer gate transistors 1015 have gate electrodes with vertical extensions 1016 extending into substrate 1020. Dielectric region 1291 is formed over transfer gate transistors 1015. In FIG. 32, which shows partially fabricated integrated circuit 3200, electrically conductive contacts 1214 are formed from a surface of dielectric region 1291 to p-well regions 1131. Electrically conductive contact 1014 is formed from the surface of dielectric region 1291 to floating diffusion region 1017. In FIG. 33, which shows partially fabricated integrated circuit 3300, electrically conductive contacts 1013 are formed from the surface of dielectric region 1291 to transfer gate transistors 1015.

Figure 34:
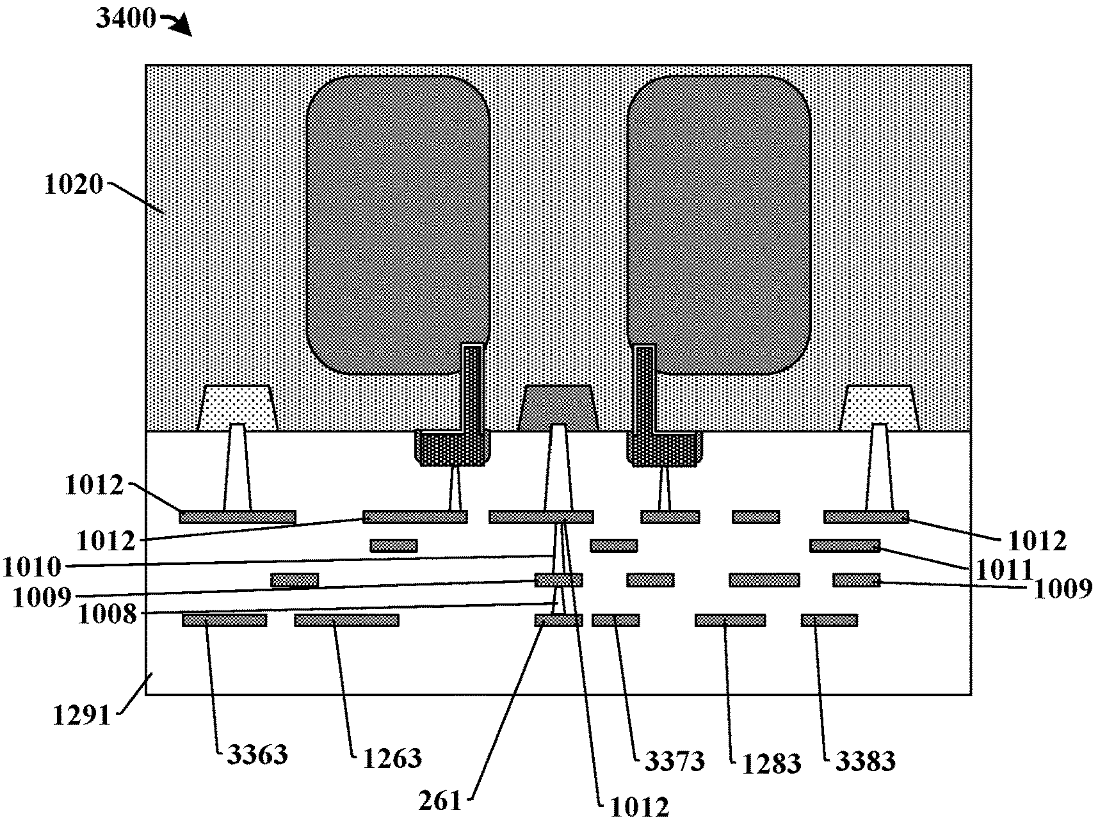

In FIG. 34, which shows partially fabricated integrated circuit 3400, electrically conductive features are formed, and dielectric region 1291 is built up. Electrically conductive features 1012 are formed in a first electrically conductive layer, providing ohmic contact with electrically conductive contacts 1214, 1014, and 1013. Separated by a layer of dielectric region 1291 from the first electrically conductive layer is a second electrically conductive layer in which electrically conductive features 1011 are formed. Separated by a layer of dielectric region 1291 from the second electrically conductive layer is a third electrically conductive layer in which electrically conductive features 1009 are formed. Electrically conductive contacts, such as electrically conductive contact 1010, which connects one of electrically conductive features 1009 to one of electrically conductive features 1012, can be formed in dielectric region 1291 to provide ohmic contact between electrically conductive features in different electrically conductive layers. Separated by a layer of dielectric region 1291 from the third electrically conductive layer is a fourth electrically conductive layer in which electrically conductive features 3363, 1263, 261, 3373, 1283, and 3383 are formed. Electrically conductive contact 1008 is formed to provide ohmic contact to one of electrically conductive features 1009, and electrically conductive feature 261 is formed over electrically conductive contact 1008 to provide ohmic contact between electrically conductive feature 261 and electrically conductive contact 1008.

Figure 35:
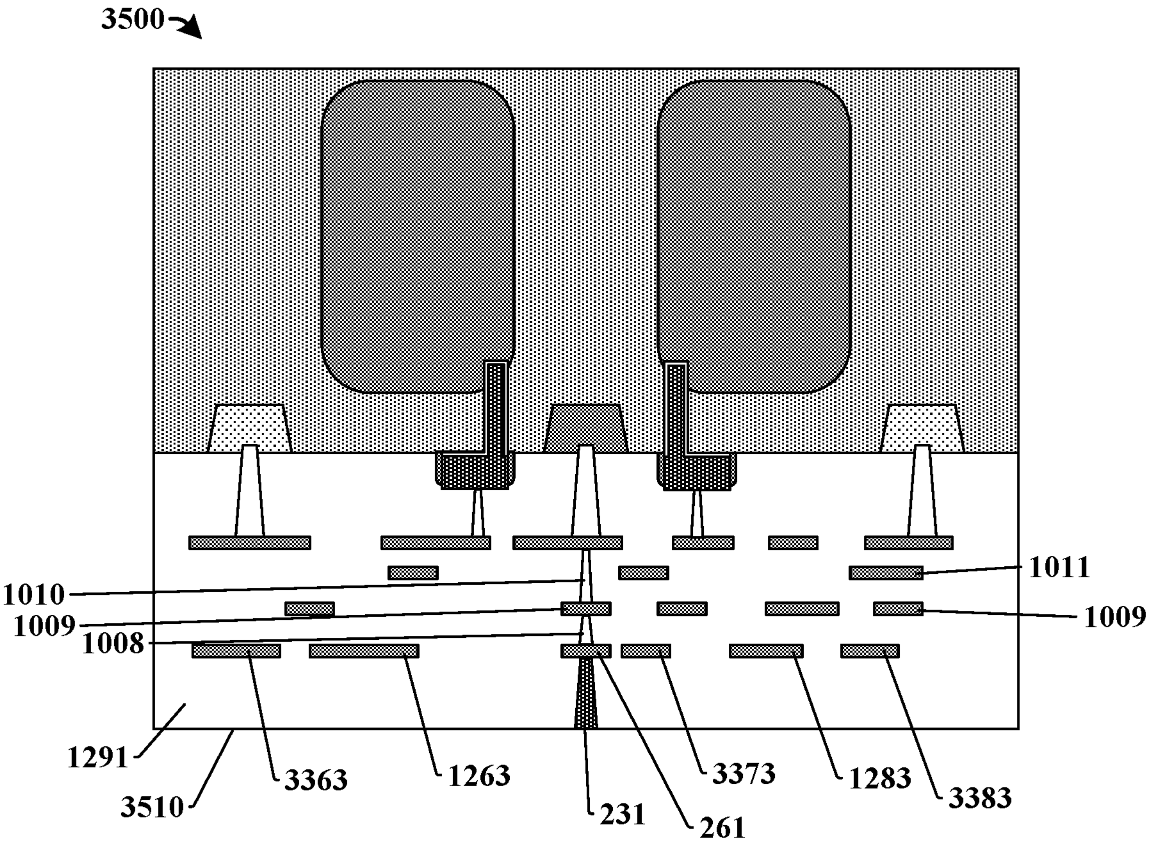
Figure 36:
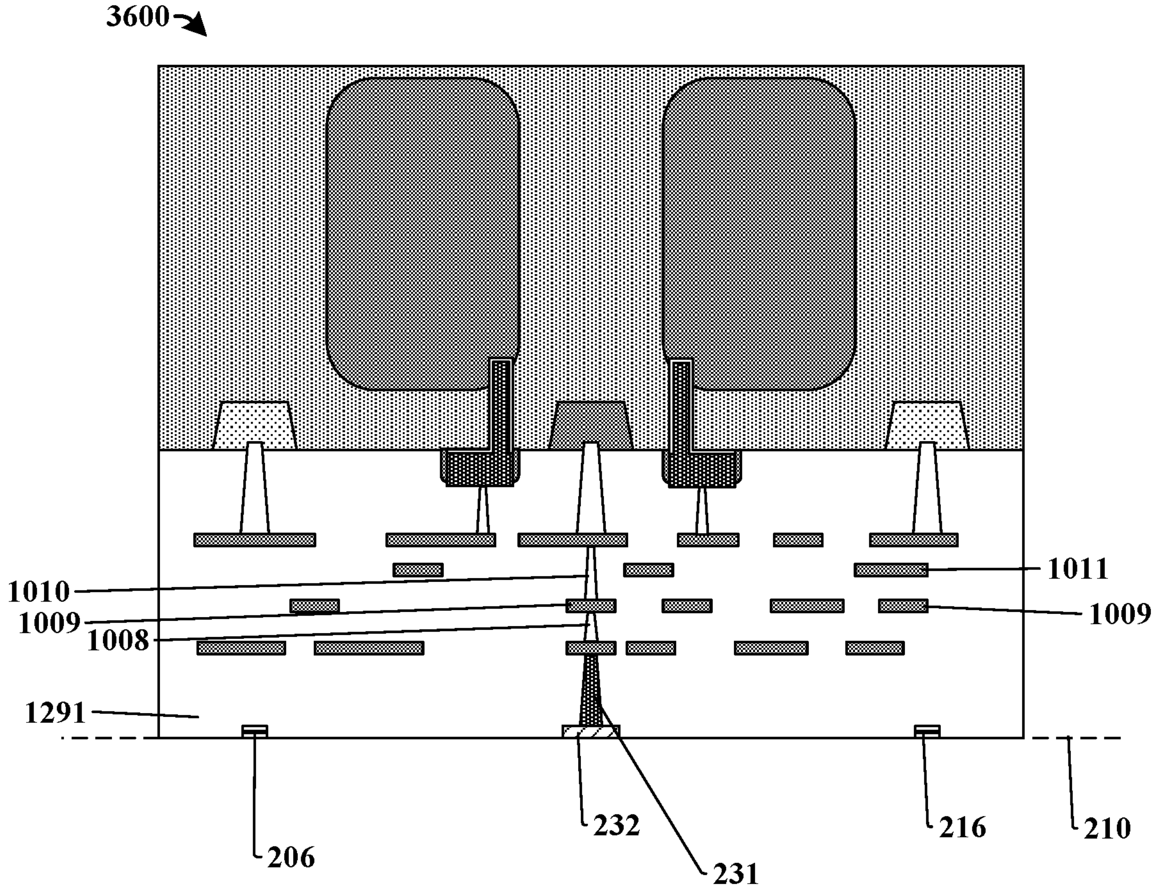

In FIG. 35, which shows partially fabricated integrated circuit 3500, electrically conductive contacts, such as electrically conductive contact 231, are formed. electrically conductive contact 231 extends from a surface of dielectric region 1291 to electrically conductive feature 261. In FIG. 36, which shows integrated circuit structure 3600, electrically conductive pads, such as electrically conductive pad 232, and shield structures 206, 216 are formed in a layer along a surface 3510 in bonding interface plane 210. In some embodiments, integrated circuit structure 3600 has a layout of electrically conductive pads and shield structures as illustrated in any one or combination of FIGS. 1 and 3-9. Electrically conductive pad 232 provides ohmic contact to electrically conductive contact 231. Planarization can be performed to bring the surfaces of electrically conductive pad 232 and shield structures 206, 216, along with the surface of dielectric region 1291, to a planar surface, along bonding interface plane 210. Such a planar surface is ready to be mated to another planar surface with corresponding electrically conductive pads and shield structures.

In some embodiments, a process for forming electrically conductive pad 232 and shield structures 206, 216 comprises: 1) patterning dielectric region 1291 to concurrently form openings corresponding to electrically conductive pad 232 and shield structures 206, 216; 2) filling the openings with a conductive layer; and 3) performing a planarization into the conductive layer. In other embodiments, the process comprises: 1) patterning dielectric region 1291 to form first openings corresponding to electrically conductive pad 232; 2) depositing a first conductive layer to fill the first openings; 3) performing a first planarization into the first conductive layer; 4) after the first planarization, patterning dielectric region 1291 to form second openings corresponding to shield structures 206, 216; 5) depositing a second conductive layer or a low-k dielectric layer to fill the second openings; and 6) performing a second planarization into the second conductive layer or a low-k dielectric layer.

Figure 37:
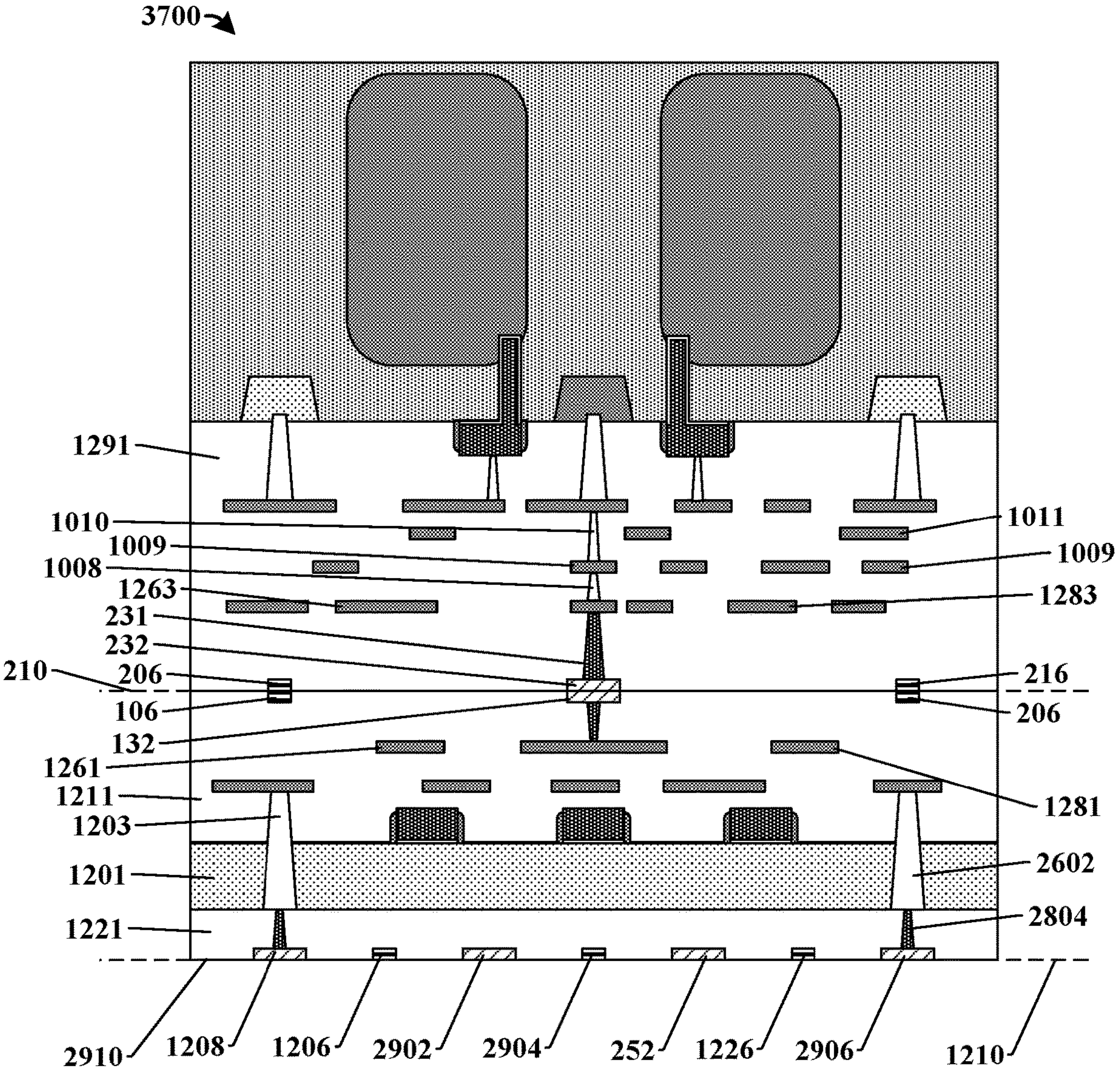
FIG. 37 illustrates a cross-sectional elevation view of the stacking of the second wafer of FIG. 36 and the intermediate wafer of FIG. 29.

FIG. 37 illustrates a cross-sectional elevation view of the stacking of the second wafer of FIG. 36 and the intermediate wafer of FIG. 29 to form a three-dimensional integrated circuit 3700. Mating of the wafers or portions of the wafers (e.g., dies) puts electrically conductive pad 232 in ohmic contact with electrically conductive pad 132. Shield structure 206 is mated with shield structure 106. Shield structure 216 is mated with shield structure 116.

Figure 38:
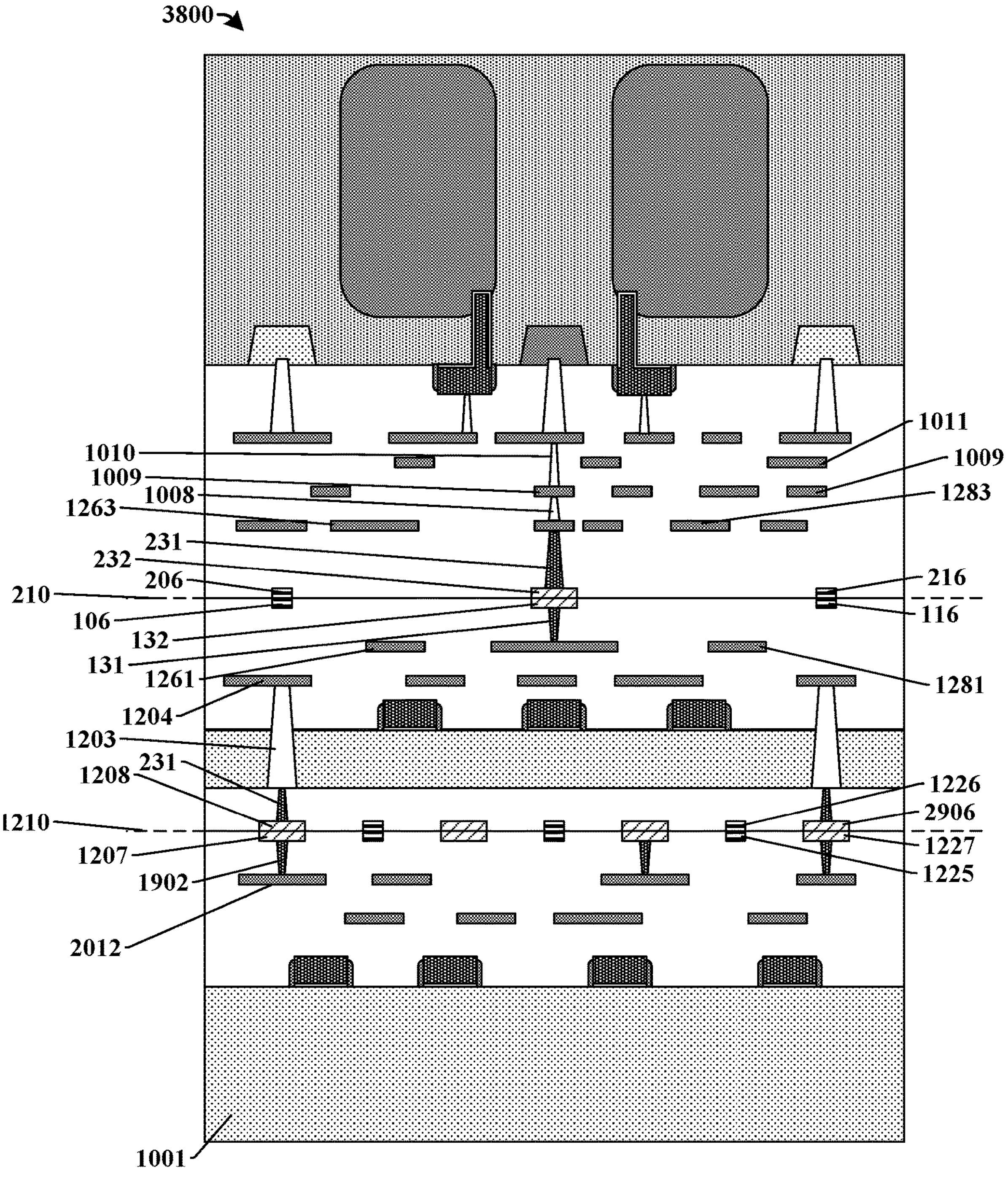
FIG. 38 illustrates a cross-sectional elevation view of the stacking of the second wafer of FIG. 36, the intermediate wafer of FIG. 29, and the first wafer of FIG. 20.

FIG. 38 illustrates a cross-sectional elevation view of the stacking of the second wafer of FIG. 36, the intermediate wafer of FIG. 29, and the first wafer of FIG. 20 to form a three-dimensional integrated circuit 3800. Mating of the wafers or portions of the wafers (e.g., dies) puts electrically conductive pad 1207 in ohmic contact with electrically conductive pad 1208, electrically conductive pad 1227 in ohmic contact with electrically conductive pad 2906, and so on. Shield structure 1225 is mated with shield structure 1226 and other shield structures are similarly mated. Thus, a three-wafer stacked integrated circuit structure with shield structures blocking crosstalk and/or parasitic capacitance around electrically conductive pads on both side of mating surfaces can be provided.

Figure 39:
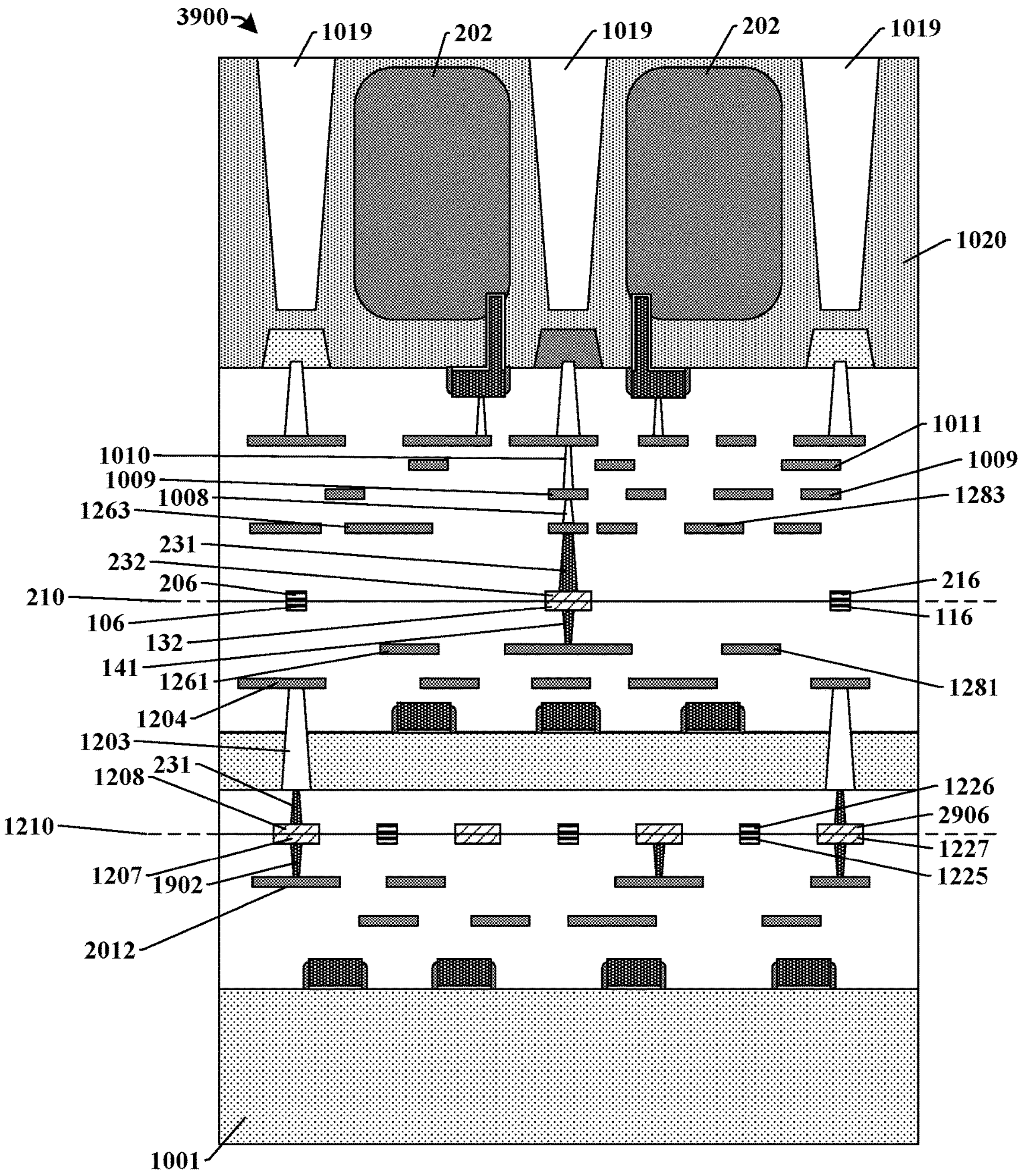
FIG. 39 illustrates a cross-sectional elevation view of manufacturing steps for forming a backside deep trench isolation (BDTI) structure in the wafer stack of FIG. 38.

FIG. 39 illustrates a three-dimensional integrated circuit 3900 after forming backside deep trench isolation (BDTI) structures 1019 in substrate 1020. BDTI structures 1019 separate photodiodes 202 from each other.

Figure 40:
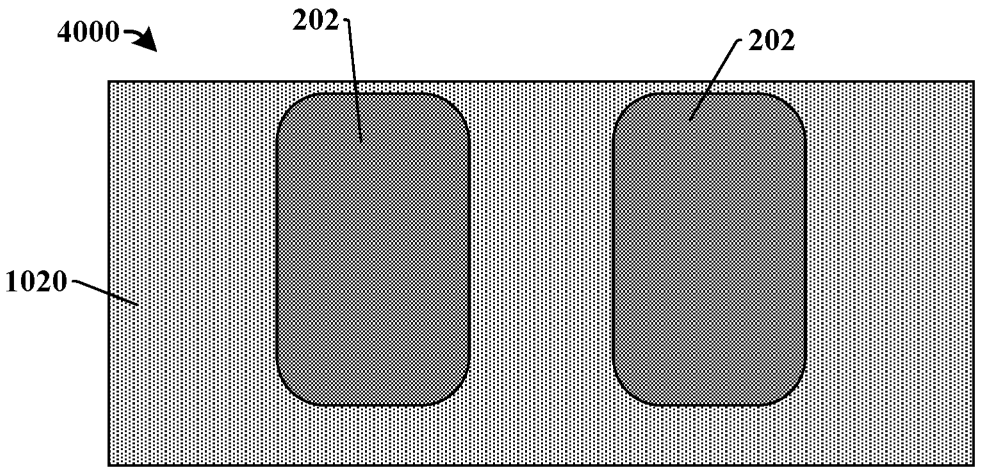
FIGS. 40 through 41 illustrate a series of incremental manufacturing steps as a series of cross-sectional views for a second wafer.
Figure 41:
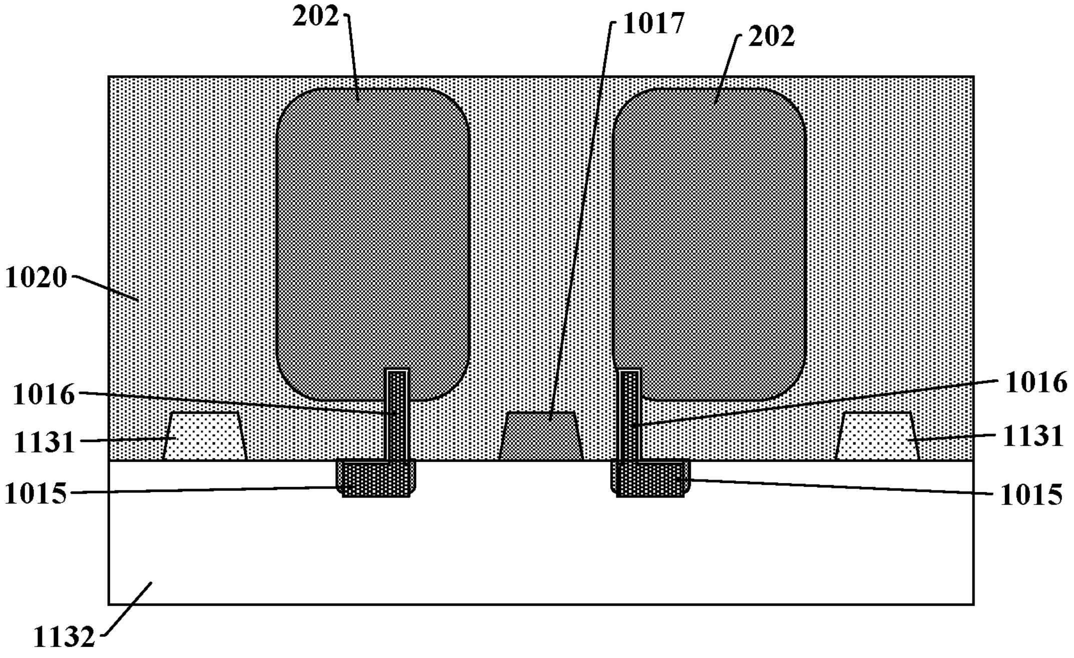

FIGS. 40 through 41 illustrate a series of incremental manufacturing steps as a series of cross-sectional views for a second wafer. In FIG. 40, photodiodes 202 are formed in substrate 1020 to form a partially fabricated integrated circuit structure 4000. In FIG. 41, p-well regions 1131, and floating diffusion region 1017 are formed. Further, transfer gate transistors 1015 are formed on substrate 1020. Transfer gate transistors 1015 have gate electrodes with vertical extensions 1016 extending into substrate 1020. Dielectric region 1132 is formed over transfer gate transistors 1015.

Figure 42:
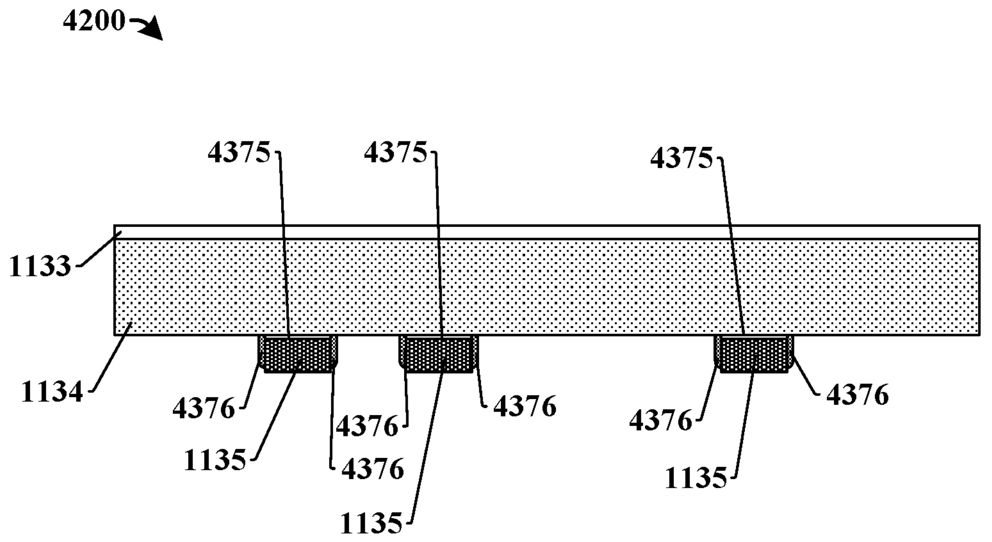
FIGS. 42 and 43 illustrate a series of incremental manufacturing steps as a series of cross-sectional views for an intermediate wafer.
Figure 43:
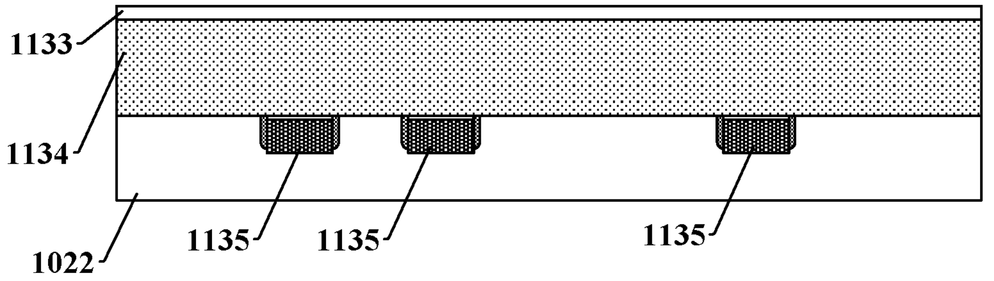

FIGS. 42 and 43 illustrate a series of incremental manufacturing steps as a series of cross-sectional views for an intermediate wafer 4200. In FIG. 42, on a substrate having a dielectric layer 1133, which may be an insulator layer (e.g., an oxide layer), and a semiconductor-on-insulator (e.g., silicon-on-insulator) (SoI) layer 1134, transistors 1135 are formed. Transistors 1135 comprise gate oxide layer 4375 and sidewall spacers 4376. Partially fabricated SoI integrated circuit structure 4300 results. In FIG. 43, dielectric region 1022 is formed over transistors 1135.

Figure 44:
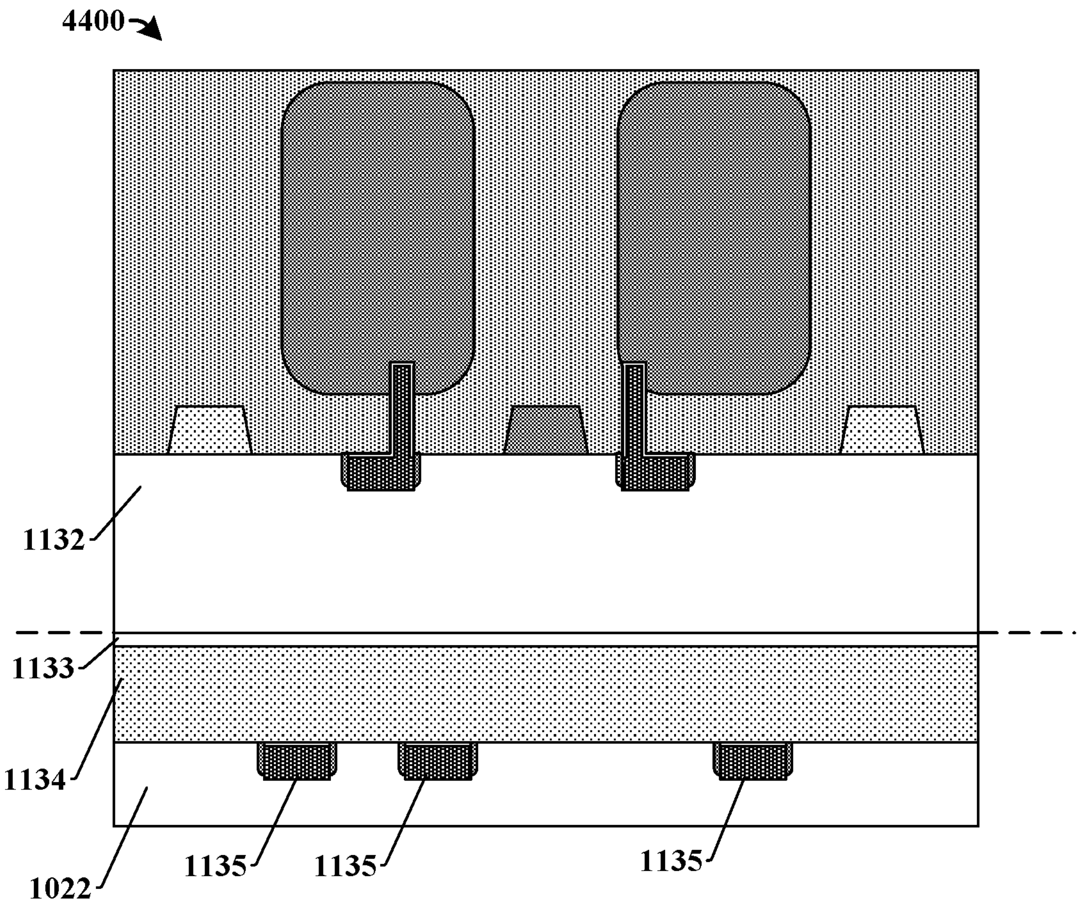
FIG. 44 illustrates a cross-sectional elevation view of the stacking of the second wafer of FIG. 41 and the intermediate wafer of FIG. 43.

FIG. 44 illustrates a cross-sectional elevation view of the stacking of the second wafer of FIG. 41 and the intermediate wafer of FIG. 43. In FIG. 44, the second wafer of FIG. 41 is mated to the intermediate wafer of FIG. 43 to form a partially fabricated integrated circuit structure 4400. Insulator-to-insulator (e.g., oxide-to-oxide) bonding of dielectric region 1132 to dielectric layer 1133 is performed.

Figure 45:
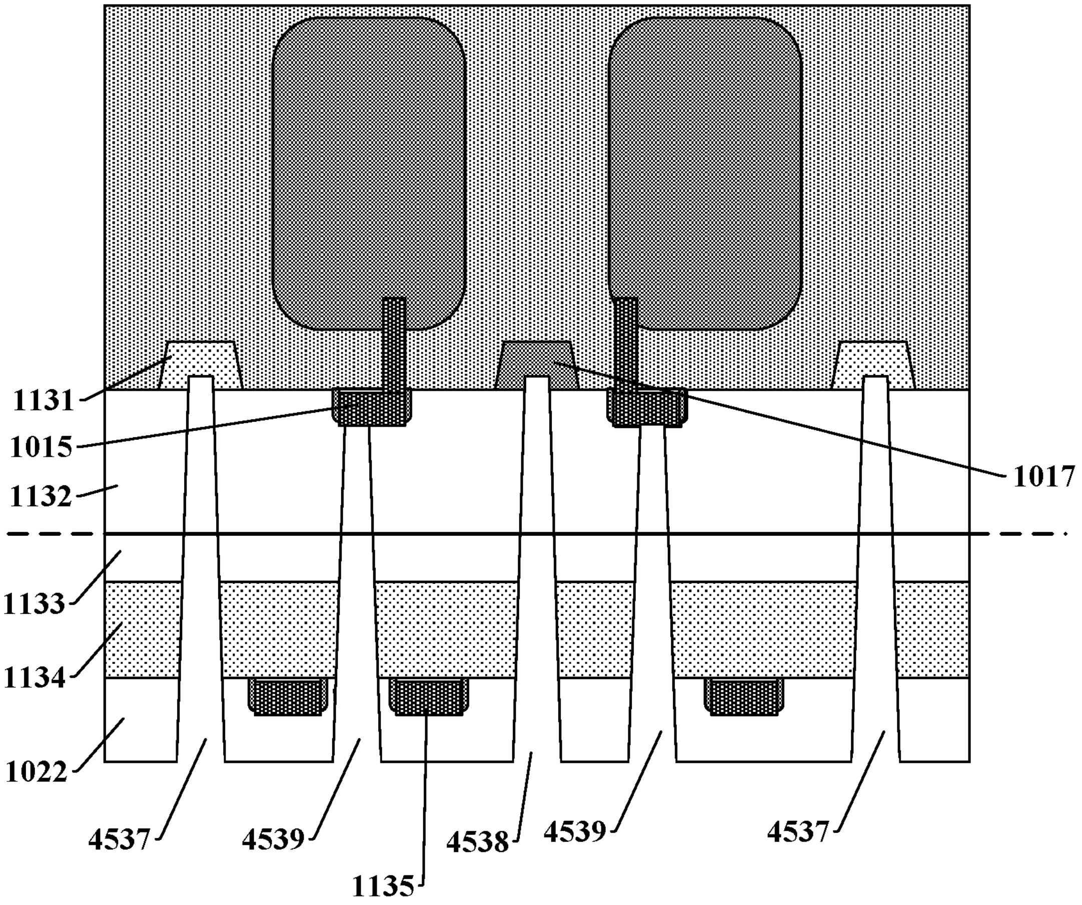
FIGS. 45 and 46 illustrate a cross-sectional elevation view of formation of contacts through semiconductor and insulator layers of the intermediate wafer of FIG. 43 to connect to portions of the second wafer of FIG. 41.
Figure 46:
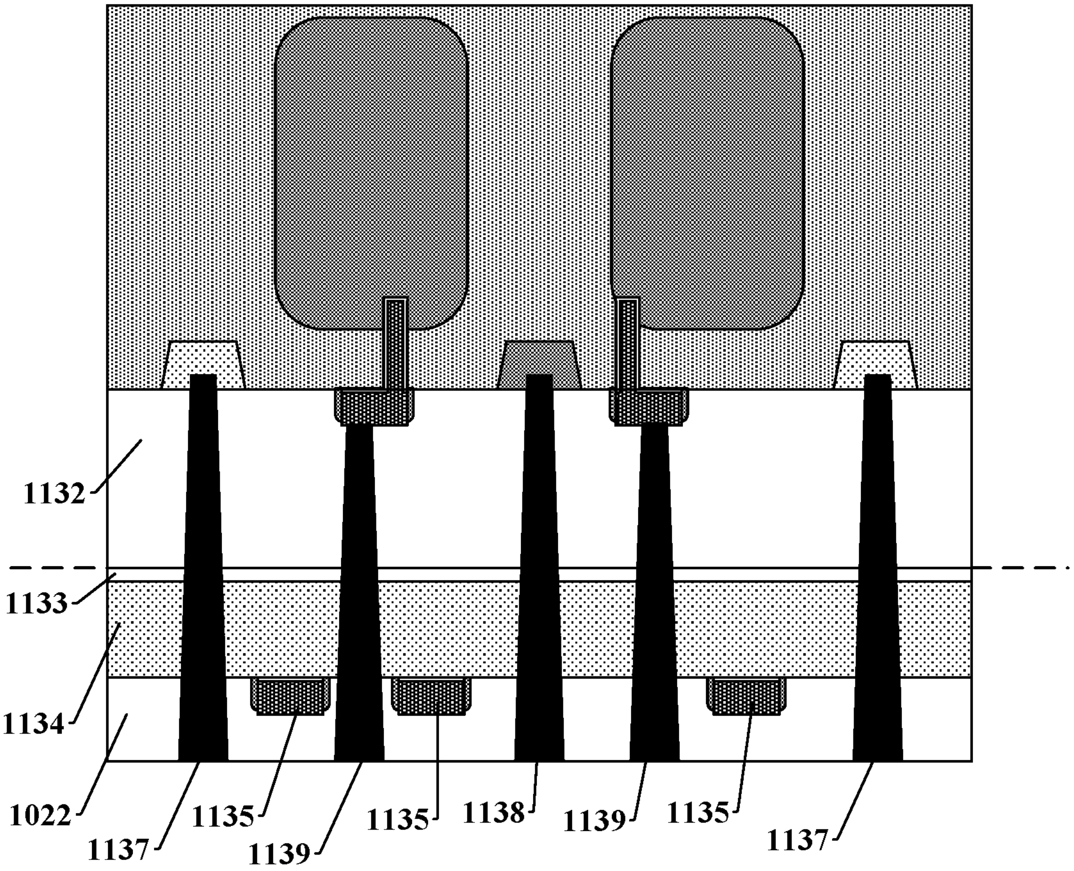

FIGS. 45 and 46 illustrate a cross-sectional elevation view of formation of contacts through semiconductor and insulator layers of the intermediate wafer of FIG. 44 to connect to portions of the second wafer of FIG. 41. In FIG. 45, etching is performed to form deep cavities 4537, 4538, 4539 for through-oxide vias (TOVs). Deep cavities 4537 extend to p-well regions 1131. Deep cavities 4538 extend to floating diffusion region 1017. Deep cavities 4539 extend to transfer gate transistors 1015. In FIG. 46, the deep cavities 4537, 4538, 4539 are filled with electrically conductive material (e.g., metal or the like) to form TOVs 1137, 1138, and 1139

Figure 47:
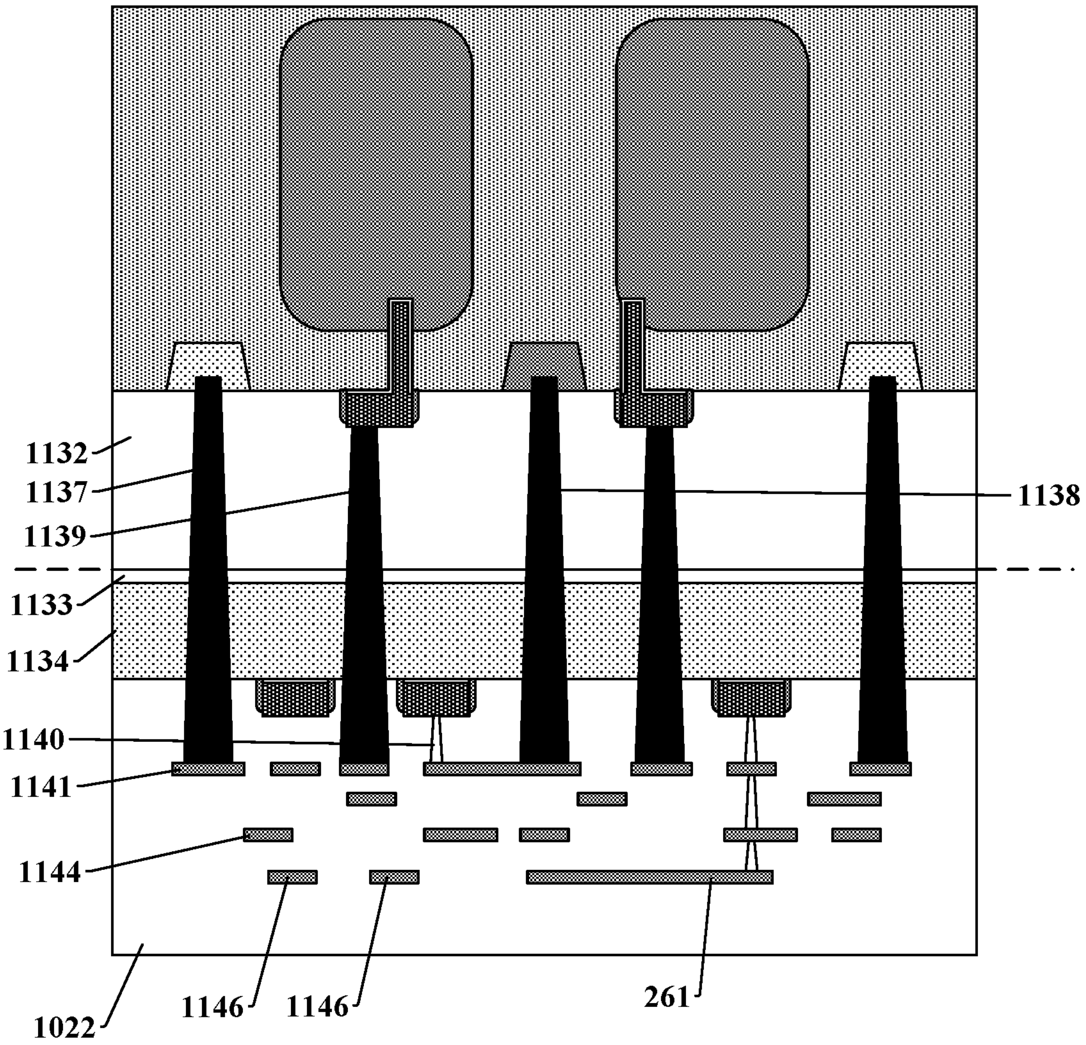
FIGS. 47 through 49 illustrate a series of incremental manufacturing steps as a series of cross-sectional views.
Figure 48:
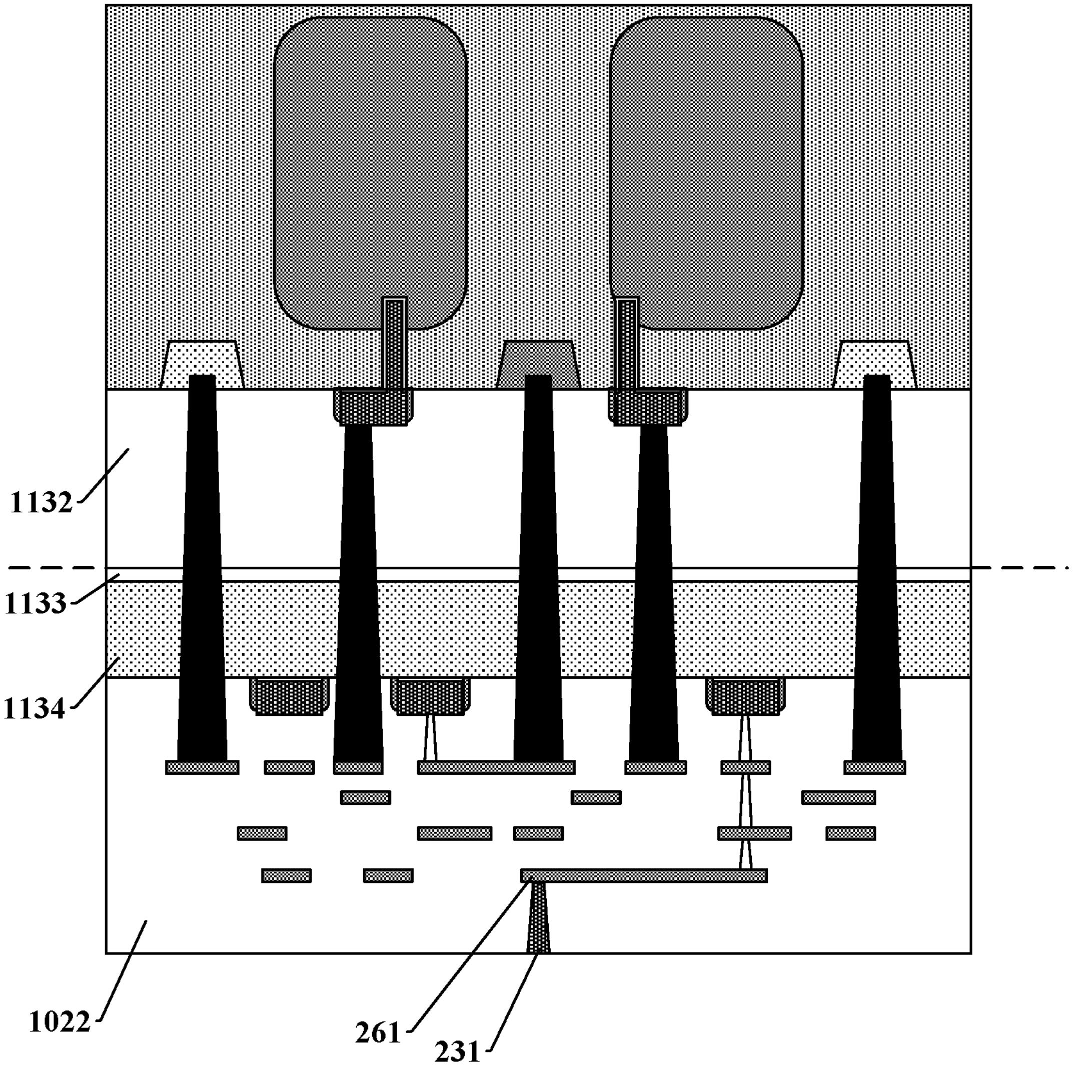
Figure 49:
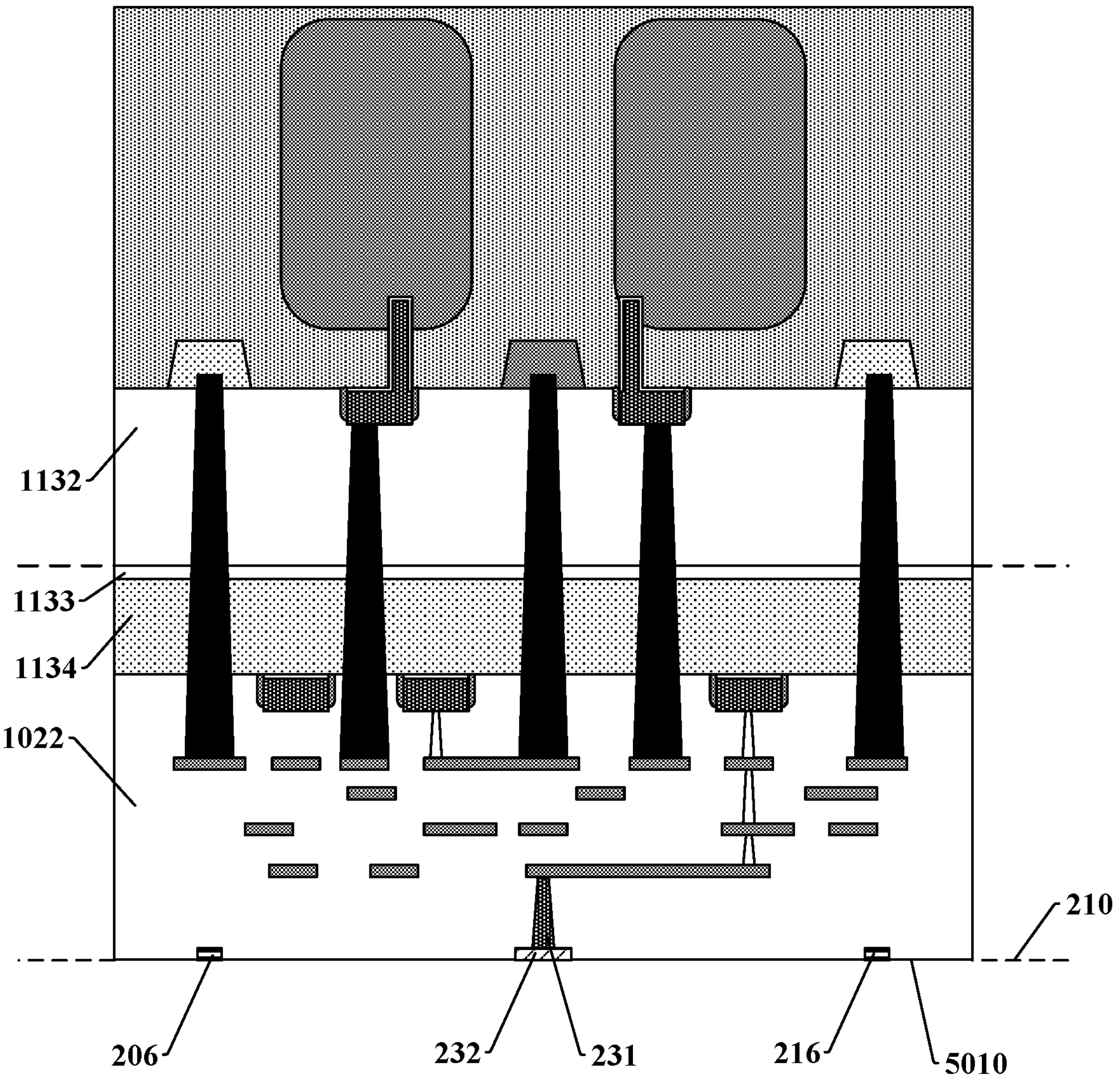

FIGS. 47 through 49 illustrate a series of incremental manufacturing steps as a series of cross-sectional views. In FIG. 47, a back-end-of-line (BEOL) process is performed to form electrically conductive features 1141, 1144, 1146, and 261 in electrically conductive layers and a an electrically conductive contact 1140 between one or more electrically conductive features 1141 and one or more of transistors 1135. At least a portion of electrically conductive features 1141 are ohmically connected to a TOV, such as TOVs 1137, 1138, or 1139. Additional layers of dielectric region 1022 are formed with the electrically conductive layers, increasing the thickness of dielectric region 1022. In FIG. 48, an electrically conductive contact 231 is formed from a surface of dielectric region 1022 to electrically conductive feature 261. In FIG. 49, electrically conductive pads, such as electrically conductive pad 232, and shield structures 206, 216 are formed in a layer along a surface 5010 in bonding interface plane 210. In some embodiments, the integrated circuit structure of FIG. 49 has a layout of electrically conductive pads and shield structures as illustrated in any one or combination of FIGS. 1 and 3-9. Electrically conductive pad 232 provides ohmic contact to electrically conductive contact 231. Planarization can be performed to bring the surface of electrically conductive pad 232 and shield structures 206, 216, along with the surface of dielectric region 1022, to a planar surface, along bonding interface plane 210. Such a planar surface is ready to be mated to another planar surface with corresponding electrically conductive pads and shield structures.

In some embodiments, a process for forming electrically conductive pad 232 and shield structures 206, 216 comprises: 1) patterning dielectric region 1022 to concurrently form openings corresponding to electrically conductive pad 232 and shield structures 206, 216; 2) depositing a conductive layer to fill the openings; and 3) performing a planarization into the conductive layer. In other embodiments, the process comprises: 1) patterning dielectric region 1022 to form a first opening corresponding to electrically conductive pad 232; 2) depositing a first conductive layer to fill the first openings; 3) performing a first planarization into the first conductive layer; 4) after the first planarization, patterning dielectric region 1022 to form second openings corresponding to shield structures 206, 216; 5) depositing a second conductive layer or a low-k dielectric layer to fill the second openings; and 6) performing a second planarization into the second conductive layer or a low-k dielectric layer.

Figure 50:
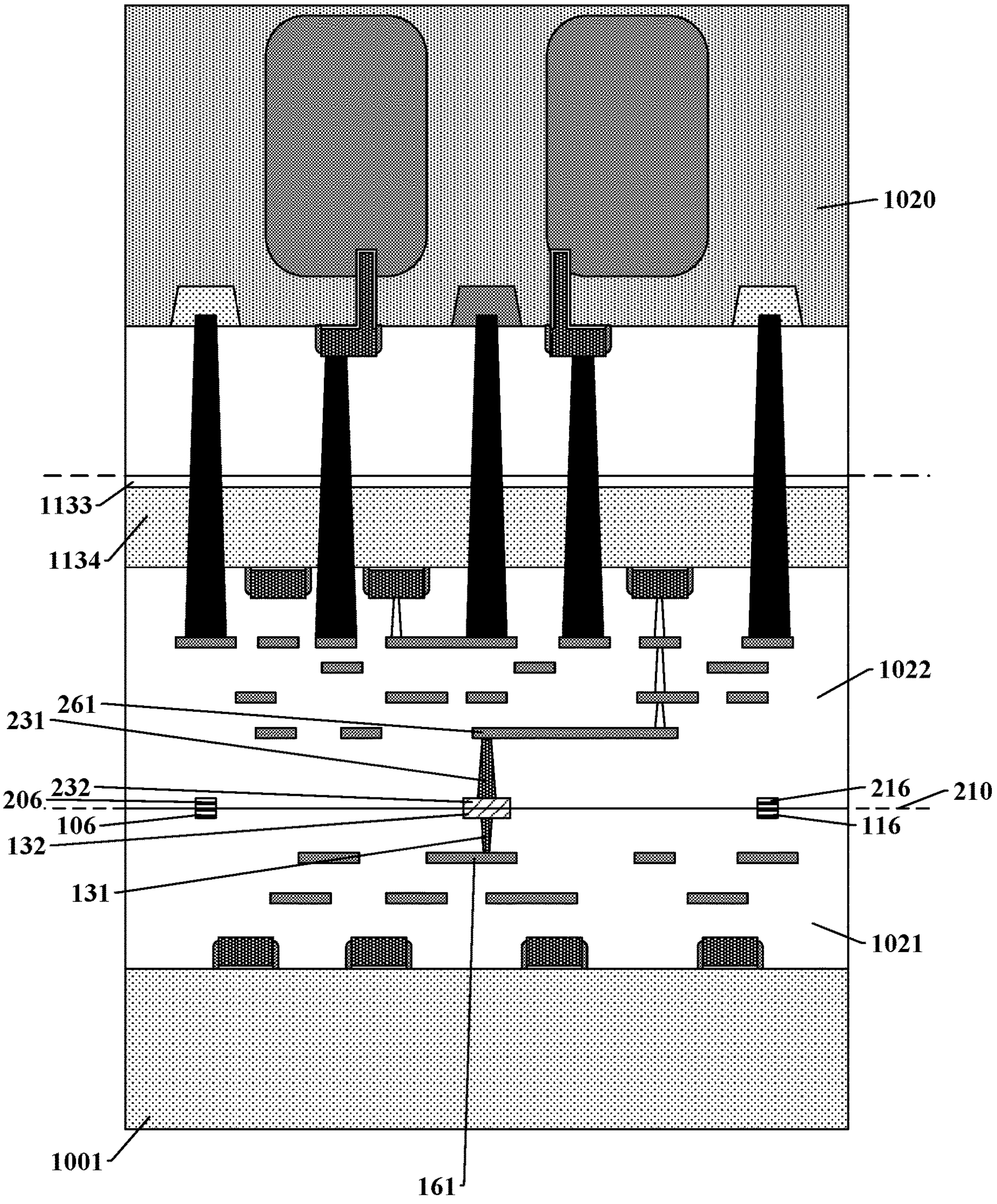
FIG. 50 illustrates a cross-sectional elevation view of stacking of the structure produced from the stacked second wafer of FIG. 41 and the intermediate wafer of FIG. 43 with the first wafer of FIG. 20.

FIG. 50 illustrates a cross-sectional elevation view of the stacking of the semiconductor-on-insulator (SoI) device-on-photodiode (DoP) integrated circuit structure of FIG. 49, produced from the stacked second wafer of FIG. 41 and the intermediate wafer of FIG. 43, and the first wafer of FIG. 20. Mating of the wafers or portions of the wafers (e.g., dies) puts electrically conductive pad 132 in ohmic contact with electrically conductive pad 232. Shield structure 106 is mated with shield structure 206. Shield structure 116 is mated with shield structure 216. Thus, a SoI-DoP stacked integrated circuit structure with shield structures blocking crosstalk and/or parasitic capacitance around electrically conductive pads on both side of mating surfaces can be provided.

Figure 51:
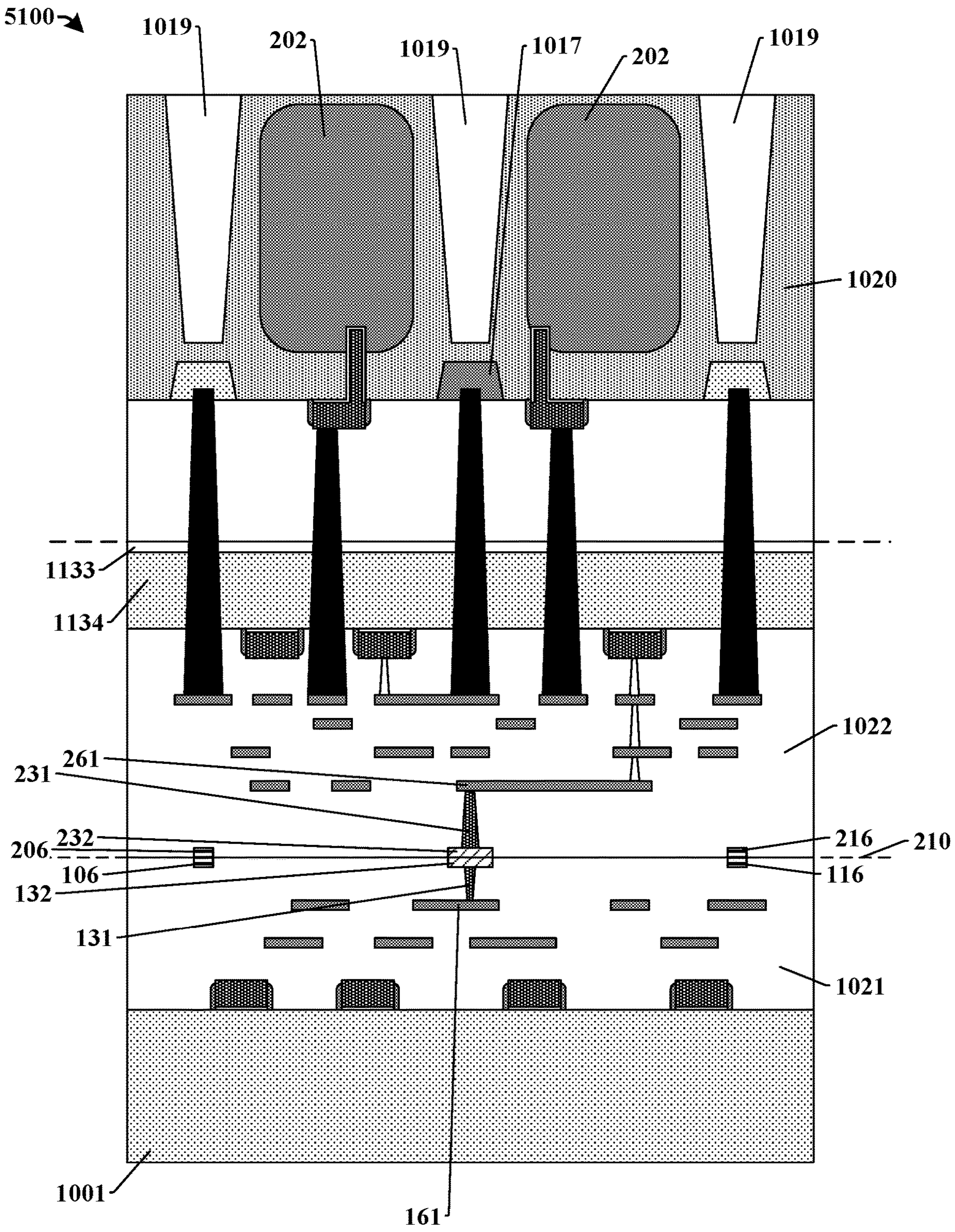
FIG. 51 illustrates a cross-sectional elevation view of manufacturing steps for forming a BDTI structure in the wafer stack of FIG. 50.

FIG. 51 illustrates a three-dimensional integrated circuit 5100 after forming BDTI structures 1019 separate photodiodes 202 from each other in substrate 1020.

Figure 52:
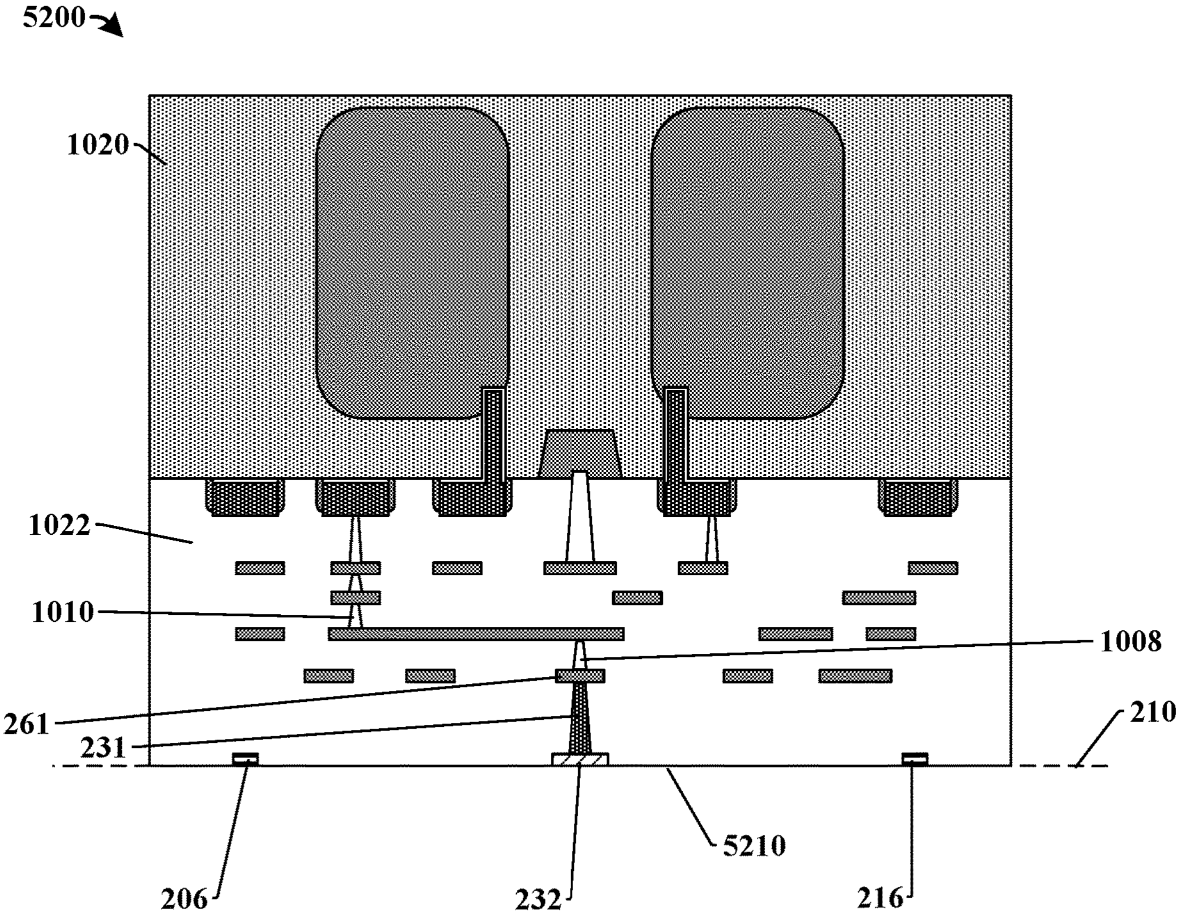
FIG. 52 illustrates manufacturing steps as a cross-sectional view for a second wafer.

FIG. 52 illustrates a cross-sectional view of an integrated circuit structure 5200 for a second wafer as formed and described with respect to FIGS. 30-36. Electrically conductive contacts 1010 and 1008 are formed in dielectric region 1022 between electrically conductive features of different electrically conductive layers (e.g., metal layers). Electrically conductive contact 231 is formed between a surface of dielectric region 1022 and electrically conductive feature 261, providing ohmic contact to electrically conductive feature 261. Electrically conductive pad 232 is formed over electrically conductive contact 231, providing ohmic contact to electrically conductive contact 231.

Along with electrically conductive pad 232, shield structures 206, 216 are formed in a layer (e.g., a M-M and D-D bond layer) at the surface 5210, at bonding interface plane 210, of dielectric region 1022. Planarization can be performed to bring the surfaces of electrically conductive pad 232 and shield structures 206, 216, along with the surface of dielectric region 1022, to a planar surface, along bonding interface plane 210. Such a planar surface is ready to be mated to another planar surface with corresponding electrically conductive pads and shield structures.

Figure 53:
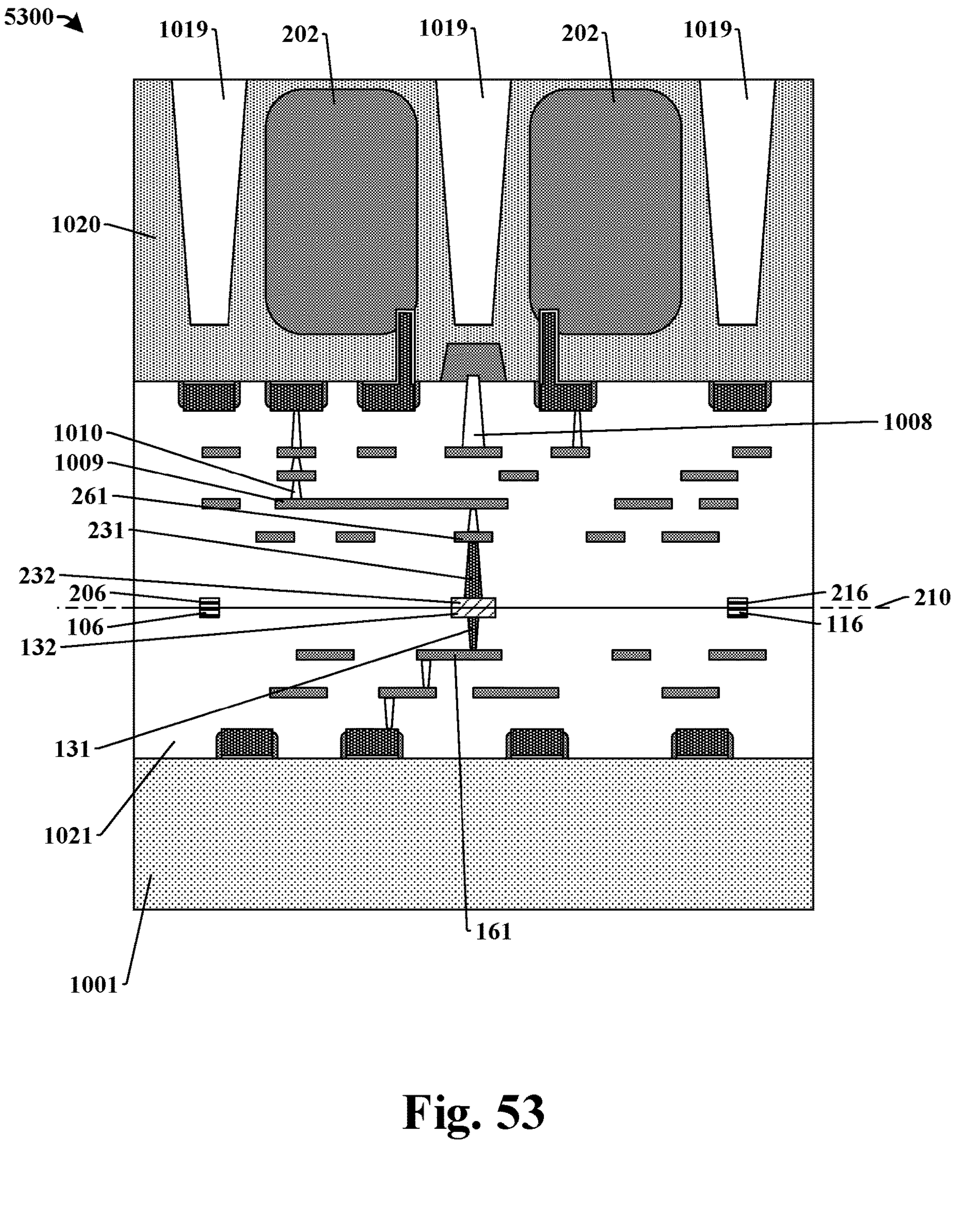
FIG. 53 illustrates a cross-sectional elevation view of the stacking of the second wafer of FIG. 52 and the first wafer of FIG. 20.

FIG. 53 illustrates a cross-sectional elevation view of the stacking of the second wafer of FIG. 52 and the first wafer of FIG. 20 (albeit with a different layout of conductive features). In some embodiments, the first wafer has a layout of electrically conductive pads and shield structures as illustrated in any one or combination of FIGS. 1 and 3-9. Mating of the wafers or portions of the wafers (e.g., dies) puts electrically conductive pad 132 in ohmic contact with electrically conductive pad 232. Shield structure 106 is mated with shield structure 206. Shield structure 116 is mated with shield structure 216. Thus, a two-wafer stacked integrated circuit structure 5300 with shield structures providing shielding or parasitic capacitance reduction around electrically conductive pads on both side of mating surfaces can be provided.

Also in FIG. 53, BDTI structures 1019 formed separating photodiodes 202 from each other in substrate 1020.

Note that the methods of FIGS. 17-53 illustrate formation of a single pixel (e.g., 120 in FIG. 1-16). However, in practice, multiple pixels in a plurality of rows and a plurality of columns are concurrently formed. Therefore, while the methods of FIGS. 17-53 illustrate formation of a single pixel, it is to be appreciated multiple additional pixels are concurrently being formed out of view according to the illustrated processing steps.

Figure 54:
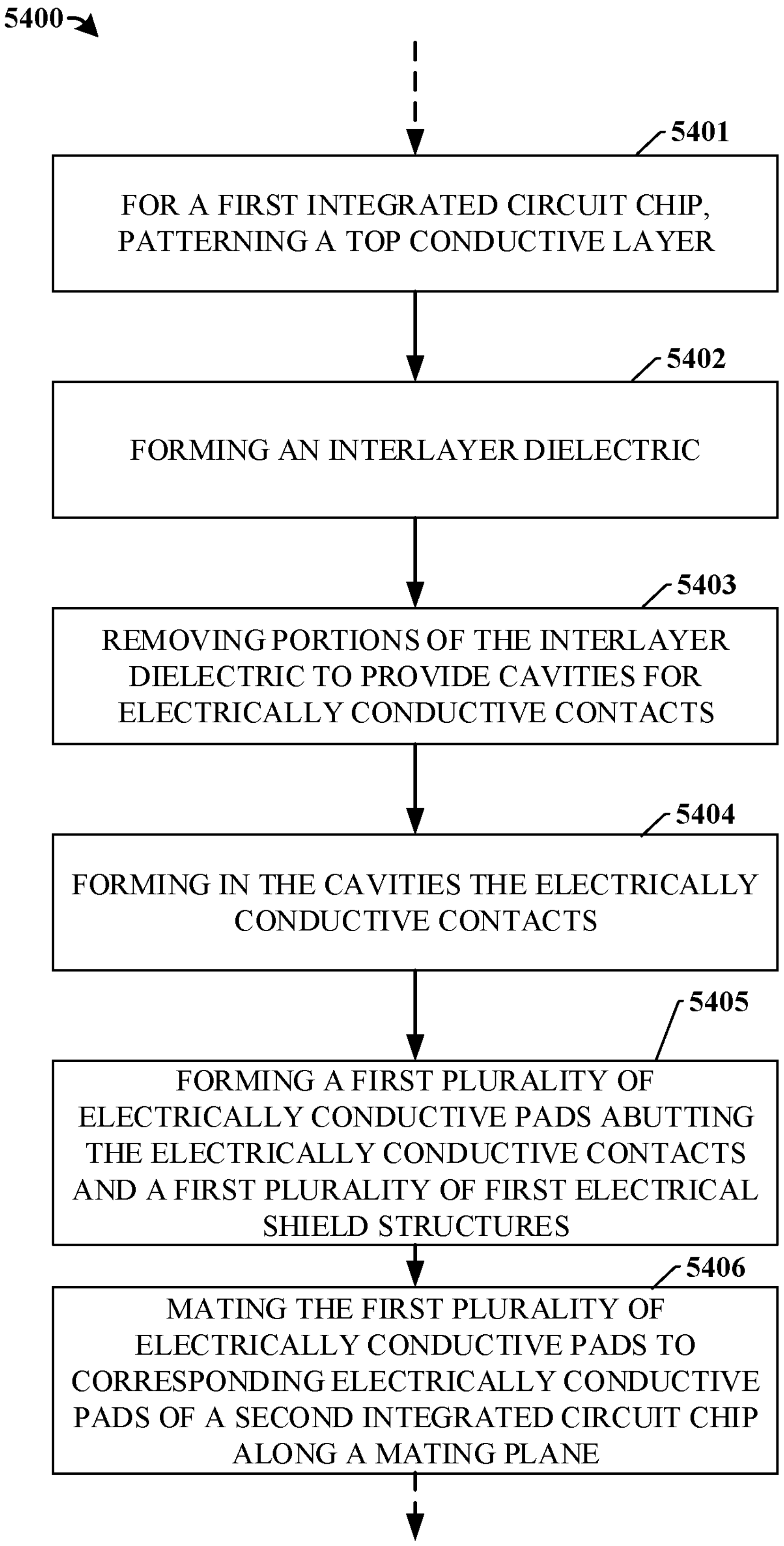
FIG. 54 illustrates a flow diagram for some embodiments of a method.

FIG. 54 illustrates a flow diagram for some embodiments of a method 5400. Although this method and other methods illustrated and/or described herein are illustrated as a series of acts or events, it will be appreciated that the present disclosure is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 5401, for a first integrated circuit chip, patterning a top electrically conductive layer (e.g., a metal layer) is performed. At act 5402, for the first integrated circuit chip, an interlayer dielectric is formed, for example, over the top electrically conductive layer. At act 5403, portions of the interlayer dielectric are removed to provide cavities for electrically conductive contacts. At act 5404, the electrically conductive contacts are formed in the cavities. At act 5405, a first plurality of electrically conductive pads are formed abutting the electrically conductive contacts, and a first plurality of first electrical shield structures are formed. In some embodiments, each electrically conductive pad of the first plurality of electrically conductive pads has a pad interface surface lying in an interface plane. In some embodiments, each first electrical shield structure of the first plurality of first electrical shield structures has a shielding structure interface surface lying in the interface plane. In some embodiments, the first plurality of first electrical shield structures are disposed interstitially to the first plurality of first electrically conductive pads. At act 5406, the first plurality of electrically conductive pads are mated to corresponding electrically conductive pads of a second integrated circuit chip along a mating plane. Acts 5401 through 5406 can correspond, for example, to the structure previously illustrated in FIGS. 1-53 in some embodiments.

FIG. 55 illustrates a flow diagram of some features 5500 of some embodiments of a method. In some embodiments, as shown in act 5501, the first plurality of first electrical shield structures surround individual ones of the first plurality of electrically conductive pads. In some embodiments, as shown in act 5502, the first plurality of electrical shield structures are disposed in the first electrically conductive pad layer interstitially to the first plurality of first electrically conductive pads. In some embodiments, as shown in act 5503, the first plurality of first electrical shield structures are ohmically connected to each other. In some embodiments, as shown in act 5504, a first subset of the first plurality of first electrical shield structures surround a first pad of the first plurality of first electrically conductive pads at a first distance bisecting a first spacing of the first pad from rectilinearly adjacent pads of the first plurality of first electrically conductive pads. In some embodiments, as shown in act 5505, a second subset of the first plurality of first electrical shield structures surround the first pad at a second distance bisecting a second spacing of the first pad from diagonally adjacent pads of the first plurality of first electrically conductive pads. In some embodiments, as shown in act 5506, a first subset of the first plurality of first electrical shield structures are each equidistant from a first pad of the first plurality of first electrically conductive pads and a second subset of the first plurality of first electrical shield structures are each equidistant from a second pad of the first plurality of first electrically conductive pads. In some embodiments, as shown in act 5507, the first plurality of first electrical shield structures are elongated in a plane of the first plurality of first electrically conductive pads.

In some embodiments, a satellite-type bond (e.g., M-M and D-D bond) signal integrity preservation technique is provided. The technique can prevent degradation of signal integrity from interference (e.g., crosstalk) by providing signal shielding and can prevent degradation of signal integrity from low-pass filtering and loss by reducing parasitic capacitance.

Stacking of at least partially fabricated integrated circuit components (e.g., wafer stacking, die stacking, etc.) and interconnection of stacked integrated circuit components across an interface plane (e.g., through M-M and D-D bonding at a bonding plane) allows integrated circuit features (e.g., pixel elements) to be made smaller, but, as the pixel size is made smaller and the interconnection structures (e.g., electrically conductive (e.g., M-M bond) pads) is made closer, it can be easier for signal integrity issues to arise, so techniques for preserving signal integrity are useful.

Another aspect pertinent to signal integrity is that complementary metal-oxide semiconductor (CMOS) image sensor (CIS) pixel values are typically read sequentially across an CIS (e.g., from left to right, column by column), so the signals conveyed without regard to signal integrity preservation could easily interfere with each other.

However, by providing for preservation of signal integrity (e.g., mitigating potential interference between floating-diffusion (FD) regions), accurate communication of signals can be provided. Reduction of crosstalk from a signal of a FD region of one pixel (or group of pixels) to a signal of a FD region of another pixel (or another group of pixels) can reduce degradation of image quality and provide better images. Implementation can be applied to stacked-chip CISs, for example, two-chip CIS architectures and three-chip CIS architectures. Implementation can be applied to pixel-sharing CIS architectures (e.g., 2×2 pixel-sharing architectures).

In a stacked integrated circuit, a first chip in the stack can be referred to as a Tier 1 integrated circuit component. A second chip in the stack can be referred to as a Tier 2 integrated circuit component. In stacks of more than two chips, a third chip in the stack can be referred to as a Tier 3 integrated circuit component, and so on.

Abbreviations that may be seen are TX (or TG) for transfer gate, SF for source follower, RST for reset, SEL (or select) or row select, FD for floating diffusion region, DoP for device-on-photodiode, and M-M for metal-to-metal, D-D for dielectric-to-dielectric. M-M and D-D may be used to refer to bonds of metal-to-metal and dielectric-to-dielectric, as well as features associated with such bonds, such as a M-M and D-D layer in which M-M bond pads are formed and such as a M-M contact for providing an electrical connection to a M-M bond pad.

In some embodiments, electrically conductive elements, such as electrically conductive pads and electrically conductive contacts can be made of metal, such as copper or other metal, alloy, ceramic (e.g., indium tin oxide), etc.

In some embodiments, a two-tier (e.g., two-wafer, two-die, etc.) stacked integrated circuit structure may be made. As an example, an application-specific integrated circuit (ASIC) may be implemented on a first die or wafer, and features or functions such as PD, TX, SF, RST, and SEL may be implemented on a second die or wafer, with the first and second dies or wafers mated at a bonding interface to provide mechanical and electrical connections between the first and second dies or wafers.

In some embodiments, a three-tier (e.g., three-wafer, three-die, etc.) stacked integrated circuit structure may be made. As an example, an application-specific integrated circuit (ASIC) may be implemented on an integrated circuit component (e.g., a die or a wafer), features or functions such as SF, RST, and SEL may be implemented on a system-on-chip 2 (SoC2) integrated circuit component, and features or functions such as PD and TX may be implemented on a SoC1 integrated circuit component, with the SoC1 and SoC2 integrated circuit components mated at a bonding interface to provide mechanical and electrical connections between the SoC1 and SoC2 integrated circuit components, and an opposite side of the SoC2 integrated circuit component may be mated to the ASIC component to provide mechanical and electrical connections between the SoC2 and ASIC components.

In some embodiments, a shield structure can be fabricated in an interface layer, such as a M-M and D-D bond layer. In some embodiments, floating dummy electrically conductive pads (e.g., M-M bond pads) can be fabricated between electrically conductive pads (e.g., M-M bond pads) used for communicating signals. The signal integrity protection structure may be arranged as a satellite-type shielding structure, with signal integrity protection elements (e.g., electrically conductive (e.g., metal, alloy, a ceramic (e.g., indium tin oxide), etc.) or low-k dielectric elements) located at a constant radius from the center or edge of an electrically conductive pad, giving an appearance reminiscent of satellites orbiting a planet. In some embodiments, a slot-type shielding structure can be implemented, with elongated slots which can be filled with an electrically conductive material or a low-k dielectric material. In some embodiments, a mesh-type shielding structure can be implemented, with elongated slots intersecting along non-parallel (e.g., orthogonal) axes to form extended continuous regions of connected electrically conductive material or a low-k dielectric material. An electrically conductive mesh-type shielding structure can either be left unconnected or can be connected to a voltage source, for example, applying a bias voltage (e.g., ground or some other voltage) to the material.

In some embodiments, a signal integrity protection feature (e.g., an individual shield structure) may have a size of 10 percent to 80 percent of the size of an electrically conductive pad (e.g., a M-M bond pad). In some embodiments, the signal integrity protection feature may be formed in the shape of a circle, a square, a rectangle, an ellipse, a polygon, a cross (e.g., a plus-sign), an arc, or the like. In some embodiments, such as those with elongated signal integrity protection features (e.g., slot-type), such features may have a width of 10 percent to 80 percent of the size of an electrically conductive pad (e.g., a M-M bond pad) and a length of 10 percent to 200 percent of the size of an electrically conductive pad (e.g., a M-M bond pad). In the case of cross-type signal integrity protection feature, each of the crossed portions may have, for example, a width of 10 percent to 80 percent of the size of an electrically conductive pad (e.g., a M-M bond pad) and a length of 10 percent to 200 percent the size of an electrically conductive pad (e.g., a M-M bond pad). In the case of a mesh-type signal integrity protection feature, each of the crossed portions may have a width of 10 percent to 80 percent of the size of an electrically conductive pad (e.g., a M-M bond pad). In some embodiments, such as those with dummy pads (e.g., dummy M-M bond pads), signal integrity protection features may have a size equal to a size of an electrically conductive pad (e.g., a M-M bond pad).

In some embodiments, such as those with elongated signal integrity protection features (e.g., slot-type, cross-type, mesh-type, or the like), the signal integrity protection features can be constructed to be less adherent to opposing signal integrity protection features to which they are to be mated. For example, an elongated signal integrity protection feature can be recessed, either uniformly or non-uniformly, below the bonding plane to provide relief, which can, for example, help promote the escape of gas during the process of wafer bonding to avoid bubbles.

In some embodiments, with elongated signal integrity protection features, such as those which provide electrical continuity across several array elements, such as across several pixels of an image sensor array, the elongated signal integrity protection features can be left disconnected from external voltages, or the elongated signal integrity protection features can be connected to a voltage source (e.g., ground or some other voltage). Such a connection can, for example, be located outside the pixel array. An elongated signal integrity protection feature connected to a voltage source can be useful, for example, for electric field shielding applications.

In some embodiments, signal integrity protection features as described herein can be implemented in a two-chip CIS/ASIC three-dimensional integrated circuit. In some embodiments, signal integrity protection features as described herein can be implemented in a three-chip CIS/ASIC three-dimensional integrated circuit. An example of a three-chip CIS/ASIC three-dimensional integrated circuit can include, for example, a SoI-DoP implementation with through-oxide vias (TOVs) used to connect two chips and symmetric pairs of electrically conductive contacts and electrically conductive pads (e.g., a M-M bond interface) used to connect an ASIC chip to one of the other two chips. Another example of a three-chip CIS/ASIC three-dimensional integrated circuit can include a three-chip stacked pixel implementation with backside through-substrate vias (BTSVs) used to convey signals through as substrate to implement electrical connections on opposite sides of the middle chip of the stack of chips. Symmetric pairs of electrically conductive contacts and electrically conductive pads (e.g., a M-M bond interface) can be implemented on one or both of the opposite sides of the middle chip and the chips to which those sides mate to preserve signal integrity in a three-chip stacked pixel implementation. The term "chip" can refer to a semiconductor wafer, a semiconductor-on-insulator (SoI) (e.g., silicon-on-insulator) structure, at any of various stages of fabrication, or portions thereof (e.g., a die, a group of dies, or the like) which can be mechanically mated using at least one set of symmetric pairs of electrically conductive contacts and electrically conductive pads (e.g., a M-M bond interface).

An electrically conductive contact and an electrically conductive pad can be used to convey a signal originating from a single photodiode or from a group of photodiodes. As examples, two photodiodes, three photodiodes, four photodiodes, or more than four photodiodes can be grouped together to provide such a signal. A plurality of such signals can be communicated over time.

In some embodiments of the present disclosure, the present disclosure relate to an IC, including: a first IC chip including a first dielectric layer; a second IC chip bonded to the first IC chip at a bond interface and including a second dielectric layer directly contacting the first dielectric layer at the bond interface; a first pair of conductive pads respectively in the first and second dielectric layers and directly contacting at the bond interface; a second pair of conductive pads respectively in the first and second dielectric layers and directly contacting at the bond interface; and a pair of shield structures respectively in the first and second dielectric layers and directly contacting at the bond interface, wherein the pair of shield structures separate the first pair of conductive pads from the second pair of conductive pads. In some embodiments, the integrated circuit further includes: a first pair of conductive contacts extending away from the bond interface respectively from the first pair of conductive pads; and a second pair of conductive contacts extending away from the bond interface respectively from the second pair of conductive pads. In some embodiments, the pair of shield structures repeat circumferentially around the first pair of conductive pads. In some embodiments, the first pair of conductive pads and the second pair of conductive pads are arranged in a row, wherein the pair of shield structures have a rectangular top geometry with a greatest dimension extending transverse to the row. In some embodiments, a top geometry of the pair of shield structures has a lesser area than a top geometry of the first pair of conductive pads. In some embodiments, a top geometry of the pair of shield structures is a same as a top geometry of the first pair of conductive pads. In some embodiments, the pair of shield structures has a grid-shaped top geometry.

In some embodiments of the present disclosure, the present disclosure relates to another integrated circuit, including: a first IC chip including a plurality of photodiode blocks in a plurality of rows and a plurality of columns, and further including a plurality of first conductive pads, wherein the plurality of first conductive pads include a conductive pad per photodiode block; a second IC chip bonded to the first IC chip at a bond interface and including a plurality of second conductive pads, wherein the plurality of second conductive pads respectively and directly contact the plurality of first conductive pads at the bond interface; and a plurality of pairs of shield structures at the bond interface and separating the plurality of first conductive pads from each other along the rows and along the columns. In some embodiments, the plurality of pairs of shield structures further separate the plurality of first conductive pads from each other diagonally in a direction transverse to the plurality of columns and the plurality of rows. In some embodiments, the plurality of pairs of shield structures individually have a first top geometry along the rows and the columns and a second, different top geometry diagonally in the direction. In some embodiments, the plurality of pairs of shield structures alternate one to one with the first conductive pads along the rows and the columns, wherein the plurality of pairs of shield structures alternate many to one with the first conductive pads diagonally in the direction. In some embodiments, the plurality of first conductive pads include only one conductive pad per photodiode block, wherein each of the plurality of photodiode blocks includes a multi-dimensional subarray of photodiodes. In some embodiments, the plurality of pairs of shield structures are conductive. In some embodiments, the first IC chip and the second IC chip respectively include a first dielectric layer and a second dielectric layer directly contacting at the bond interface, wherein the plurality of pairs of shield structures include a low k dielectric material having a lower dielectric constant than the first and second dielectric layers.

In some embodiments of the present disclosure, the present disclosure relates to a method including: forming a first IC chip, wherein the forming of the first IC chip includes forming a plurality of first transistors on a first substrate and depositing a first dielectric layer covering the plurality of first transistors; forming a pair of first conductive pads and a first shield structure recessed into the first dielectric layer, wherein the first shield structure separates the first conductive pads; forming a second IC chip, wherein the forming of the second IC chip includes forming a plurality of second transistors on a second substrate and depositing a second dielectric layer covering the plurality of second transistors; forming a pair of second conductive pads and a second shield structure recessed into the second dielectric layer; and bonding the first IC chip to the second IC chip, wherein the first conductive pads respectively and directly contact the second conductive pads at a bond interface and the first and second shield structures directly contact at the bond interface. In some embodiments, the bonding electrically couples the first transistors respectively to the second transistors through the pairs of first and second conductive pads. In some embodiments, the forming of the first IC chip includes forming a plurality of photodiodes in the first substrate, respectively adjacent to the first transistors, wherein the plurality of photodiodes are grouped into multi-dimensional blocks in a plurality of rows and columns, and wherein the pair of first conductive pads respectively and directly underlie corresponding ones of the multi-dimensional blocks. In some embodiments, the forming of the pair of first conductive pads and the first shield structure includes: patterning the first dielectric layer to form pad openings and a shield opening; depositing a conductive layer filling the pad openings and a shield opening; and performing a planarization into the conductive layer. In some embodiments, the forming of the pair of first conductive pads and the first shield structure includes: patterning the first dielectric layer to form pad openings; depositing a conductive layer filling the pad openings; performing a first planarization into the conductive layer; patterning the first dielectric layer to form a shield opening; depositing a low k dielectric layer filling the shield opening; and performing a second planarization into the low k dielectric layer. In some embodiments, the method further includes: forming a plurality of shield structures, including the first shield structure, evenly spaced in a first closed path around a first one of the pair of first conductive pads and evenly spaced in a second closed path around a second one of the pair of first conductive pads, wherein the first and second closed paths are only partially overlapping.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first dielectric layer" described in connection with a first figure may not necessarily correspond to a "first dielectric layer" described in connection with another figure, and may not necessarily correspond to a "first dielectric layer" in an un-illustrated embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a first integrated circuit (IC) chip, wherein the forming of the first IC chip comprises forming a plurality of first transistors on a first substrate and depositing a first dielectric layer covering the plurality of first transistors;

forming a pair of first conductive pads, a first shield structure, and a second shield structure recessed into the first dielectric layer, wherein the first and second shield structures are conductive and border a conductive pad of the pair of first conductive pads, wherein the first shield structure separates the pair of first conductive pads from each other in a first direction and is spaced from the second shield structure, and wherein the second shield structure is laterally offset from the conductive pad in a second direction orthogonal to the first direction;

forming a second IC chip, wherein the forming of the second IC chip comprises forming a plurality of second transistors on a second substrate and depositing a second dielectric layer covering the plurality of second transistors;

forming a pair of second conductive pads, a third shield structure, and a fourth shield structure recessed into the second dielectric layer; and bonding the first IC chip to the second IC chip, wherein the first conductive pads respectively contact the second conductive pads at a bond interface and the first and second shield structures respectively contact the third and fourth shield structures at the bond interface.

2. The method according to claim 1, wherein the forming of the pair of first conductive pads, the first shield structure, and the first second shield structure comprises:

patterning the first dielectric layer to form pad openings and a pair of shield openings;

depositing a conductive layer filling the pad openings and the pair of shield openings; and performing a planarization into the conductive layer.

3. The method according to claim 1, further comprising:

forming a plurality of shield structures, including the first shield structure, evenly spaced in a first closed path around a first one of the pair of first conductive pads and evenly spaced in a second closed path around a second one of the pair of first conductive pads, wherein the first and second closed paths are only partially overlapping.

4. The method according to claim 1, further comprising: forming at least four shield structures, including the first and second shield structures, wherein the at least four shield structures are evenly spaced from each other in a closed path around the conductive pad of the pair of first conductive pads, and wherein the conductive pad borders and is spaced from each of the at least four shield structures.

5. The method according to claim 4, wherein the at least four shield structures are separated from the conductive pad by a common distance.

6. The method according to claim 4, wherein the at least four shield structures alternate between a first top geometry and a second top geometry along the closed path, and wherein the second top geometry has an area less than an area of the first top geometry.

7. A method comprising:

forming a first integrated circuit (IC) chip, comprising:

forming a pair of photodetectors in a first substrate;

forming a pair of transfer transistors respectively bordering the pair of photodetectors on a first side of the first substrate, wherein the pair of transfer transistors share a floating diffusion region in the first substrate;

forming a first interconnect structure on the first side of the first substrate and electrically coupled to the pair of transfer transistors; and forming a first pair of first shield structures, a second pair of first shield structures, and a first conductive pad, wherein the first conductive pad is between and borders the first pair of first shield structures in a first direction and is between and borders the second pair of first shield structures in a second direction transverse to the first direction, wherein the first conductive pad is electrically coupled to the floating diffusion region via the first interconnect structure and the first and second pairs of first shield structures are spaced from the first interconnect structure; and bonding a second IC chip to the first IC chip, wherein the second IC chip contacts the first conductive pad, the first pair of first shield structures, and the second pair of first shield structures on the first side of the first substrate at completion of the bonding;

wherein the first pair of first shield structures are spaced from each other and from each shield structure of the second pair of first shield structures, and wherein the first pair of first shield structures share a first top geometry and the second pair of first shield structures share a second top geometry with an area less than an area of the first top geometry.

8. The method according to claim 7, wherein the floating diffusion region overlies the first conductive pad after the bonding.

9. The method according to claim 7, wherein the forming of the pair of first shield structures and the first conductive pad comprises:

depositing a dielectric layer on the first interconnect structure;

patterning the dielectric layer to form a pad opening and a pair of shield openings;

depositing a conductive layer filling the pad opening and the pair of shield openings; and performing a planarization into the conductive layer.

10. The method according to claim 7, wherein the forming of the second IC chip comprises:

forming a plurality of pixel transistors on a second substrate;

forming a second interconnect structure on the second substrate and electrically coupled to the plurality of pixel transistors; and forming a second conductive pad electrically coupled to the plurality of pixel transistors via the second interconnect structure, wherein the first and second conductive pads contact each other at completion of the bonding.

11. The method according to claim 7, wherein the second direction is about 45 degrees relative to the first direction.

12. The method according to claim 7, wherein the first top geometry is cross shaped and the second top geometry is circular.

13. The method according to claim 7, wherein the pair of first shield structures and the first conductive pad have individual surfaces that face the second IC chip and that are substantially coplanar, and wherein the pair of first shield structures are dielectric and are spaced from the first conductive pad.

14. A method comprising:

forming a first semiconductor structure, comprising:

forming a photodetector in a first substrate;

forming a transfer transistor bordering the photodetector on a first side of the first substrate;

forming a second semiconductor structure, comprising forming a plurality of pixel transistors on a first side of a second substrate;

bonding the second semiconductor structure to the first semiconductor structure with a second side of the second substrate, opposite the first side of the second substrate, facing the first semiconductor structure;

forming a through via extending through the second semiconductor structure, from the first side of the second substrate to the transfer transistor;

forming a first conductive pad, a first conductive shield structure, and a second conductive shield structure that are spaced from each other on the first side of the second substrate and that respectively have a first top geometry, a second top geometry, and a third top geometry, wherein the first conductive pad is electrically coupled to the plurality of pixel transistors and borders the first and second conductive shield structures, and wherein the first, second, and third top geometries are different; and bonding a third semiconductor structure to the second semiconductor structure at the first conductive pad and the first conductive shield structure.

15. The method according to claim 14, further comprising:

forming at least six conductive shield structures, including the first and second conductive shield structures, that border the first conductive pad and that are spaced in a ring-shaped pattern around the first conductive pad and that contact the third semiconductor structure.

16. The method according to claim 14, wherein the forming of the third semiconductor structure comprises:

forming a plurality of logic transistors on a third substrate; and forming a second conductive pad, a third conductive shield structure, and a fourth conductive shield structure, wherein the second conductive pad is electrically coupled to a transistor of the plurality of logic transistors, and wherein the second conductive pad, the third conductive shield structure, and the fourth conductive shield structure respectively contact the first conductive pad, the first conductive shield structure, and the second conductive shield structure at completion of the bonding of the third semiconductor structure to the second semiconductor structure.

17. The method according to claim 14, wherein the forming of the second semiconductor structure further comprises:

forming an interconnect structure on the first side of the second substrate, wherein the first conductive pad and the through via electrically couple to the plurality of pixel transistors via the interconnect structure.

18. The method according to claim 14, further comprising:

forming a trench isolation structure extending into a second side of the first substrate, opposite the first side of the first substrate, and extending laterally in a closed path around the photodetector, wherein the trench isolation structure overlies the first conductive shield structure.

19. The method according to claim 14, wherein the first conductive shield structure is on only one side of the conductive pad.

20. The method according to claim 14, wherein the first and second top geometries share a common shape and have different sizes, and wherein the third top geometry has a different shape than the common shape.

* * * * *